(12) United States Patent
Narita et al.

(10) Patent No.: US 7,731,469 B2
(45) Date of Patent: Jun. 8, 2010

(54) COMPONENT FEEDER

(75) Inventors: Shoriki Narita, Hirakata (JP); Kanji Hata, Katano (JP); Shuichi Hirata, Osaka (JP); Satoshi Shida, Hirakata (JP); Mamoru Nakao, Amagasaki (JP)

(73) Assignee: Panasonic Corporation, Osaka (JP)

( * ) Notice: Subject to any disclaimer, the term of this patent is extended or adjusted under 35 U.S.C. 154(b) by 1185 days.

(21) Appl. No.: 10/537,406

(22) PCT Filed: Nov. 28, 2003

(86) PCT No.: PCT/JP03/15228

§ 371 (c)(1),
(2), (4) Date: Jun. 2, 2005

(87) PCT Pub. No.: WO2004/051730

PCT Pub. Date: Jun. 17, 2004

(65) Prior Publication Data

US 2006/0054656 A1  Mar. 16, 2006

(30) Foreign Application Priority Data

Dec. 2, 2002 (JP) ............................... 2002-350166

(51) Int. Cl.
*B65H 1/00* (2006.01)
(52) U.S. Cl. .............................. 414/222.01; 414/331.01
(58) Field of Classification Search ............ 414/331.01, 414/222.01
See application file for complete search history.

(56) References Cited

U.S. PATENT DOCUMENTS

| | | | | |
|---|---|---|---|---|
| 3,766,638 A | * | 10/1973 | Moore | 438/464 |
| 5,551,596 A | | 9/1996 | Oomori | |
| 5,679,055 A | * | 10/1997 | Greene et al. | 451/10 |
| 6,135,264 A | | 10/2000 | Saito et al. | |
| 6,152,677 A | * | 11/2000 | Tateyama et al. | 414/738 |
| 6,344,402 B1 | * | 2/2002 | Sekiya | 438/460 |
| 6,371,716 B1 | * | 4/2002 | Byun et al. | 414/416.03 |

FOREIGN PATENT DOCUMENTS

| | | |
|---|---|---|
| JP | 63-244641 | 10/1988 |
| JP | 2-155244 | 6/1990 |
| JP | 5-206699 | 8/1993 |
| JP | 7-7294 | 1/1995 |
| JP | 8-298282 | 11/1996 |
| JP | 2000-91385 | 3/2000 |
| JP | 2000-327070 | 11/2000 |
| TW | 267146 | 1/1996 |
| TW | 422484 | 2/2001 |

* cited by examiner

*Primary Examiner*—Saúl J Rodríguez
*Assistant Examiner*—Jonathan D Snelting
(74) *Attorney, Agent, or Firm*—Wenderoth, Lind & Ponack, L.L.P.

(57) ABSTRACT

According to the type of the plate placed in a plate placing device of a component feeder, appropriate holding operation and expanding operation are performed selectively and automatically according to the type of the plate by regulating the lowered position of a plate pressurizing member for the tray feeding plate to securely hold the plate and performing wafer expanding while securely holding the wafer feeding plate by releasing the regulation of the lowered position for the wafer feeding plate.

27 Claims, 47 Drawing Sheets

COMPONENT FEEDER

TECHNICAL FIELD

The present invention relates to a component feeder that employs a wafer feeding plate on which a wafer where a plurality of wafer feed components are arranged is placed and a tray feeding plate on which a component feeding tray where a plurality of tray feed components are arranged is placed, of components to be mounted, on a board and feeds the wafer feed components and the tray feed components to the mounting section of a component mounting apparatus while allowing the components to be mounted.

BACKGROUND ART

Conventionally, either one of the wafer feeding plate on which a wafer where a plurality of wafer feed components are arranged is placed and the tray feeding plate on which a component feeding tray where a plurality of tray feed components are arranged is placed, of the components to be mounted on a board, is selectively received in such a component feeder, and the wafer feeding plate or the tray feeding plate is discharged to feed the wafer feed components or the tray feed components to the mounting section or the like of the component mounting apparatus (refer to, for example, Japanese unexamined Patent Publication No. 2000-91385).

Moreover, in order to allow the wafer feed components to be fed from the wafer placed on the wafer feeding plate in such a component feeder, it is necessary to expand the wafer that has undergone dicing. Therefore, the component feeder is provided with a device for performing the expanding. It is further necessary to push up the wafer feed components fed from the wafer that has undergone the expanding from under its lower surface to put the components into a state in which they can be taken out. Therefore, the component feeder is also provided with a pushup device that performs the pushup operation.

On the other hand, in order to allow the tray feed components to be fed from the component feeding tray placed on the component feeding plate in the component feeder, it is not necessary to perform the operation of wafer expanding, pushup, or the like.

Therefore, the operation to allow the components to be fed differs depending on when the wafer feeding plate is received in and when the tray feeding plate is received in the component feeder.

Presently, with regard to the component mounting, producing multichip mounting boards produced by mounting various kinds of components on one board has become a main stream. The various kinds of components to be mounted on such a multichip mounting board include numbers of the wafer feed components or the tray feed components. Moreover, it is earnestly demanded to improve the productivity of the production of such multichip mounting boards on the other hand.

SUMMARY OF THE INVENTION

However, the conventional component feeders have had no measures to automatically cope with the difference between the wafer feed component feeding operation and the tray feed component feeding operation as described above. This has been managed, depending on the component feeding mode as to whether or not the components are fed from the wafer feeding plate or the component feeding plate, by not operating the device for performing the expanding, the pushup device, and so on or preventing the influence of the operation, or manually replacing the constituent components of the devices by operators. This has an issue that the productive efficiency in the component feeding is significantly lowered.

Moreover, in the scene of component mounting, the priority of the mounting of the wafer feed component and the tray feed component on the board differs depending on the type of the board and so on. Therefore, the replacement work of the constituent components in the component feeder and the replacement work of replacing the plate to be received in the component feeder between the wafer feeding plate and the component feeding plate are carried out according to the feeding mode of the components. There is also an issue that the above work becomes very troublesome for the operators and significantly lowers the work efficiency.

Furthermore, the feeding height position of the wafer feed component on the wafer feeding plate and the feeding height position of the tray feed component on the tray feeding plate are not the same height position depending on the differences of the shape of the wafer and the component feeding tray. Therefore, it is necessary for each of the plates to perform the component feeding in the same feeding height position allowing the components to be fed, and a work for adjusting the height position of the support portion that supports each of the plates in the component feeder according to the component feeding mode (e.g., replacement of the component of the support portion or the like), and there is a further issue that the work efficiency is further lowered.

Moreover, maintenance of the component feeder has various issues as described later, and there is also an issue that the maintenanceability of the component feeder is not satisfactory, and efficient component feeding cannot be achieved.

Accordingly, an object of the present invention is to solve the aforementioned issues and provide a component feeder capable of carrying out efficient component mounting by employing a wafer feeding plate on which a wafer where a plurality of wafer feed components are arranged is placed and a tray feeding plate on which a component feeding tray where a plurality of tray feed components are arranged is placed, of the components to be mounted on a board and feeding the wafer feed components and the tray feed components to the mounting section of a component mounting apparatus while allowing the components to be mounted, allowing the wafer feeding plate and the tray feeding plate to be received in mixture, allowing the components to be automatically fed from the selected plate regardless of whether the plate selected from the plates is the wafer feeding plate or the tray feeding plate and allowing the maintenanceability to be made satisfactory.

In accomplishing the above objects, the present invention is constructed as follows.

According to a first aspect of the present invention, there is provided a component feeder for feeding, from a wafer feeding plate on which a wafer having a plurality of wafer feed components is placed and a tray feeding plate on which a component feeding tray having a plurality of tray feed components is placed, out of components to be mounted on a board, the wafer feed components and the tray feed components while allowing the components to be mounted, the component feeder comprising a plate placing device for which selectively placing and holding either plate of the plates and allowing the wafer feed component or the tray feed component to be fed from the wafer or the component feeding tray, respectively, and the plate placing device serving for placing and holding the plate so that a feeding height of the wafer feed component on the wafer feeding plate and a feeding height of the tray feed component on the tray feeding plate become approximately equal to each other.

According to a second aspect of the present invention, there is provided the component feeder as defined in the first aspect, wherein the plate placing device comprises:

an elastic support member, which is able to support the placed plate from a lower surface side in a vicinity of its outer peripheral portion and of which support height position is variable;

a plate pressurizing member for holding the plate by pressurizing the plate supported by the elastic support member from an upper surface side of the plate in the vicinity of the outer peripheral portion so that the plate is held between the plate pressurizing member and the elastic support member; and a pressurizing member elevating unit for moving up and down the plate pressurizing member, and the pressurizing member elevating unit moves up and down the plate pressurizing member to vary the support height position of the elastic support member so that the feeding height of the wafer feed component on the wafer feeding plate and the feeding height of the tray feed component on the tray feeding plate, being supported by the elastic support member become approximately equal to each other.

According to a third aspect of the present invention, there is provided the component feeder as defined in the second aspect, wherein the plate placing device further comprises a regulation part for selectively regulating a position in which the plate pressurizing member is lowered by the pressurizing member elevating unit, and the position in which the plate pressurizing member is lowered is regulated by the regulation part so that the feeding height of the tray feed component becomes approximately equal to the feeding height of the wafer feed component when the tray feeding plate is placed on the plate placing device.

According to a fourth aspect of the present invention, there is provided a component feeder for feeding, from a wafer feeding plate on which a wafer having a plurality of wafer feed components is arranged and a tray feeding plate on which a component feeding tray having a plurality of tray feed components is arranged, out of components to be mounted on a board, the wafer feed components and the tray feed components while allowing the components to be mounted, the component feeder comprising:

a plate receiving part for receiving the plurality of wafer feeding plates and the plurality of tray feeding plates while allowing the plates to be discharged;

a plate placing device for selectively placing and holding either plate of the plates and allowing the wafer feed component or the tray feed component to be fed from the wafer or the component feeding tray, respectively; and a plate moving device for releasably holding the plate, discharging the plate from the plate receiving part, and moving the plate while allowing the plate to be held by the plate placing device, and the plate placing device comprising:

a plurality of elastic support members, which are able to support the placed plate from a lower surface side in a vicinity of its outer peripheral portion and of which support height positions are variable;

a plate pressurizing member for holding the plate by pressurizing the plate supported by the elastic support members from an upper surface side in the vicinity of the outer peripheral portion so that the plate is held between the plate pressurizing member and the elastic support members; and a pressurizing member elevating unit for moving up and down the plate pressurizing member; and a regulation part for selectively regulating a position in which the plate pressurizing member is lowered by the pressurizing member elevating unit, wherein the support height of the tray feeding plate by the elastic support members can be held by regulating the position where the plate pressurizing member is lowered by the regulation part when the tray feeding plate is placed on the plate placing device, and when the wafer feeding plate is placed on the plate placing device, the wafer placed on the wafer feeding plate can be expanded by releasing regulation of the lowered position by the regulation part and lowering the plate pressurizing member by the pressurizing member elevating unit while supporting the wafer feeding plate by the elastic support members.

According to a fifth aspect of the present invention, there is provided the component feeder as defined in the fourth aspect, wherein the wafer feeding plate comprises:

a wafer sheet to which the wafer that has undergone dicing adheres; and a wafer ring, which is an annular plate and holds the wafer sheet so that the wafer is positioned inside thereof, the plate placing device further comprises an expanding member that has an annular contact portion capable of coming in contact with a lower surface of the wafer sheet between an outer periphery of the wafer and an inner periphery of the wafer ring at the wafer feeding plate in a state in which the wafer ring is supported by the elastic support members, and the wafer can be expanded by radially expanding the wafer sheet by lowering the plate pressurizing member by the pressurizing member elevating unit using the annular contact portion of the expanding member as a fulcrum and thus depressing the wafer ring.

According to a sixth aspect of the present invention, there is provided the component feeder as defined in the fourth aspect, wherein the plate moving device comprises:

a holding part for releasably holding the plate;

a holding part moving unit for moving the holding part so as to move the plate held by the holding part from the plate receiving part to the plate placing device; and a plate identifying part for identifying whether the held plate is the wafer feeding plate or the tray feeding plate based on a configuration of the holding part of the plate, and the regulation part of the plate placing device regulates the position where the plate pressurizing member is lowered based on an identification result of the plate identifying part.

According to a seventh aspect of the present invention, there is provided the component feeder as defined in the fifth aspect, wherein the tray feeding plate comprises:

a tray placing part, on which a plurality of the component feeding trays are detachably placed; and a tray ring, which is an annular plate formed at a periphery of the tray placing part, and the plate placing device is able to support the tray ring by the elastic support members and hold the tray feeding plate by holding and pressurizing the tray ring between the plate pressurizing member and the elastic support members, and the regulation part regulates the position where the plate pressurizing member is lowered by the pressurizing member elevating unit so that a lower surface of the tray feeding plate does not come in contact with the expanding member.

According to an eighth aspect of the present invention, there is provided the component feeder as defined in the seventh aspect, wherein the tray placing part comprises:

a fixed side holding member, which is able to come in contact with one end portion of a roughly quadrangle configuration of the component feeding tray that has the roughly quadrangle shape in plan; and movable side holding members, which are able to come in contact with an end portion opposite to the one end portion of the component feeding tray in a state in which the one end portion is brought in contact with the fixed side holding member and allows the opposite end portion to be movably urged toward the fixed side holding member, and a placement position of the component feeding tray in the tray placing part is held so as to hold the component feeding tray by the fixed side holding member and the movable side holding members.

According to a ninth aspect of the present invention, there is provided the component feeder as defined in the fourth aspect, wherein at least one elastic support member of the plurality of elastic support members has a slant end portion, which has its end portion come in contact with the end portion of the supported plate, thereby regulating a support position in a direction along a surface of the plate.

According to a 10th aspect of the present invention, there is provided the component feeder as defined in the fourth aspect, wherein the regulation part comprises:

a contact portion, which is able to come in contact with a lower portion of the plate pressurizing member and regulate the position where the plate pressurizing member is lowered by the contact; and a contact portion moving mechanism for moving the contact portion between a contact position where the contact portion is come in contact with the plate pressurizing member and a retreat position where the contact portion is retreated.

According to an 11th aspect of the present invention, there is provided the component feeder as defined in the fourth aspect, wherein the pressurizing member elevating unit of the plate placing device comprises:

a cylinder portion for moving up or down the plate pressurizing member by supplying or discharging compressed air;

an elevation compressed air supplying part, which is able to supply elevation compressed air for performing the upward or downward movement as the compressed air to the cylinder portion;

a retention compressed air supplying part, which has a pressure lower than that of the elevation compressed air and is able to supply retention compressed air for retaining a stop position of the plate pressurizing member when the plate pressurizing member stops moving up or down as the compressed air to the cylinder portion; and a compressed air selection valve for selectively supplying the elevation compressed air or the retention compressed air to the cylinder portion.

According to a 12th aspect of the present invention, there is provided the component feeder as defined in the 11th aspect, wherein the compressed air selection valve is a mechanical lock valve, which is able to detect an upper end position of elevation of the plate pressurizing member by mechanically coming in contact with the plate pressurizing member, for selectively supplying the retention compressed air to the cylinder portion in place of the elevation compressed air when the upper end position is detected.

According to a 13th aspect of the present invention, there is provided the component feeder as defined in the sixth aspect, wherein the plate receiving part comprises:

a receiver for receiving the plates in a stack; and a receiver elevating unit for positioning one plate of the plates received in the receiver into an elevation height position in which the plate can be held by the holding portion of the plate moving device by moving up and down the receiver, and the plate placing device comprises:

an openable jump preventing plate, which has a plate outlet portion that allows the one held plate together with the holding part to pass therethrough, and a plate regulation part, which is formed at a periphery of the outlet portion and is able to prevent the plates that are other than the one plate and are received in the receiver of the plate receiving part from jumping out of the receiver.

According to a 14th aspect of the present invention, there is provided the component feeder as defined in the 13th aspect, wherein the plate placing device further comprises a jump detecting unit, which is able to detect the plate located in the outlet portion of the jump preventing plate.

According to a 15th aspect of the present invention, there is provided the component feeder as defined in the fourth aspect, wherein the plate receiving part comprises:

a base for supporting the receiver and the receiver elevating unit; and a base retention part, which has a linear motion guide portion that can retain a position where the base is placed, for guiding a linear motion of the base by releasing the retention, and a pivot guide portion for guiding a rotational motion of the base, and the base comprises an engagement portion, which can be selectively engaged with the linear motion guide portion and the pivot guide portion, the base can be linearly moved by engaging the engagement portion with the linear motion guide portion, and the base can be moved while rotating by releasing the engagement between the engagement portion and the linear motion guide portion and engaging the engagement portion with the pivot guide portion.

According to a 16th aspect of the present invention, there is provided the component feeder as defined in the fourth aspect, wherein the receiver of the plate receiving part comprises a plurality of sets of support guide portions for individually supporting mutually opposed each end portions of each of the plates, which are arranged mutually opposed to guide a movement in a direction along a surface of the plate in discharging each of the plates, and wherein a contact portion to each support guide portion of each of the plates has a smooth surface portion.

According to a 17th aspect of the present invention, there is provided the component feeder as defined in the 16th aspect, wherein a slant portion with respect to a movement direction is formed at an insertion end portion of the support guide portions of the each set while enabling correction of positional deviation between an insertion position of each of the plates to the support guide portions of the each set in a direction roughly perpendicular to the movement direction of each of the plates and a support position of the support guide portions of the each set.

According to an 18th aspect of the present invention, there is provided the component feeder as defined in the 16th or 17th aspect, wherein contact surfaces between each of the plates and the support guide portions are formed so that a hardness of the contact surface of the support guide portion is smaller than that of the plate.

According to a 19th aspect of the present invention, there is provided the component feeder as defined in the 16th or 17th aspect, wherein contact surfaces between each of the plates and the support guide portions are formed so that a hardness of the contact surface of the plate is smaller than that of the support guide portion.

According to a 20th aspect of the present invention, there is provided the component feeder as defined in the 16th or 17th aspect, wherein the support guide portions comprise roller portions rotatable along a surface of the end portion while supporting the end portion of each of the plates.

According to a 21st aspect of the present invention, there is provided the component feeder as defined in the fourth aspect, wherein the plate pressurizing member has a lower surface further comprising:

a plurality of support members for supporting the plate fed to the plate placing device while allowing the plate to be discharged; and a plurality of urging members for consistently urging the plate against the support members or the elastic support members regardless of the position where the plate pressurizing member is lowered by the pressurizing member elevating unit.

According to a 22nd aspect of the present invention, there is provided the component feeder as defined in the 21st aspect, wherein each of the urging members comprise an urging roller portion rotatable along a surface of the plate while urging the plate supported by the support members to allow the plate to be moved by the plate moving device.

According to a 23rd aspect of the present invention, there is provided the component feeder as defined in the sixth aspect, wherein each of the plates has an engagement portion capable of being engaged with the holding part in a holding position on the upper surface side of the plate by the holding part.

According to the 24th aspect of the present invention, there is provided a component feeder as defined in the 16th aspect, in which the receiver is further provided with a plurality of posture guide portions for guiding the support posture in the horizontal direction of each of the plates by being placed between the support guide portions of each set and engaged with each of the plates.

According to a 25th aspect of the present invention, there is provided the component feeder as defined in the 24th aspect, wherein the receiver has an openable and closable cover portion for replacing each of the plates, and the posture guide portions are provided inside the cover portion.

According to a 26th aspect of the present invention, there is provided the component feeder as defined in the 25th aspect, wherein the receiver comprises an open/close detection sensor for detecting opening or closing of the cover portion.

According to a 27th aspect of the present invention, there is provided the component feeder as defined in the 15th aspect, wherein the receiver comprises a plurality of fixing parts for fixing the support to a support surface of the base, and at least one of the fixing parts is formed of a conductive material having a function as a ground terminal portion.

According to the first aspect or the second aspect of the present invention, the elevation position of the plate pressurizing member in the plate placing device of the component feeder can be adjusted by the pressurizing member elevating unit. Therefore, the support height position of the elastic support member can be varied according to the type of the plate placed on the plate placing device. Therefore, the components can be fed in the state in which the feeding heights of the components arranged on each of the plates are roughly equalized regardless of whether the plate that is placed and fed is the wafer feeding plate or the tray feeding plate. Therefore, the components can be selectively automatically fed in an appropriate state according to the type of the plate while receiving the plates in mixture, and the component feeding can be efficiently performed.

According to the third aspect of the present invention, the lowered position of the plate pressurizing member of the plate placing device can be selectively regulated. Therefore, the lowered position can be regulated according to the type of the plate placed on the plate placing device, and the feeding heights of the wafer feed component and the tray feed component can be roughly equalized.

According to the fourth aspect of the present invention, the lowered position of the plate pressurizing member in the plate placing device of the component feeder can be selectively regulated. Therefore, according to the type of the plate placed on the plate placing device, the tray feeding plate can reliably be held by regulating the lowered position, and the wafer can be expanded while reliably holding the wafer feeding plate by releasing the regulation of the lowered position. Therefore, appropriate holding or expanding operation can be selectively automatically performed according to the type of the plate while receiving in mixture the plates regardless of whether the plate that is placed and fed is the wafer feeding plate or the tray feeding plate, making it possible to efficiently perform component feeding.

Moreover, according to the other aspects of the present invention, the type of the plate can be identified by the plate identifying part on the basis of the configuration of the holding part of the plate when the plate is held and discharged from the plate receiving part. Moreover, the position where the plate pressurizing member is lowered can be selectively regulated by the regulation part on the basis of the identification result.

Moreover, the position where the plate pressurizing member is lowered is regulated so that the expanding member, for expanding the wafer does not come in contact with the lower surface of the tray feeding plate, and therefore, the expanding member can be prevented from being damaged.

Moreover, since the plurality of elastic support members of which the support height positions are made variable are provided for the plate placing device. With this arrangement, it is possible to support each of the plates in the vicinity of the outer peripheral portion of each of the plates and freely vary the support height positions while achieving the support according to the elevating operation of the plate pressurizing member, allowing the aforementioned effects to be achieved.

Moreover, at least one elastic support member of the plurality of elastic support members has a slant end portion, of which the end portion is brought in contact with the end portion of the supported plate so as to regulate the support position in the direction along the surface of the plate. With this arrangement, reliable and accurate holding of the plate can be achieved.

Moreover, the tray placing part is provided with the fixed side holding member and the movable side holding member. With this arrangement, it is possible to place the component feeding tray in the placement position and hold the placement position so as to hold the component feeding tray between the fixed side holding member and the movable side holding member from above the placement position. Therefore, the accommodation ratio per area of the component feeding tray in the tray placing part of the tray feeding plate can be improved, and more efficient component feeding can be performed.

Moreover, the jump preventing plate is provided on the plate placing device side and made openable. With this arrangement, the jump preventing plate can be moved by opening and closing the jump preventing plate, and the maintenanceability can be improved. Further, the jump detecting unit capable of detecting the plate located in the outlet portion is provided at the outlet portion. With this arrangement, even when the jump preventing plate cannot produce its function by being opened during maintenance or the like, the plate that has jumped out of the receiver can be detected, and the maintenanceability can be improved while improving safety.

Moreover, by virtue of the provision of the mechanism that can perform linear motion and pivoting in combination during the equipping and releasing of equipment of the plate receiving part to and from the component feeder, it becomes possible to securely receive and load the plate receiving part in a narrower space or simply smoothly draw out the plate receiving part from the space. Therefore, even when the component feeder is installed in a compacter space, it is possible to smoothly load and unload the plate receiving part and improve the maintenanceability.

Moreover, the contact portions of each of the plates to the support guide portions have the smooth surface portions. With this arrangement, the frictional force generated in the contact portions can be reduced, and the generation of cuttings and so on due to the contact wear can be prevented. The generation of cuttings sometimes may cause the functional issues that the maintenanceability of the component feeder is reduced and the mounting surfaces of the components to the board and so on are contaminated. Therefore, the frequency of the occurrence of the issues can be remarkably reduced. Even when the wafer feeding plate and the tray feeding plate of which the weight is comparatively heavy and which might cause the generation of cuttings are received in mixture and fed, the maintenanceability of the component feeder can be improved, and efficient component feeding can be achieved.

Moreover, the slant portion inclined with respect to the direction of the movement is formed at the insertion end portion of the support guide portions of each set. With this arrangement, the positional deviation between the insertion position of each of the plates and the support positions by the support guide portions can be corrected, and reliable and stable reception of each of the plates in the plate receiving part can be achieved. Moreover, the formation of the slant portion can make smooth inserting movement of the plate along the support guide portions and also contribute to a reduction in the amount of generation of cuttings.

Moreover, with regard to the hardness of the mutual contact surfaces of each of the plates and the support guide portion, the support guide portions are formed so that the hardness of the contact surface of the support guide portion is smaller than that of the plate. With this arrangement, the amount of generation of cuttings due to the mutual contact can be reduced.

Moreover, conversely, a similar effect can be obtained by forming each of the plates so that the hardness of the plate is made lower than that of the support guide portion, and the formation material of the receiver that requires versatility is allowed to have standard specifications.

Moreover, by respectively providing the support guide portions with roller portions rotatable along the surface of the end portion of the plate while supporting the end portion of the plate, the inserting movement of the plate can be made smoother.

Moreover, the urging members provided for the plate pressurizing members consistently urge the plate against the support members or the elastic support members regardless of the position where the plate pressurizing member is lowered by the pressurizing member elevating unit. With this arrangement, the plate supported by the plate pressurizing member can reliably be prevented from vibrating due to the elevation of the plate pressurizing member. Therefore, the occurrence of the jump-out of the components attributed to the vibration can reliably be prevented, and stable component feeding can be achieved.

Moreover, by virtue of the urging members respectively provided with the urging rollers, the urging does not obstruct the movement of the plate.

Moreover, each of the plates is provided with the engagement portion that can be engaged with the holding part, at the holding position on the upper surface side of the holding part. With this arrangement, the holding of each of the plates by the holding part can be made more reliable.

Moreover, the receiver is further provided with a plurality of posture guide portions for guiding the support posture in the horizontal direction of each of the plates by being arranged between the sets of the support guide portions and being engaged with each of the plates. With this arrangement, the posture of the plate received in the receiver can be retained in the normal state, and the plate can be smoothly received in and taken out from the receiver.

Moreover, the posture guide portions are provided inside the cover portion of the receiver. With this arrangement, by closing the cover, the plates and the posture guide portions can be engaged with each other, and the posture in the horizontal direction can be put in the normal state.

Moreover, by further providing the open/close detection sensor for detecting the opening and closing of the cover portion, it can be determined that the plate has been received in the normal posture only when the closing of the cover portion is detected by the open/close detection sensor, and the posture of the received plate can be efficiently managed.

Moreover, the receiver has a plurality of fixing parts for fixing the support to the support surface of the base, and at least one of the fixing parts is formed of a conductive material having a function as a ground terminal portion. With this arrangement, the amount of charge of the receiver can be reduced, and the component feeding can be performed smoothly and efficiently.

BRIEF DESCRIPTION OF THE DRAWINGS

These and other aspects and features of the present invention will become clear from the following description taken in conjunction with the preferred embodiments thereof with reference to the accompanying drawings, in which:

FIG. 26A is a side view of the groove portion, and FIG. 26B is a front view of the groove portion of FIG. 26A;

FIG. 54A shows the left-hand end portion, and FIG. 54B shows the right-hand end portion;

DETAILED DESCRIPTION OF THE INVENTION

Figure 1:
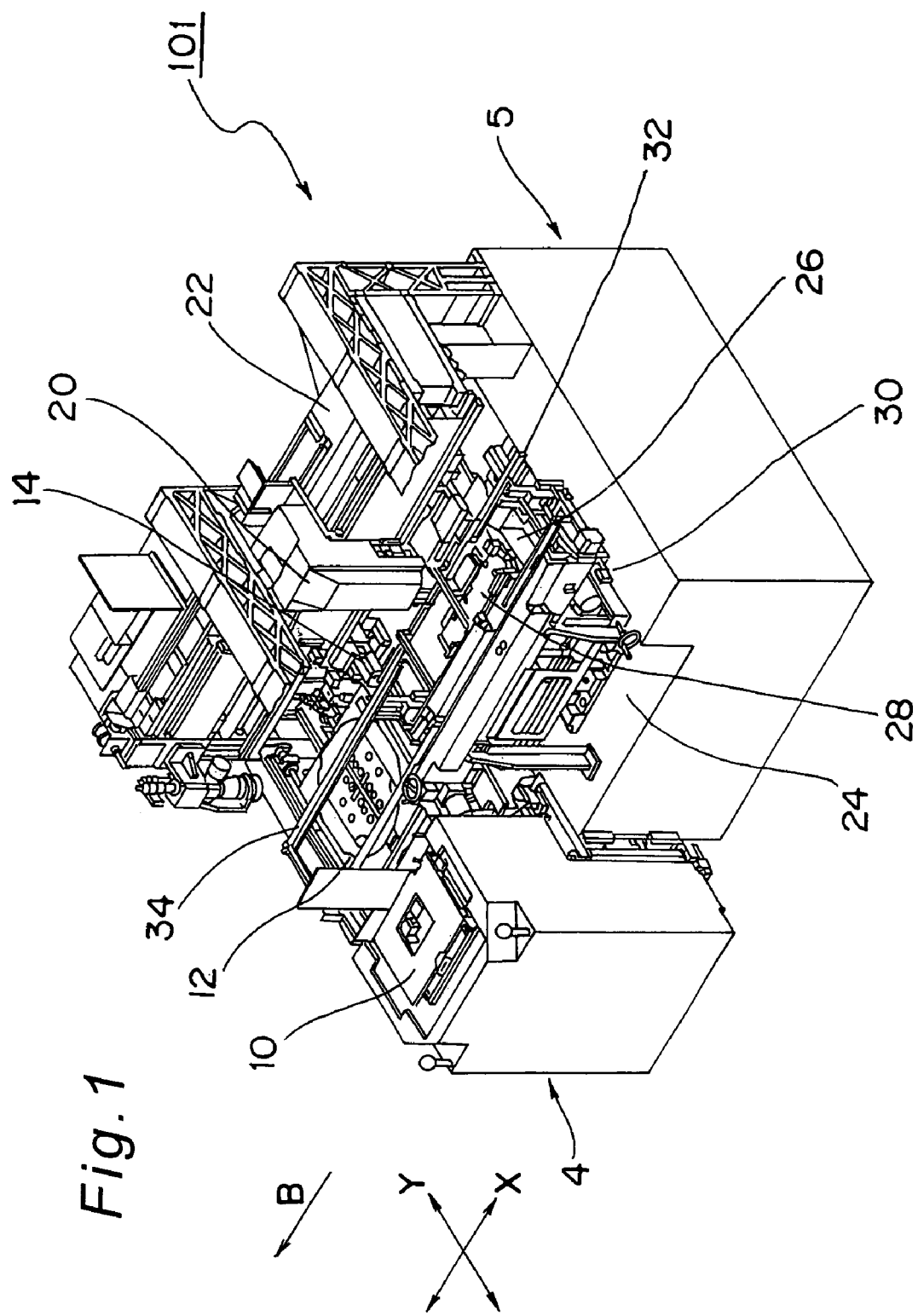
FIG. 1 is a perspective view of an electronic component mounting apparatus according to a first embodiment of the present invention.

Before the description of the present invention proceeds, it is to be noted that like parts are designated by like reference numerals throughout the accompanying drawings.

Embodiments of the present invention will be described in detail below with reference to the drawings.

First Embodiment

FIG. 1 shows a perspective view of an electronic component mounting apparatus 101 of one example of the component mounting apparatus that is provided with a component feeder 4 of one example of the component feeder according to the first embodiment of the present invention, for mounting components fed from the component feeder 4 on a board. Before describing the detailed structure and operation of the component feeder 4, the overall construction and operation of the electronic component mounting apparatus 101 provided with the component feeder 4 is described with reference to FIG. 1.

(Concerning Electronic Component Mounting Apparatus)

As shown in FIG. 1, the electronic component mounting apparatus 101 is an apparatus for mounting an electronic components 2 such as chip components and bare IC chips of one example of the components on a board, which is provided roughly with a component feeder 4 for receiving a plurality of electronic components 2 while allowing the components to be fed, and a mounting section 5 for performing mounting operation for mounting the electronic components 2 fed from the component feeder 4 on the board.

In the component feeder 4 shown in FIG. 1, a lifter unit 10 of one example of the plate receiving part for receiving in mixture, a wafer feeding plate on the upper surface of which a wafer with a plurality of wafer feed components 2w (one example of the components) of a number of electronic components 2 to be mounted on the board arranged is placed, and a tray feeding plate on the upper surface of which a component feeding tray with a plurality of tray feed components 2t (one example of the components) of the number of electronic components 2 received and arranged in a matrix shape is placed while allowing the plates to be selectively fed, is placed on the front side in the Y-axis direction in the figure of the component feeder 4. In the following description, the plate is described as each plate when the plate is used not limited to the wafer feeding plate or the tray feeding plate, and the component is described as the electronic component 2 when the component is not limited to the wafer feed component 2w or the tray feed component 2t. It is noted that the construction of each plate and so on will be described later. The wafer feed components 2w mainly include bare IC chips and so on formed by dicing a wafer, and the tray feed components 2t include the bare IC chips, IC chips (e.g., packaged IC chips) other than the bare IC chips, chip components, and so on.

Moreover, the component feeder 4 is provided with a plate placing device 12 that places each plate selectively fed from the lifter unit 10 and allows the electronic components 2 to be taken out of each plate. When the wafer feeding plate is supplied from the lifter unit 10 and placed on the plate placing device 12, the wafer placed on the wafer feeding plate is subjected to expanding operation in the plate placing device 12.

The component feeder 4 is further provided with an inverting head unit 14 for individually sucking and holding the electronic component 2 from the wafer placed on the plate or the component feeding tray selectively placed on the plate placing device 12, moving the component along the illustrated X-axis direction toward the mounting section 5, and vertically inverting the electronic component 2 that is sucked and held. Instead of the above case where the component feeder 4 is provided with the inverting head unit 14, it may be a case where the electronic component mounting apparatus 101 is provided with the inverting head unit 14 as a device of a construction different from the component feeder 4 together with the component feeder 4.

Moreover, as shown in FIG. 1, the mounting section 5 is provided with a mounting head part 20 for sucking and holding the electronic component 2 and mounts the component on the board. Moreover, the mounting section 5 is further provided with an X-axis robot 22 of one example of the moving unit for moving the mounting head part 20 forward and backward along the illustrated X-axis direction while supporting the mounting head part 20 between a component feeding position, which is a position where the electronic component 2 held by the inverting head unit 14 can be delivered to the mounting head part 20 and a board mounting region where the mounting operation of the electronic component 2 on the board is performed, both the positions being arranged along the illustrated X-axis direction.

It is noted that the mounting head part 20 has a holding part (not shown), which is constructed so as to be elevatably driven by moving means of a voice coil motor or the like and able to apply bonding energy of pressurization energy, ultrasonic vibration energy, thermal energy, or the like to the junction portion between the electronic component 2 and the board through the electronic component 2 that is sucked and held, and is able to apply the bonding energy while pressurizing the electronic component 2 against the board. Moreover, the X-axis robot 22 has a moving mechanism (not shown), which employs, for example, a ballscrew shaft and a nut meshed with the ballscrew shaft.

Moreover, as shown in FIG. 1, an XY table 26, which can move the board in the illustrated X-axis direction and Y-axis direction, for positioning the position in which the electronic component 2 is mounted on the board with respect to the mounting head part 20, is provided on a base 24 of the mounting section 5 below the mounting head part 20 and the X-axis robot 22. The XY table 26 is driven to move by, for example, a servomotor in both the illustrated X-axis direction and Y-axis direction and is able to perform positioning by full close control by means of a linear scale. Moreover, a board holding base 28 for releasably holding and fixing the board, is placed on the upper surface of the XY table 26. In FIG. 1, the X-axis direction and the Y-axis direction are the directions along the surface of the board and mutually perpendicular directions.

Moreover, as shown in FIG. 1, the electronic component mounting apparatus 101 is provided with a board conveying unit 30 for conveying the board along a board conveyance direction B that is the leftward direction in the illustrated X-axis direction at an end portion on the front side in the illustrated Y-axis direction on the upper surface of the base 24 to feed the board to the board holding base 28 and discharge the board from the board holding base 28. The board conveying unit 30 is provided with a loader 32 of one example of the loader part for conveying and feeding the board from the end portion located on the right-hand side in the illustrated X-axis direction of the electronic component mounting apparatus 101 to the board holding base 28 on the XY table 26, and an unloader 34 of one example of the unloader part for conveying the board from the board holding base 28 and discharging the board to the end portion located on the left-hand side in the illustrated X-axis direction of the electronic component mounting apparatus 101. The present embodiment serves as an example in which the XY table 26 of the electronic component mounting apparatus 101 concurrently serves as a board holding and moving device provided for the board conveying unit 30. Moreover, the XY table 26 and the board holding base 28 serve as one example of the board holding and moving device for moving and holding the board. Moreover, instead of the case of concurrent use, it may be a case where the board conveying unit 30 is provided with the board holding and moving device besides the XY table 26 of the electronic component mounting apparatus 101.

It is noted that the electronic component mounting apparatus 101 is shown in FIG. 1 in the form of a perspective view in a state in which the casing cover for covering the entire upper surface of the base 24 is removed in consideration of the convenience of the explanation of the construction.

The mounting operation of the electronic component 2 on the board in the electronic component mounting apparatus 101 that has the above construction is described next.

In the electronic component mounting apparatus 101 of FIG. 1, the board holding base 28 is moved by the XY table 26 so as to be located between the loader 32 and the unloader 34 on the base 24. Concurrently with the operation, the board to be subjected to the mounting of each electronic component 2 by the electronic component mounting apparatus 101 is fed to the loader 32 of the board conveying unit 30 by, for example, another device or the like located adjacent to the electronic component mounting apparatus 101, so that the board is conveyed in a board conveyance direction B by the loader 32 and then the board is fed to and held by the board holding base 28. Subsequently, the XY table 26 is moved in the illustrated X-axis direction or the Y-axis direction, and the board is moved to the board mounting region.

On the other hand, one plate is selected and discharged from the plates received in the lifter unit 10 by the component feeder 4 and then placed on the plate placing device 12. Subsequently, the electronic component 2 is sucked and held and taken out by the inverting head unit 14 from the placed plate, and the electronic component 2 is inverted and moved to the component feeding position. The mounting head part 20 is moved to the component feeding position by the X-axis robot 22 in the mounting section 5, and the electronic component 2 is delivered from the inverting head unit 14 to the mounting head part 20. Subsequently, the mounting head part 20 that sucks and holds the delivered electronic component 2 is moved to a place above the board mounting region by the X-axis robot 22.

Subsequently, positional adjustment of the electronic component 2 that is sucked and held by the mounting head part 20 with respect to the position in which the electronic component 2 is to be mounted on the board that is held by the board holding base 28 is performed by moving the XY table 26. After the positional adjustment, elevating operation and so on of the mounting head part 20 are performed, and the mounting operation of the electronic component 2 on the board is performed. When the mounting operations of a plurality of electronic components 2 are performed, the mounting operation of each of the electronic components 2 is performed by repeating the above operations.

Subsequently, when the mounting operation of the electronic components 2 ends, the board on which the electronic components 2 are mounted is moved to a position located between the loader 32 and the unloader 34 by the XY table 26 together with the board holding base 28, and the board is delivered from the board holding base 28 to the unloader 34. The board is conveyed by the unloader 34 along the board conveyance direction B, and the board is discharged from the electronic component mounting apparatus 101. The discharged board is, for example, fed to another device that performs the next processing of the component mounting and is provided adjacent to the electronic component mounting apparatus 101 or received as a board that has undergone the component mounting in a board receiving unit or the like.

The mounting operation of each of the electronic components 2 on the board is thus performed in the electronic component mounting apparatus 101. After the board on which the electronic components 2 are mounted is discharged by the unloader 34, the electronic components 2 are mounted on each of the boards successively fed by feeding other new boards by the loader 32.

(Concerning Component Feeder)

Figure 2:
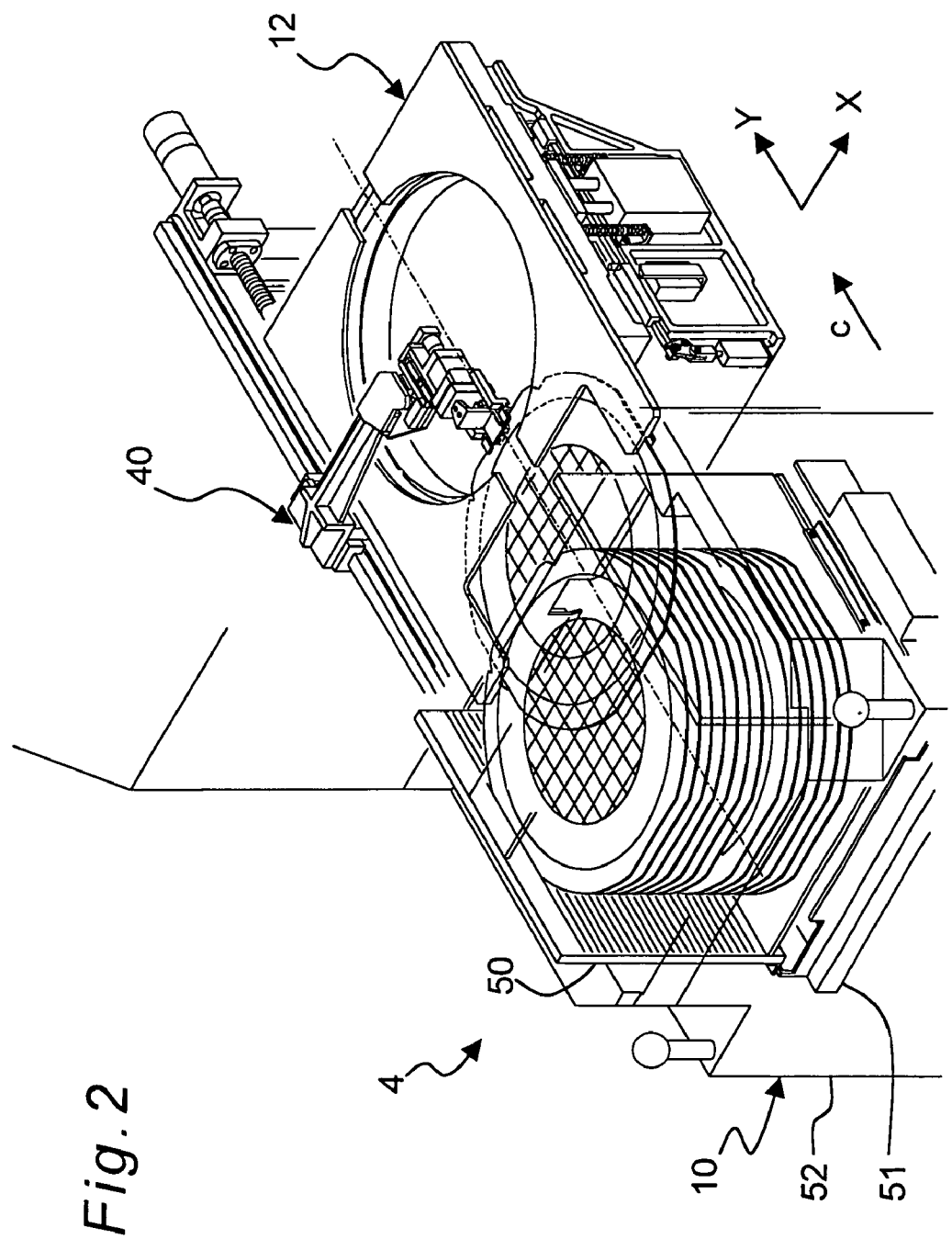
FIG. 2 is an enlarged half-transparent perspective view of a component feeder provided for the electronic component mounting apparatus of FIG. 1.

The detailed construction of the component feeder 4 provided for the electronic component mounting apparatus 101 that has the above construction and component mounting operation is described next particularly about the lifter unit 10, the plate placing device 12, and the constructions related to them. FIG. 2 shows a half-transparent perspective view of the lifter unit 10 and the plate placing device 12 of the component feeder 4.

As shown in FIG. 2, the component feeder 4 is further provided with a plate moving device 40 for moving the plate so as to hold and discharge each plate received in the lifter unit 10 and then place the plate on the plate placing device 12 in addition to the lifter unit 10 and the plate placing device 12 described above. Moreover, the plate moving device 40 is able to hold the plate placed on the plate placing device 12 and move the plate so as to put again the plate in the lifter unit 10.

First, the lifter unit 10 is provided with a magazine cassette 50 of one example of the receiver that has a box-like shape, for receiving a plurality of wafer feeding plates and a plurality of tray feeding plates in mixture in a stack in the vertical direction, a cassette elevating unit 51 of one example of the receiver elevating unit for supporting the magazine cassette 50 and performing the elevating operation of the magazine cassette 50 to position one plate out of the plates received in the magazine cassette 50 in an elevation height position where the plate can be discharged by the plate moving device 40, and a base 52 to which the cassette elevating unit 51 is attached and which is able to guide the elevating operation of the magazine cassette 50 by the cassette elevating unit 51.

Figure 3:
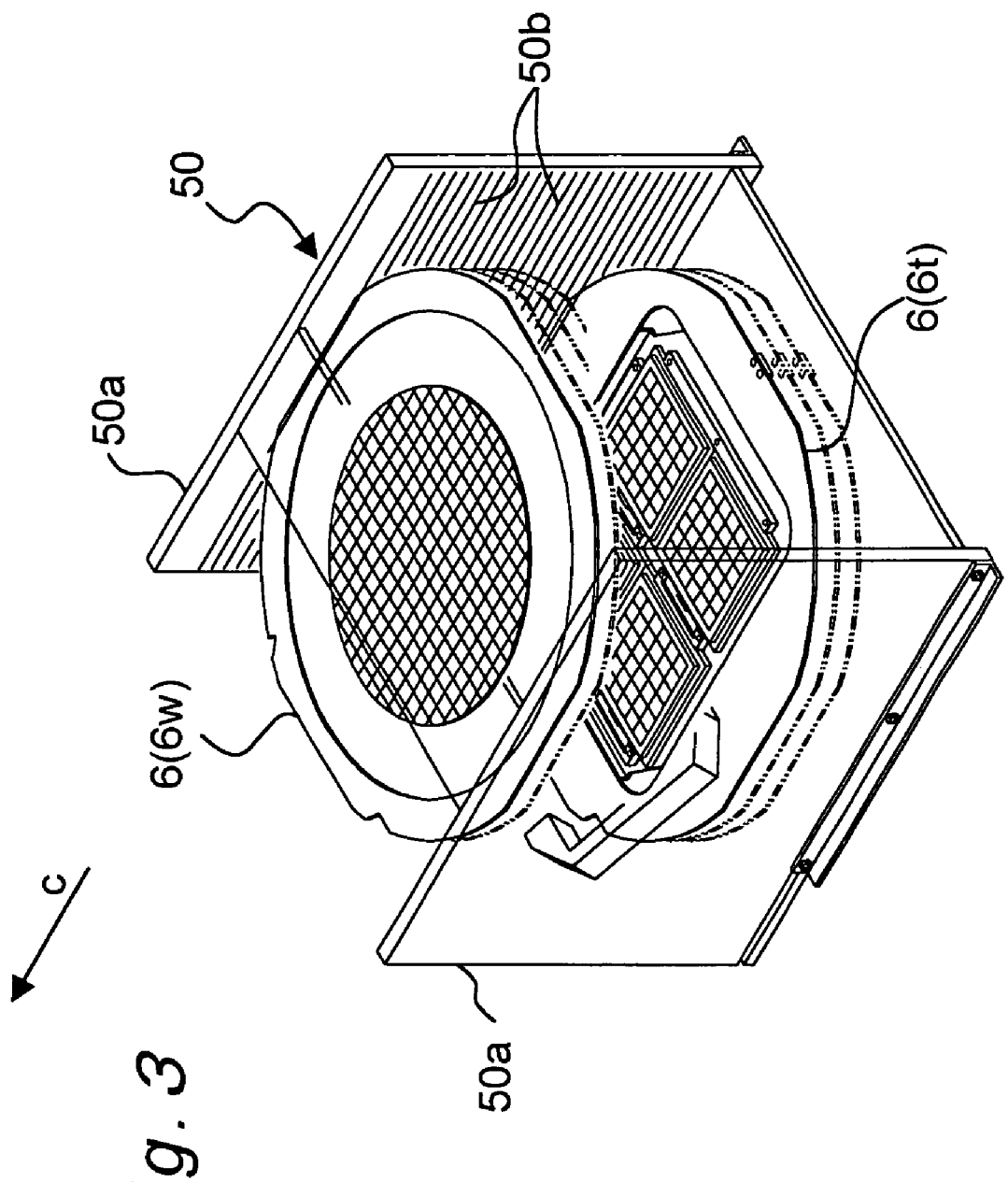
FIG. 3 is a half-transparent perspective view of a magazine cassette in a lifter unit of the component feeder.

FIG. 3 shows an enlarged perspective view (half-transparent perspective view) of the magazine cassette 50. As shown in FIG. 3, in the magazine cassette 50, the illustrated direction C is the direction (hereinafter referred to as a plate discharge direction C) in which each plate is discharged to the plate placing device 12. Moreover, the magazine cassette 50 has sidewall portions 50*a* that are opposed to each other in a direction perpendicular to the plate discharge direction C, and a plurality of groove portions 50*b* are formed along the plate discharge direction on mutually opposed side surfaces of the sidewall portions 50*a*. Each of the plates (hereinafter referred to as a plate 6) is held and received by the magazine cassette 50 by being engaged with the groove portions 50*b* of the sidewall portions 50*a* at the mutually opposed both end portions. It is noted that the groove portions 50*b* are formed at a constant interval pitch on the sidewall portions 50*a*, and each plate 6 has its surface put in a roughly horizontal state while being engaged with and held by the groove portions 50*b*. Further, each plate 6 can move forward and backward (i.e., sliding motion) along the plate discharge direction while being guided along the direction in which the groove portions 50*b* are formed. Moreover, since each received plate 6 is discharged from the magazine cassette 50, no sidewall portion is provided on the plate discharge direction C side so as not to obstruct the discharge, and the portion is always open. In FIG. 3, the plate 6 received on the upper side in the figure is the wafer feeding plate 6*w*, and the plate 6 received on the lower side in the figure is the tray feeding plate 6*t*.

The structures of the plates are described next with reference to a perspective view of the wafer feeding plate 6*w* shown in FIG. 4 and a perspective view of the tray feeding plate 6*t* shown in FIG. 5.

Figure 4:
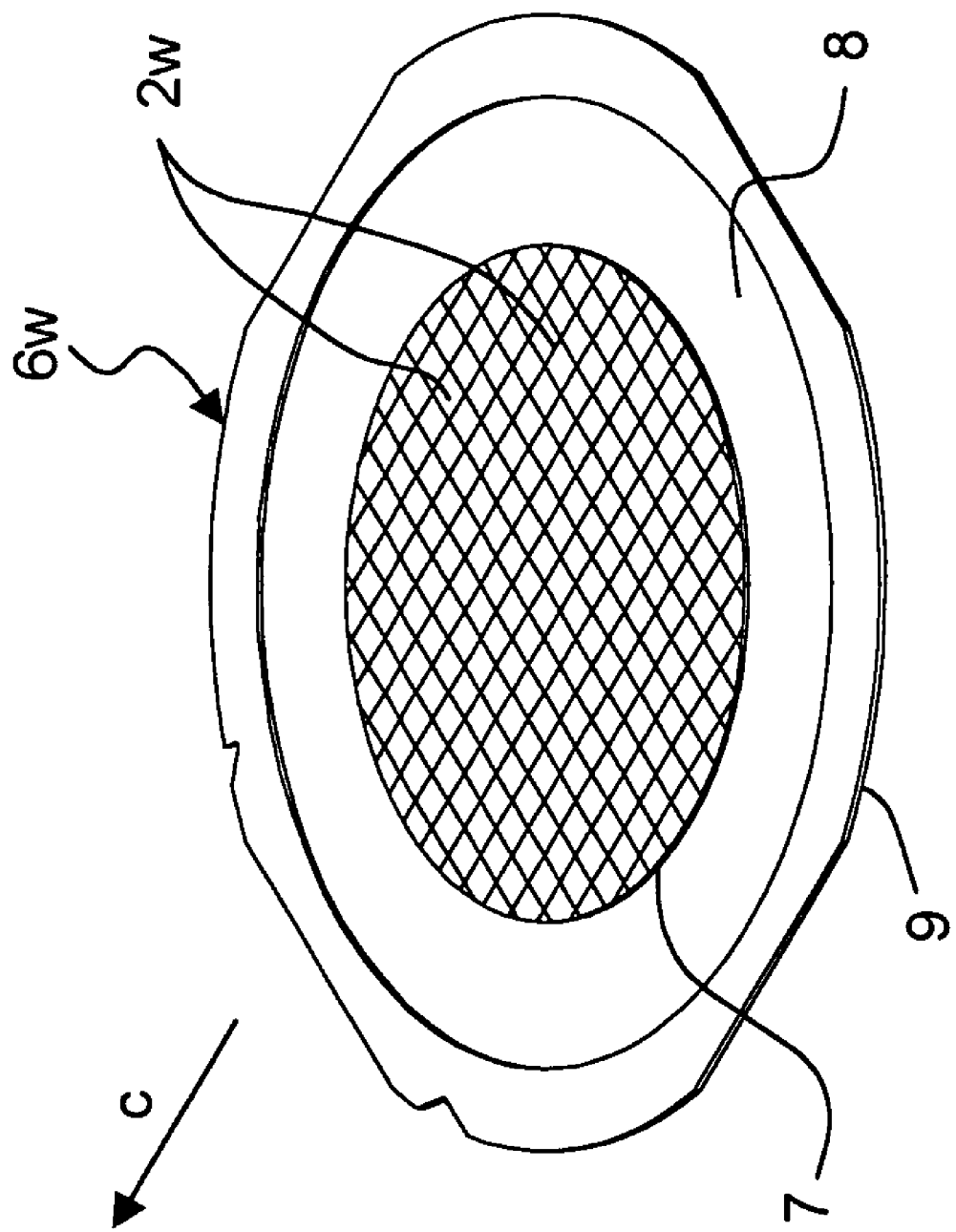
FIG. 4 is a perspective view of a wafer feeding plate handled by the component feeder.

As shown in FIG. 4, the wafer feeding plate 6*w* has a roughly disk-shaped configuration that has an outer peripheral portion of a combination of linear portions and curved portions. Moreover, the end portions, which are opposed to each other with interposition of the plate discharge direction C, have the linear outer peripheral portions in consideration of the engagement with the groove portions 50*b* of the magazine cassette 50. Moreover, as shown in FIG. 4, the wafer feeding plate 6*w* is a sheet that has elasticity and is provided with a wafer sheet 8 on the upper surface of which a diced wafer 7 is placed by adhesion and a wafer ring 9 that is an annular plate and holds the wafer sheet 8 in the neighborhood of its outer peripheral edge portion so that the wafer 7 is positioned inside the annular shape. With the wafer feeding plate 6*w* formed as described above, the positions where the wafer feed components 2*w* are arranged in a matrix shape can be radially expanded by radially expanding the wafer sheet 8, so that the so-called expanding can be achieved.

Figure 5:
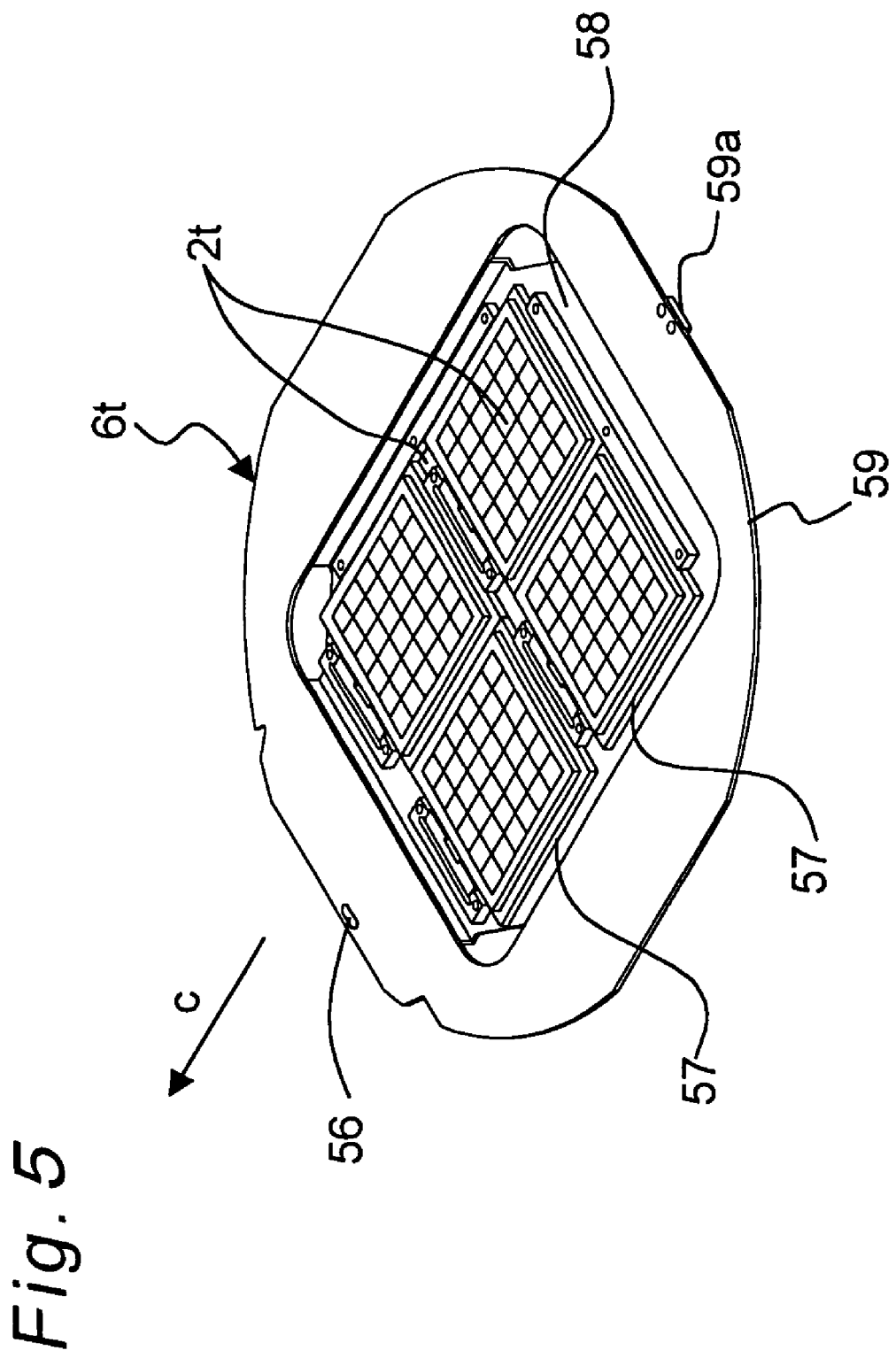
FIG. 5 is a perspective view of a tray feeding plate handled by the component feeder.

On the other hand, as shown in FIG. 5, the tray feeding plate 6*t* has an outside diameter configuration similar to that of the wafer feeding plate 6*w* described above. With this arrangement, the wafer feeding plate 6*w* and the tray feeding plate 6*t* can be received in mixture in the common magazine cassette 50. Moreover, as shown in FIG. 5, the tray feeding plate 6*t* is provided with a tray ring 59 that is an annular plate having roughly the same outer peripheral configuration as that of the wafer ring 9 and a roughly square inner peripheral hole portion, and a tray placing part 58 which is formed by attaching to the inner peripheral hole portion and on which a plurality of component feeding trays 57 are detachably placed. The tray placing part 58 is formed one step lower than the upper surface of the tray ring 59, and when the component feeding tray 57 is placed, the upper surface height position of each of the tray feed components 2*t* received on the component feeding tray 57 is formed to become roughly the same as the surface height position of the tray ring 59. By being thus formed, the height position of each of the tray feed components 2*t* on the tray feeding plate 6*t* is positioned roughly in the same height position as that of the wafer feed components 2*w* on the wafer feeding plate 6*w*. In FIG. 5, four component feeding trays 57, which have a roughly square planar configuration, are arranged in two rows and placed in the tray placing part 58. Instead of the case where the tray placing part 58 is formed separately from the tray ring 59 and attached to the inside of the tray ring 59, it may be a case where the tray placing part 58 is formed integrated with the tray ring 59. Moreover, as shown in FIG. 5, the position in the vicinity of the end portion on the plate discharge direction-C-side of the tray ring 59 of the tray feeding plate 6*t* serves as the holding position of the tray feeding plate 6*t* by the plate moving device 40, and an identification hole 56 to identify the tray feeding plate 6*t* is formed in this portion. Although the portion serves as the holding position also in the wafer feeding plate 6*w* of FIG. 4, an identification hole 56 for the identification is not provided. The above is to identify the tray feeding plate 6*t* and the wafer feeding plate 6*w* by a difference in the presence or absence of the identification hole 56 as described later.

Figure 6:
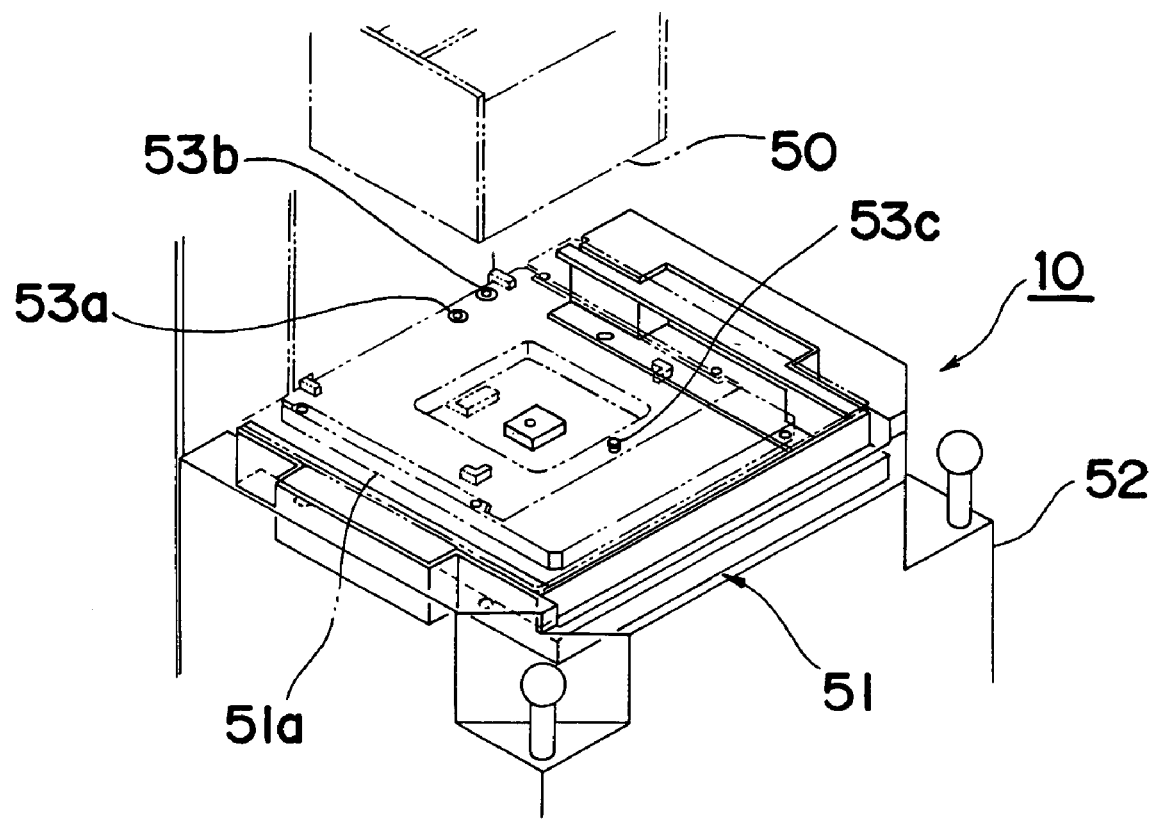
FIG. 6 is a perspective view of a cassette elevating unit of the lifter unit.

Further, as shown in FIG. 6, the cassette elevating unit 51 of the lifter unit 10 is provided with a cassette support base 51*a* on the upper surface of which the magazine cassette 50 is placed and held. In this case, the magazine cassette 50 to be handled in the lifter unit 10 includes those having a plurality of size types of, for example, a 6-inch size, an 8-inch size, or a 12-inch size. In order to detect the difference in the size of the magazine cassette 50, a 6-inch cassette detection sensor 53*a*, an 8-inch cassette detection sensor 53*b*, and a 12-inch cassette detection sensor 53*c*, which can detect the size of the placed magazine cassette 50 by detecting the difference in the planar size, are arranged on the upper surface of the cassette support base 51*a*.

Figure 7:
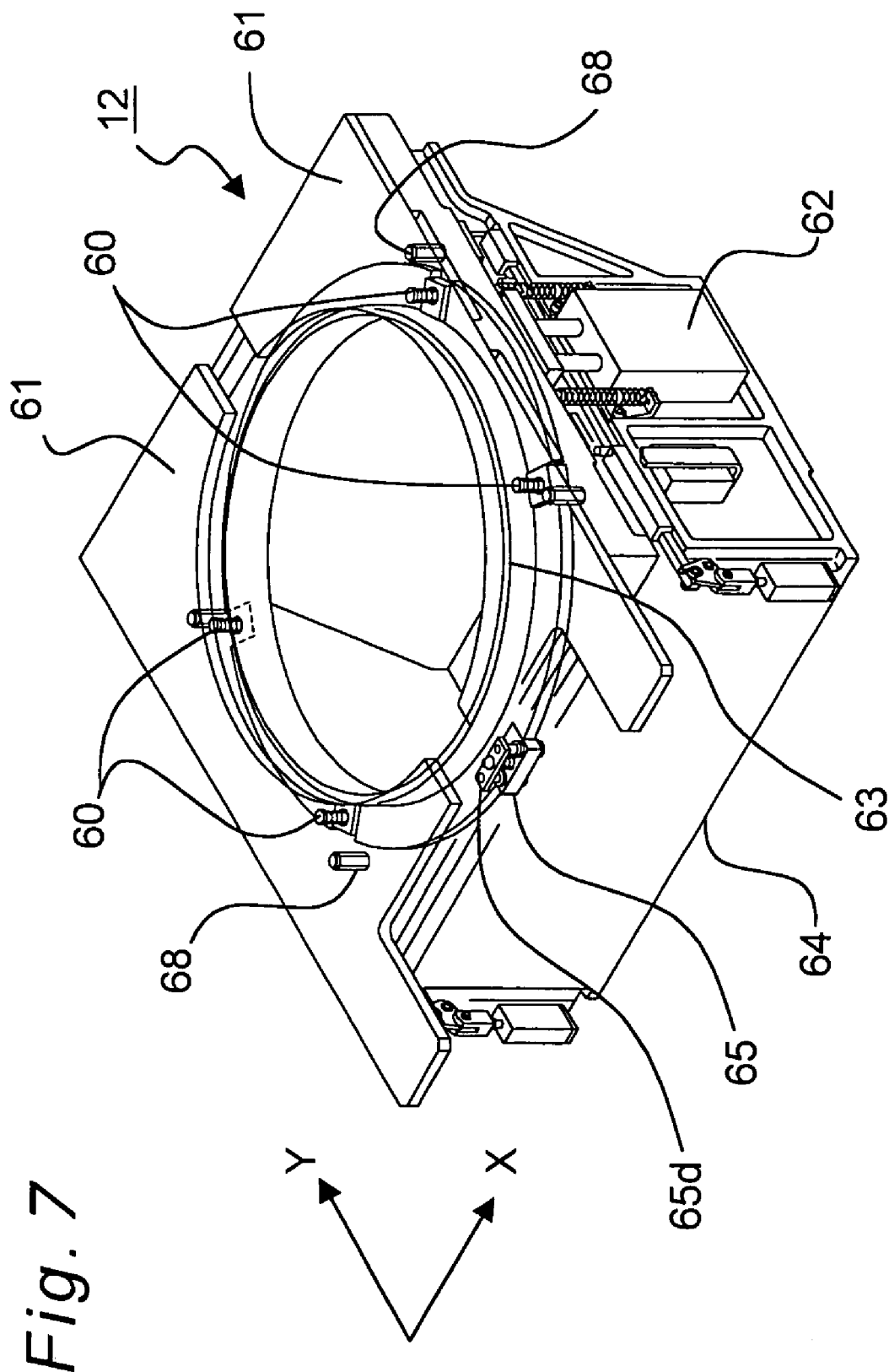
FIG. 7 is a perspective view of a plate placing device of the component feeder.

Next, FIG. 7 shows a half-transparent perspective view of the plate placing device 12. As shown in FIG. 7, the plate placing device 12 is provided with plate support portions 60 that serve as one example of a plurality of elastic support members of which the support height position is varied and that can support the placed plate 6 from the lower surface side in the vicinity of the outer peripheral portion of the plate; plate pressurizing members 61 for retaining the support position of the plate 6 supported by the plate support portions 60 by pressurizing the plate from the upper surface side in the vicinity of the outer peripheral portion so as to hold the plate 6 between the pressurizing members and the upper ends of the plate support portions 60; and pressurizing member elevating units 62 for performing elevating operation of the plate pressurizing members 61.

Moreover, as shown in FIG. 7, the plate pressurizing members 61 are constructed of a pair of tabular bodies that have symmetrical configurations and semicircular cut portions and are arranged so that the cut portions face each other in an identical plane. Moreover, since the semicircular cut portions are formed as described above, the plate pressurizing members 61 are able to pressurize only the upper surface of the wafer ring 9 of the wafer feeding plate 6*w* with their lower surfaces brought in contact with the upper surface and to pressurize only the upper surface of the tray ring 59 of the tray feeding plate 6*t* with their lower surfaces brought in contact with the upper surface. Moreover, the plate placing device 12 is provided with, for example, four plate support portions 60, and the plate support portions 60 are arranged below the portions of each plate pressurizing member 61, the portions pressurizing the wafer ring 9 or the tray ring 59. With this arrangement, the wafer ring 9 or the tray ring 59 can be supported on the lower surface side by the plate support portions 60. The plate support portions 60 are desirably arranged roughly at regular intervals along the outer periphery of the wafer ring 9 or the tray ring 59 placed on the upper portions thereof. Moreover, as shown in FIG. 7, the plate placing device 12 is provided with a taper support portion 65 of one example of another elastic support member, which has a tapered slant end portion at the end portion on the upper end side thereof on the left-hand side in the illustrated Y-axis direction in the vicinity of the circumference on which the plate support portions 60 are arranged and with which the edge portion of the plate 6 is brought in contact.

Further, the plate placing device 12 is provided with an expanding member 63 that has at its upper end, an annular contact portion capable of coming in contact with the lower surface of the wafer sheet 8 between the outer periphery of the wafer 7 and the inner periphery of the wafer ring 9 in the wafer feeding plate 6w in a state in which the wafer ring 9 is supported by the plate support portions 60, and a placement frame 64 for fixing and supporting the expanding member 63 on its upper surface. In the plate placing device 12, two pressurizing member elevating units 62 are provided attached to the placement frame 64 and attached to the side surfaces in the illustrated X-axis direction of the placement frame 64 in FIG. 7. The elevating operation of the plate pressurizing members 61 is integrally performed by the pressurizing member elevating units 62.

Figure 8:
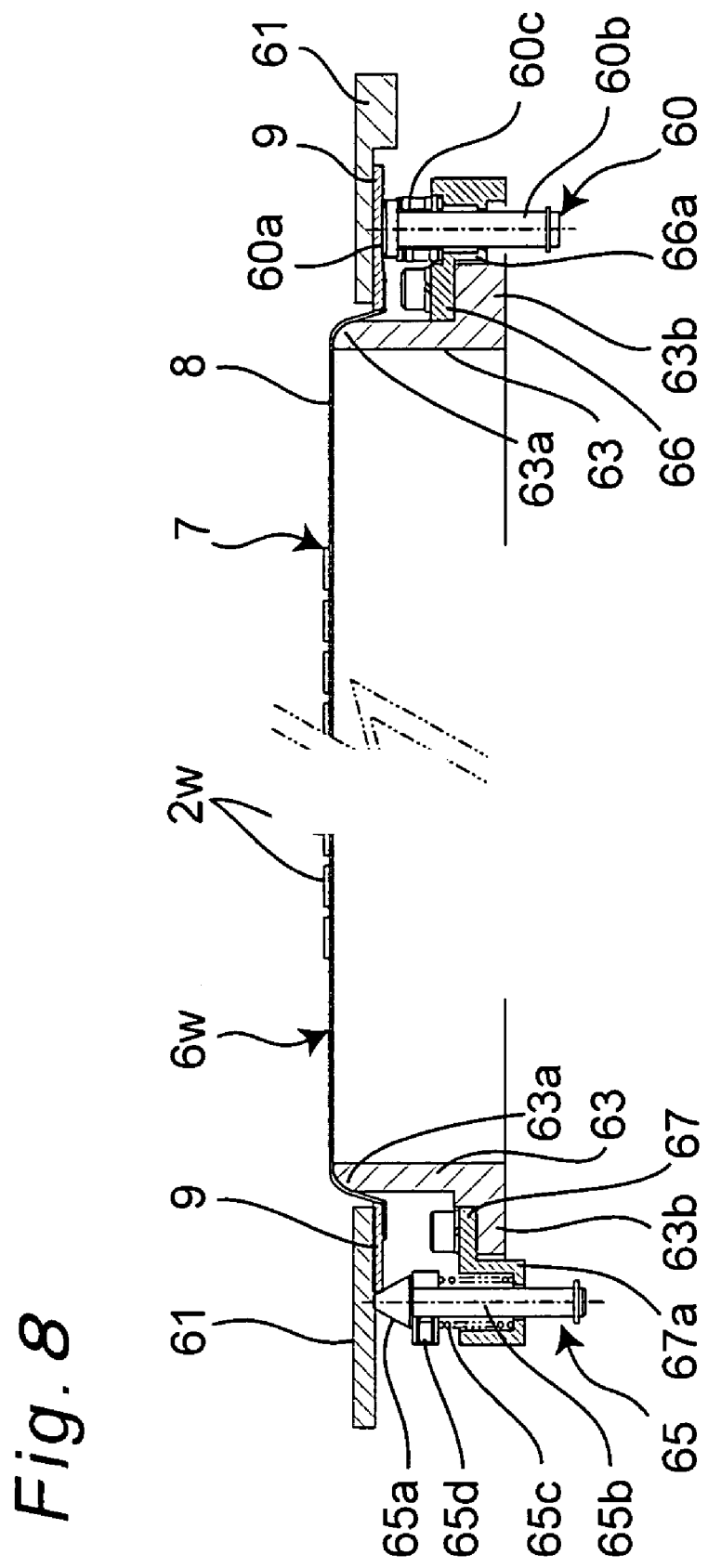
FIG. 8 is a sectional view of a state in which the wafer feeding plate is placed on the plate placing device.
Figure 9:
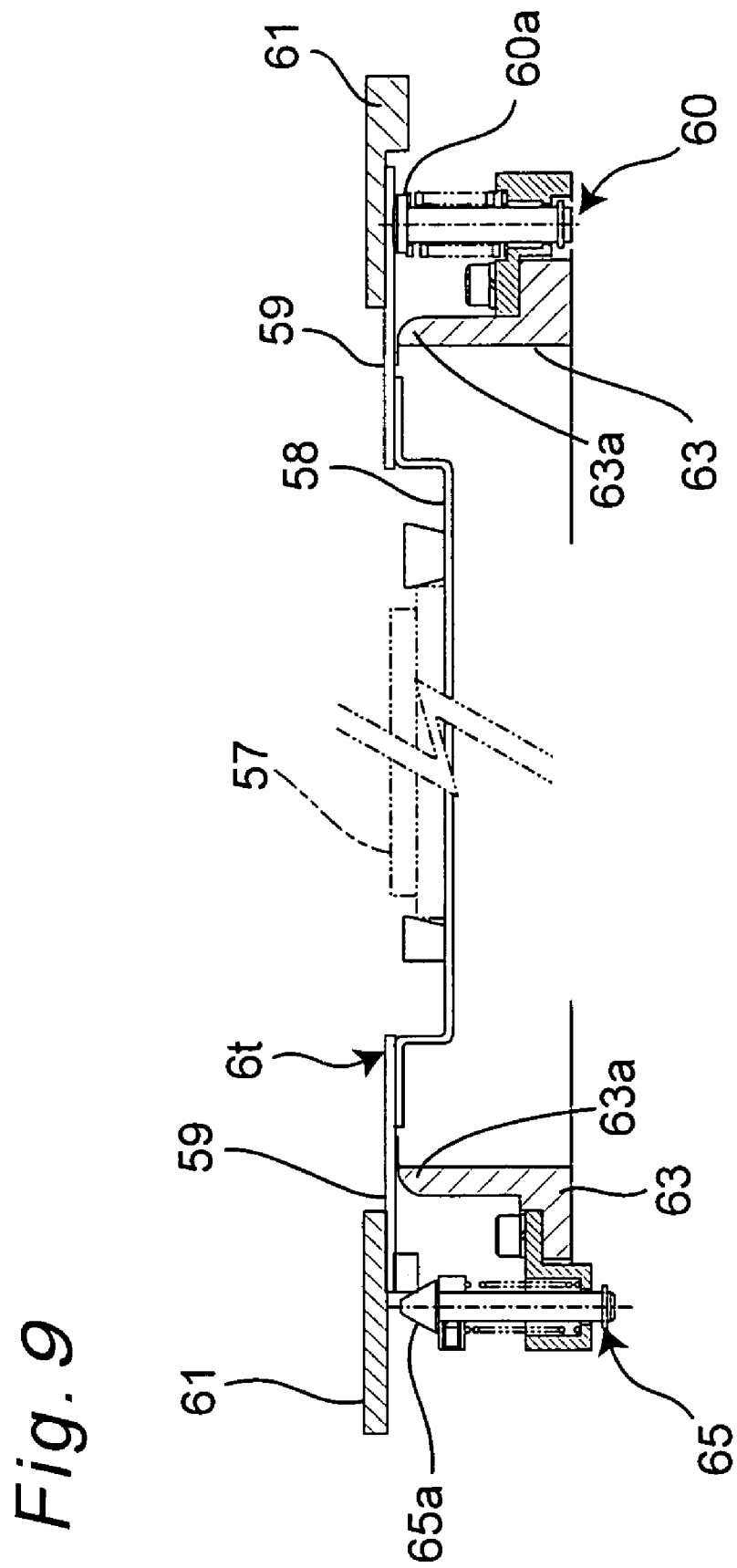
FIG. 9 is a sectional view of a state in which the tray feeding plate is placed on the plate placing device.

Next, FIG. 8 shows an enlarged sectional view of a portion where the wafer feeding plate 6w is placed on the plate placing device 12 of the above construction, and FIG. 9 shows an enlarged sectional view of a portion where the tray feeding plate 6t is placed.

First, as shown in FIG. 8, the expanding member 63, which has the annular configuration, has a lower portion provided with a flange portion 63b formed outwardly of the outer periphery, and the plate support portions 60 and the taper support portion 65 are elevatably attached to the flange portion 63b. The plate support portions 60 each include a shaft-shaped support pin 60b provided with a support end portion 60a that has a flat or gradually bumped configuration at its upper end portion, and an urging spring 60c that is placed around the support pin 60b so as to consistently urge the support pin 60b upward with respect to the flange portion 63b. It is noted that an upper limit position of the upward urging of the support pin 60b by the urging spring 60c is mechanically limited. Moreover, in FIG. 8, the plate support portions 60 are attached to the flange portion 63b of the expanding member 63 via an attachment member 66 and are able to guide the elevation of the elevating support pins 60b along the inner peripheral surfaces of pinhole portions 66a formed at the attachment member 66. Therefore, with an external force applied downwardly to the support end portions 60a, the urging springs 60c are contracted to lower the support pins 60b along the inner peripheral surfaces of the pinhole portions 66a. By weakening or releasing the external force, the contracted urging springs 60c are extended to move up the support pins 60b along the inner peripheral surfaces of the pinhole portions 66a.

Figure 58:
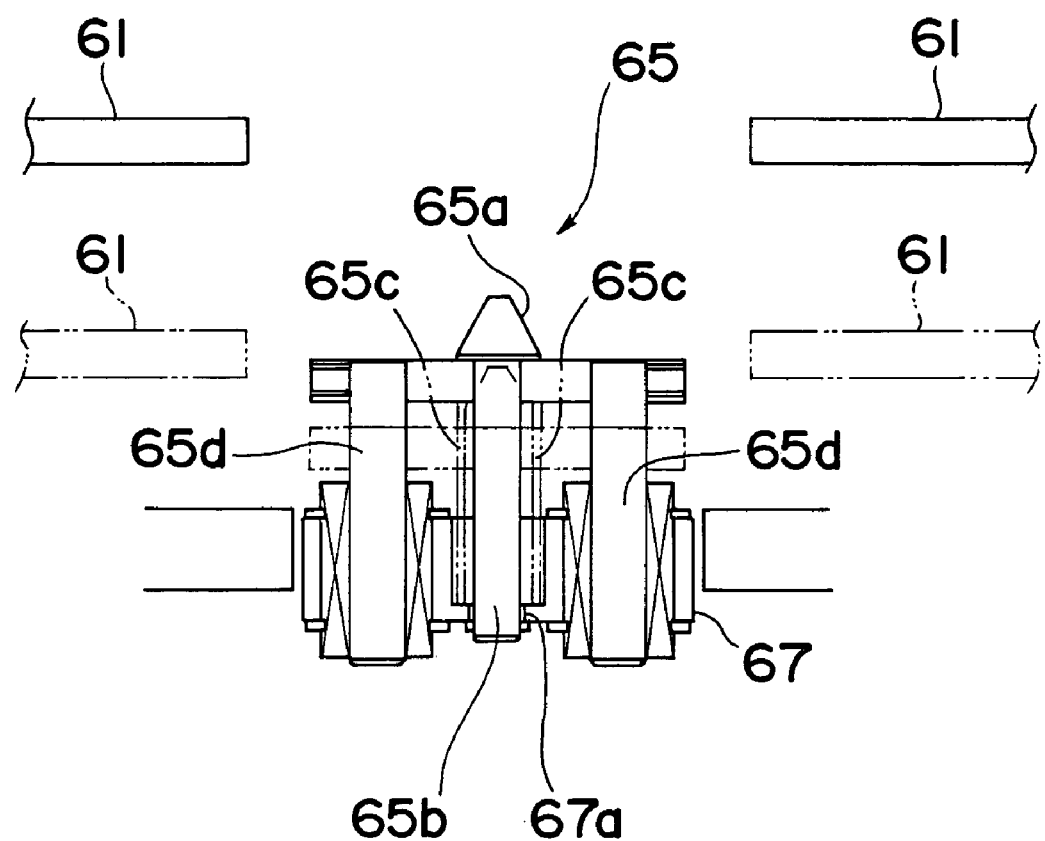
FIG. 58 is an enlarged side view of a taper support portion.

Moreover, the taper support portion 65 also has a mechanism based on an idea similar to that of each plate support portion 60 except for the configuration of its upper end portions and includes a support pin 65b, an urging spring 65c, an attachment member 67, and a pinhole portion 67a as shown in FIGS. 7, 8, and 58. Moreover, the upper end portion serves as a slant end portion 65a that has a tapered configuration. By bringing the outer peripheral edge portion of the wafer ring 9 in contact with the slant surface of the slant end portion 65a, the supporting position in the direction along the upper surface of the wafer ring 9 can be retained by utilizing the angular resistance. As shown in FIGS. 7, 8, and 58, the taper support portion 65 is provided with a guide portion 65d for guiding the elevation of the support pin 65b. Moreover, as shown in FIG. 8, the expanding member 63 has an annular end portion 63a formed at its upper portion, and the end portion 63a can be brought in contact with the lower surface of the wafer sheet 8 between the outer peripheral portion of the wafer 7 and the inner peripheral portion of the wafer ring 9.

In the above construction, by lowering the wafer ring 9 held and supported between the lower surfaces of the plate pressurizing members 61 and the plate support portions 60 by the lowering operation of the plate pressurizing members 61 by the pressurizing member elevating units 62, the wafer sheet 8 can be radially expanded with the descent of the wafer ring 9 using the contact position as a fulcrum while bringing the end portion 63a of the expanding member 63 in contact with the lower surface of the wafer sheet 8. By this operation, the positions where the wafer feed components 2w are arranged by adhesion on the upper surface of the wafer sheet 8 are also radially expanded, allowing the so-called expanding of the wafer 7 to be achieved. As shown in FIG. 7, a plurality of expansion lower limit stoppers 68 capable of regulating the lower limit position of the descent by being brought in contact with the lower surfaces of the lowered plate pressurizing members 61 are provided below the plate pressurizing members 61 on the upper surface of the placement frame 64. By thus regulating the lower limit position, the range of expansion of the wafer sheet 8 during the expanding can be regulated.

Next, FIG. 9 shows a state in which the tray feeding plate 6t is placed on the plate placing device 12 that has the above construction. As shown in FIG. 9, the tray feeding plate 6t is supported so as to interpose the tray ring 59 between the plate pressurizing members 61 and the support end portions 60a of the plate support portions 60. Moreover, by bringing the outer peripheral edge portion of the tray ring 59 in contact with the slant surface of the end portion 65a of the taper support portion 65, the support position of the tray ring 59 in the direction along its surface is held by the angular resistance. Moreover, the tray placing part 58 positioned in the height position one step lower than the tray ring 59 is located inside the annular expanding member 63. Further, a gap such that the end portion 63a of the expanding member 63 and the lower surface of the tray ring 59 positioned above the expanding member 63 do not come in contact with each other is secured in a state in which the tray feeding plate 6t is held. With this arrangement, the end portion 63a can be prevented from being damaged by bringing the end portion 63a in contact with the tray ring 59. Moreover, the space as described above is secured by regulating by another member the position where the plate pressurizing members 61 are lowered. The regulation method is described with reference to a partially enlarged perspective view of the plate placing device 12 shown in FIG. 10.

Figure 10:
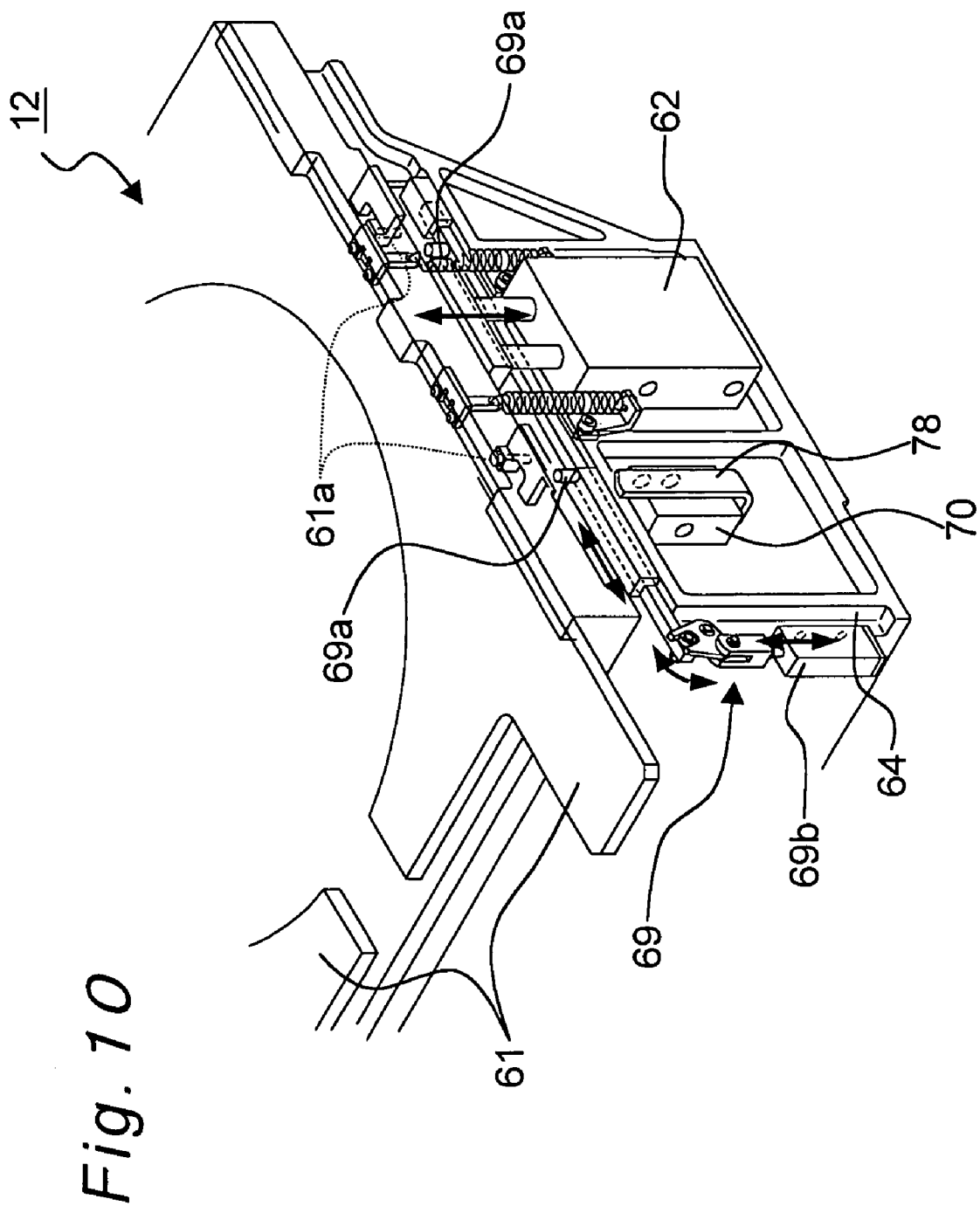
FIG. 10 is a partially enlarged perspective view of the plate placing device.
Figure 11:
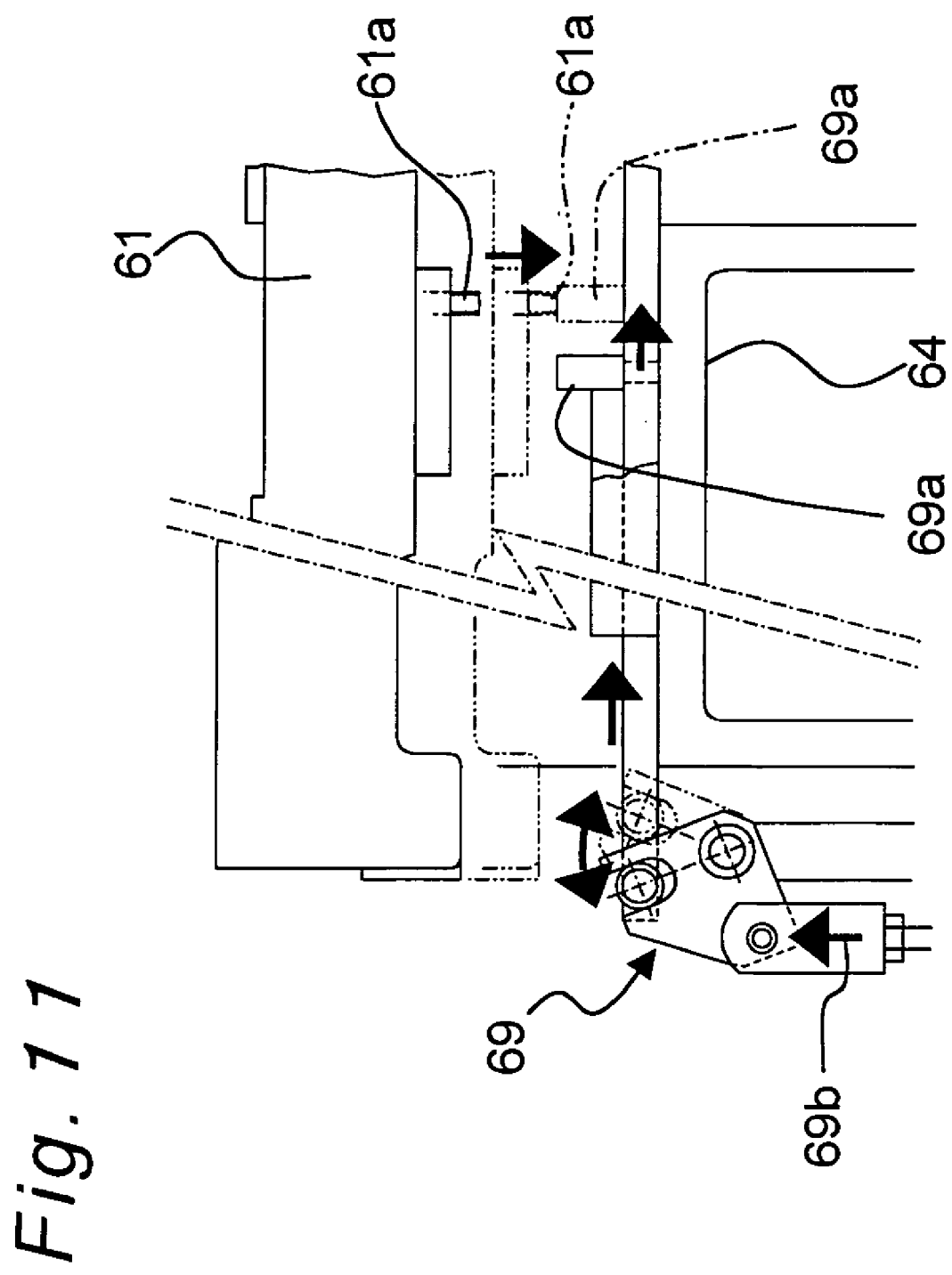
FIG. 11 is a schematic explanatory view of an intermediate stopper driving unit of the plate placing device.

As shown in FIG. 10, an intermediate stopper driving unit 69 of one example of the regulation part for regulating the position where the plate pressurizing members 61 are lowered is provided in the vicinity of the end portion on the front side in the figure on the upper surface of the placement frame 64 of the plate placing device 12. The intermediate stopper driving unit 69 is provided with intermediate stoppers 69a of one example of the contact portion located in the vicinity of the end portion on the left-hand side in the figure of the upper surface of the placement frame 64, and a stopper moving unit 69b of one example of the contact portion moving mechanism for moving the intermediate stoppers 69a along the end portion. The stopper moving unit 69b is constructed of a cylinder that can be driven in the vertical direction by, for example, supplying and discharging compressed air and a link mechanism that is attached to the cylinder and mechanically transmits the driving of the cylinder to the intermediate stoppers 69a. FIG. 11 shows a schematic explanatory view for explaining the operation of the intermediate stopper driving unit 69.

As shown in FIG. 11, regulation pins 61a are provided below the plate pressurizing member 61. The regulation pins 61a are placed so as to be able to come in contact with the upper ends of the intermediate stoppers 69a at the lower end of the plate pressurizing member 61 by lowering the plate pressurizing member 61. On the other hand, the stopper moving unit 69b can move the intermediate stoppers 69a forward and backward along the upper surface of the placement frame 64 between a contact position, which is a position located below the regulation pins 61a and in which the intermediate stoppers 69a can come in contact with the regulation pins 61a, and a retreat position in which the intermediate stoppers 69a can avoid coming in contact with the regulation pins 61a even when the regulation pins 61a are lowered. Therefore, by lowering the plate pressurizing members 61 in a state in which the intermediate stoppers 69a are positioned in the retreat position, the state of the wafer feeding plate 6w shown in FIG. 8 can be achieved. Moreover, by lowering the plate pressurizing members 61 in a state in which the intermediate stoppers 69a are positioned in the contact position, the state of the tray feeding plate 6t shown in FIG. 9 can be achieved by bringing the intermediate stoppers 69a in contact with the regulation pins 61a and regulating the position where the plate pressurizing members 61 are lowered. That is, as shown in FIG. 9, the aforementioned space is secured between the tray ring 59 and the end portion 63a of the expanding member 63 in a state in which the intermediate stoppers 69a are brought in contact with the regulation pins 61a. It is noted that the intermediate stopper driving units 69 are individually provided so as to be able to regulate the lower limit position during lowering the respective plate pressurizing members 61, and the intermediate stopper driving units 69 are driven synchronized with each other, in the plate placing device 12.

Figure 13:
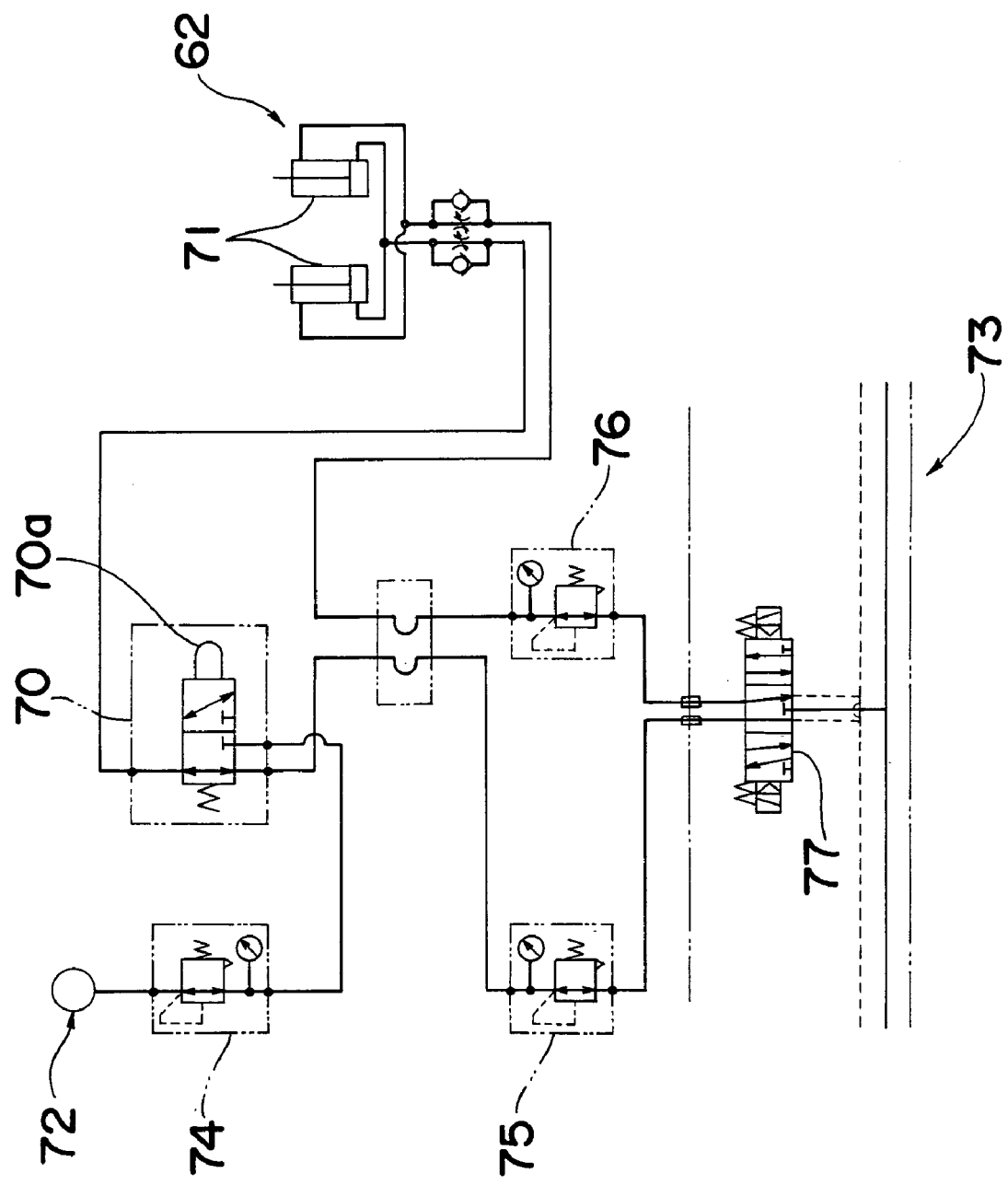
FIG. 13 is a pneumatic circuit diagram of a pressurizing member elevating unit of the plate placing device.

FIG. 13 shows a pneumatic circuit diagram of the pressurizing member elevating unit 62. As shown in FIG. 13, the pressurizing member elevating unit 62 includes a plurality of cylinder portions 71 that can be driven by the supply and discharge of compressed air and that are able to selectively perform ascending or descending operation by making air supplied from an elevation compressed air supply line 73 of one example of the elevation compressed air supply part selectively pass through an ascent regulator 75 or a descent regulator 76 by a solenoid valve 77 and supplying the air to the cylinder portions 71.

On the other hand, in the elevating mechanism that uses the compressed air, it is an issue how to perform the emergency stop to assure safety. In general, the measures of stopping the supply of the compressed air from the elevation compressed air supply line 73 and discharging all the compressed air in the cylinder portions 71 in the case of emergency stop are taken. By adopting the above measures, there is an advantage that the plate pressurizing members 61 can be prevented from abruptly moving up when the plate pressurizing members 61 are lowered downside. However, when the above measures are taken when the plate pressurizing members 61 are located in the upper position, the plate pressurizing members 61 disadvantageously move downward as the result of performing the emergency stop when the measures are taken. This might cause an issue that the pressurizing members 61 disadvantageously faultily pinch the thing located below the pressurizing members such as the operator's hand, or the plate 6 or the like conveyed partway by movement error, or the like, and this is very dangerous.

Therefore, the present embodiment adopts a construction in which the positions of the plate pressurizing members 61 located in the upper position can be retained without lowering the plate pressurizing members 61 by emergency stop. In concrete, the compressed air is supplied from the elevation compressed air line 73 to the cylinder portions 71 through the ascent regulator 75 by employing a mechanical lock valve 70 of one example of the compressed air selection valve and mechanically turning on a switch portion 70a of the mechanical lock valve 70. Moreover, another compressed air of a pressure lower than that of the elevation compressed air is supplied from a retention compressed air line 72 to the cylinder portions 71 through a retention regulator 74. The pressure of the retention compressed air is a pressure that can retain the elevation position of the plate pressurizing members 61 and cannot move up the plate pressurizing members 61. Moreover, the retention regulator 74 serves as one example of the retention compressed air supplying part.

Figure 12:
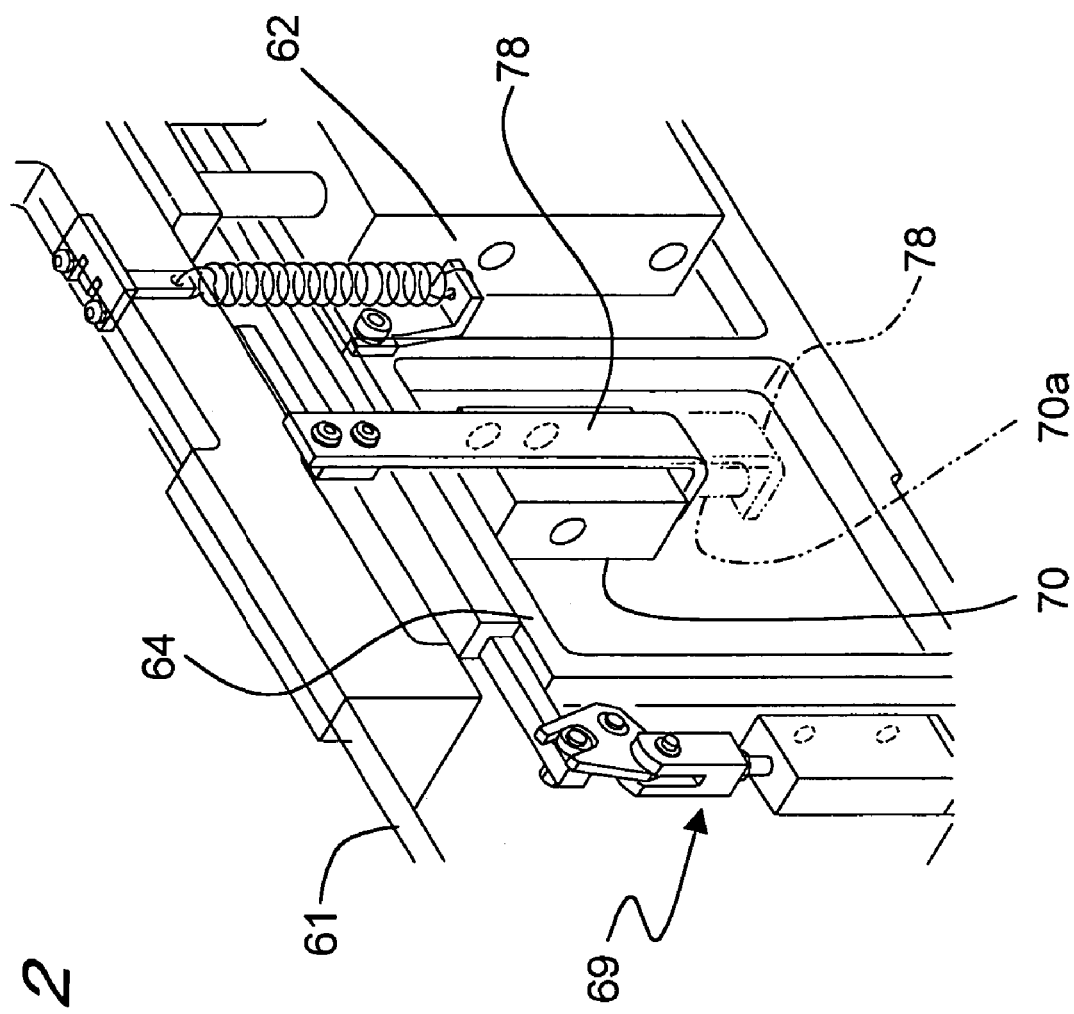
FIG. 12 is a perspective view showing a state in which a mechanical lock valve is attached to the plate placing device.

As shown in FIG. 10 and FIG. 12 that is a partially enlarged perspective view of FIG. 10, the mechanical lock valve 70 is fixed to the placement frame 64 with its switch portion 70a facing down, and a contact bar 78 that has a contact portion capable of pressurizing the switch portion 70a is attached to the plate pressurizing member 61. Moreover, the contact portion of the contact bar 78 pressurizes the switch portion 70a to turn on the switch portion 70a when the plate pressurizing member 61 is located in the upper position within the range of elevation thereof, and the contact portion of the contact bar 78 is not brought in contact with the switch portion 70a, leaving the switch portion 70a turned off, when the plate pressurizing member is located in the lower position within the range of elevation thereof. With the above arrangement, when the plate pressurizing member 61 is located in the upper position (e.g., upper limit position) within the range of elevation thereof, the retention compressed air is supplied from the retention compressed air line 72 to the cylinder portions 71 through the retention regulator 74 and the mechanical lock valve 70 in FIG. 13. On the other hand, when the plate pressurizing member 61 is located in the lower position (e.g., position other than the upper limit position) within the range of elevation thereof, the elevation compressed air is supplied from the elevation compressed air line 73 selectively through the ascent regulator 75 or the descent regulator 76 by the solenoid valve 77.

Figure 14:
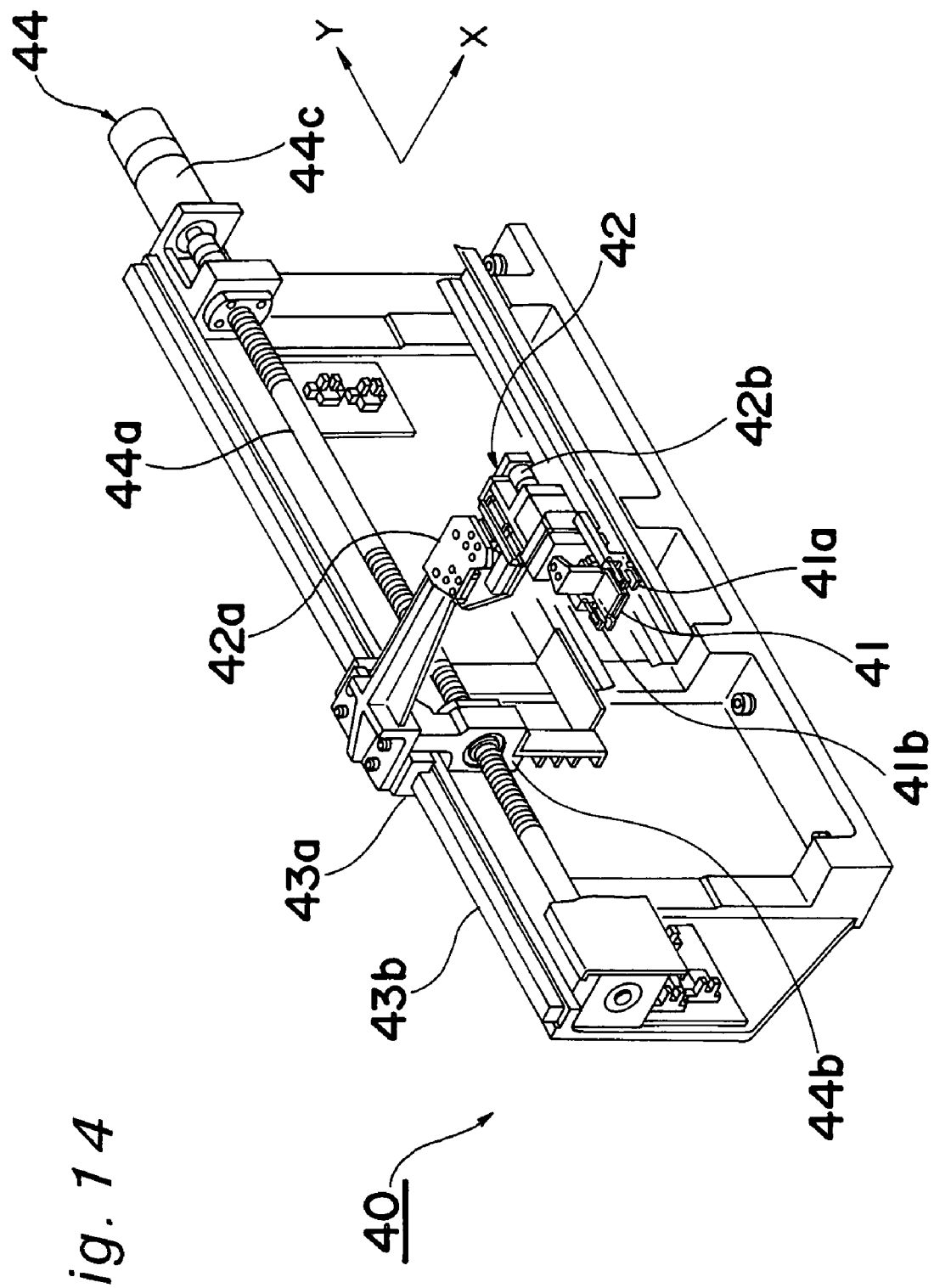
FIG. 14 is a perspective view of a plate moving device of the component feeder.

Next, FIG. 14 shows a perspective view of the plate moving device 40. As shown in FIG. 14, a chuck part 41 of one example of the holding part for releasably holding the plate 6, an arm mechanism 42 that has a roughly L-figured configuration in plane and to the end of which the chuck part 41 is attached, and a moving unit 44 of one example of the holding part moving unit for moving the arm mechanism 42 forward and backward in the illustrated Y-axis direction are provided. The moving unit 44 is provided with a ballscrew shaft 44a that extends in the illustrated Y-axis direction, a nut 44b meshed with the ballscrew shaft 44a, and a movement motor 44c that is fixed to one end of the ballscrew shaft, for moving the nut 44b forward and backward in the illustrated Y-axis direction by rotating the ballscrew shaft 44a around its axis. Moreover, the end portion of the arm mechanism 42 on the side to which the chuck part is not attached is fixed to an LM block 43a. The LM block 43a is able to guide the movement of the arm mechanism 42 along an LM rail 43b that extends in the illustrated Y-axis direction, and by moving the LM block 43a fixed to the nut 44b together with the nut 44b, the movement of the arm mechanism 42 is possible.

Moreover, as shown in FIG. 14, a plate identifying sensor 41b of one example of the plate identifying part, which is located adjacent to the chuck part 41, for identifying whether the held plate 6 is the wafer feeding plate 6w or the tray feeding plate 6t on the basis of the configuration of the end portion of the plate 6, is attached to the arm mechanism 42. The plate identifying sensor 41b identifies the plate 6 by discriminating the presence or absence of the identification hole 56 that is not formed at the wafer ring 9 of FIG. 4 but formed at the tray ring 59 of FIG. 5 by means of a transmission type sensor. Moreover, a plate existence detection sensor 41a for detecting whether the chuck part 41 is holding the plate 6, is attached to the arm mechanism 42 on the side opposite to the plate identifying sensor 41b with interposition of the chuck part 41. The plate existence detection sensor 41a detects the presence or absence of the plate 6 by means of a transmission type sensor depending on whether shielding of light of the sensor is detected at the end portion of the wafer ring 9 or the tray ring 59. It is noted that the movement positions of the intermediate stoppers 69a in the plate placing device 12 by the intermediate stopper driving units 69 are determined on the basis of the identification result of the plate identifying sensor 41b.

Moreover, as shown in FIG. 14, the arm mechanism 42 has an X-axis direction centering portion 42a that automatically perform the centering of the position in the X-axis direction while mechanically settling shake in the illustrated X-axis direction in the chuck part 41. It is noted that the centering mechanism is not limited to one that performs the centering in the illustrated X-axis direction but allowed to be one that performs the centering in the illustrated Y-axis direction. Further, the arm mechanism 42 is provided with a collision detection sensor 42b capable of detecting the interference (collision) of the arm mechanism 42 with another constituent member and is located on the rear side in the illustrated Y-axis direction. When the collision is detected by the collision sensor 42b, the movement of the moving unit 44 is stopped to prevent the device failure and the damage and so on of each held electronic component 2 due to the collision.

Next, a placing method of each component feeding tray 57 on the tray feeding plate 6t is described next. Moreover, FIG. 15 shows a partially enlarged perspective view of the tray placing part 58, and FIG. 16 shows a schematic explanatory view of the cross section of the tray placing part 58.

Figure 15:
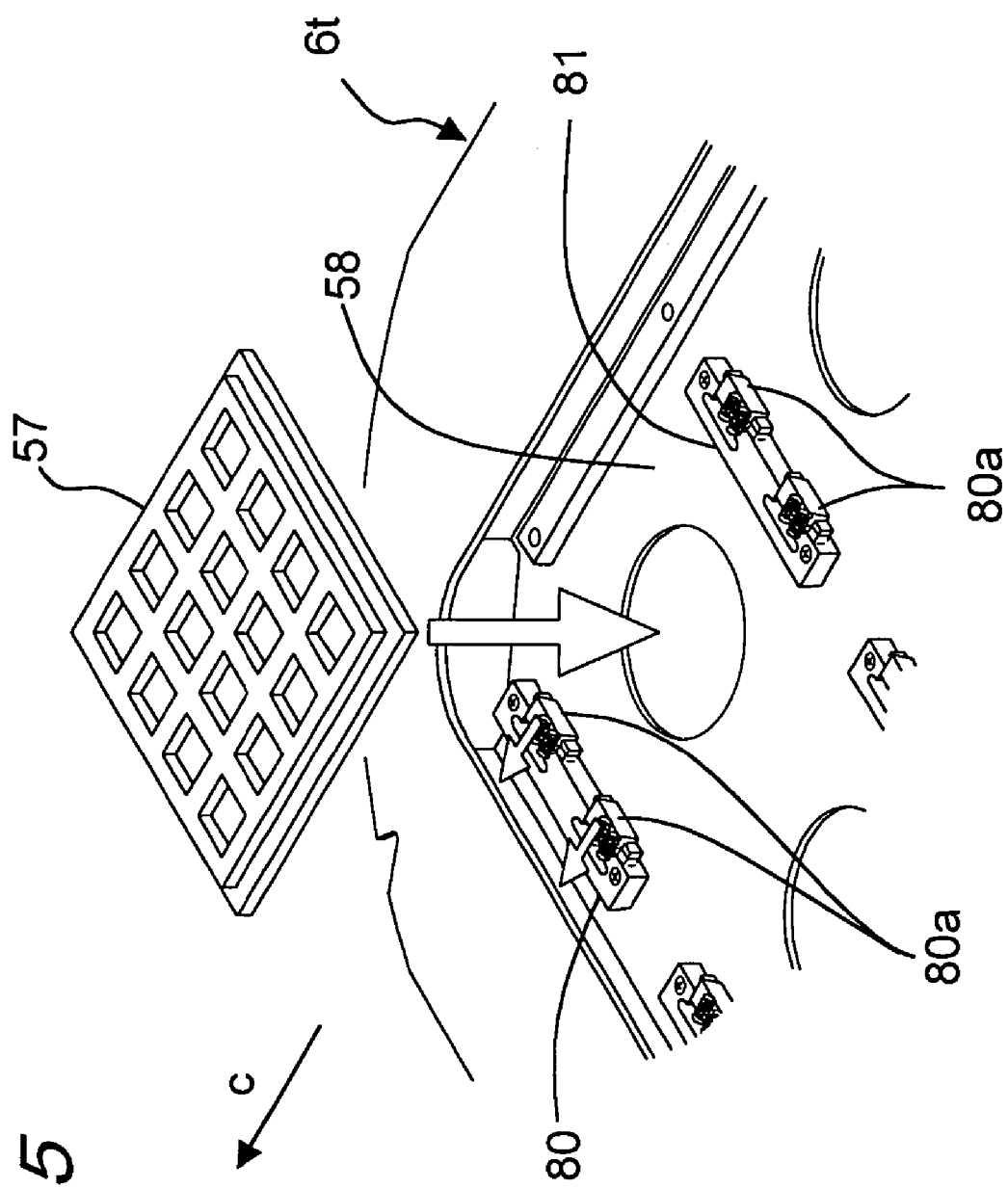
FIG. 15 is a partially enlarged perspective view of the tray feeding plate.

As shown in FIG. 15, two holding members, which are arranged mutually parallel along a direction perpendicular to the plate discharge direction C and able to retain the arrangement position so as to hold the component feeding tray 57 by being brought in contact with the mutually opposed end portions of the component feeding tray 57, are attached to the tray placing part 58. Moreover, the holding member arranged on the plate discharge direction-C-side among the two holding members serves as a slide-side holding member 80 (one example of the movable-side holding member) provided with two individually slidable slide portions 80a so as to urge the component feeding tray 57 against the contact side end portion to the component feeding tray 57. The other holding member serves as a fixed-side holding member 81 for fixing the position where the component feeding tray 57 is placed at the contact side end portions of the component feeding tray 57. With this arrangement, it is possible to insert the component feeding tray 57 from above the tray placing part 58 so as to slide the slide portions 80a of the slide-side holding member 80 in the plate discharge direction C, and place the component feeding tray 57 in the tray placing part 58 by holding the tray 57 between the slide-side holding member 80 and the fixed-side holding member 81. As shown in FIG. 16, the contact portions of the slide-side holding member 80 and the fixed-side holding member 81 to the end portion of the component feeding tray 57 are inclined so as to oppose to each other, and the inclination prevents the component feeding tray 57 from jumping out of the tray placing part 58. In FIG. 15, a total of four component feeding trays 57 are arranged in two rows and placed in the tray placing part 58. Therefore, by providing the slide portions 80a of the slide-side holding member 80 at the end portions opposite from the contact side end portion of the fixed-side holding member 81 brought in contact with the component feeding tray 57, the function of the slide-side holding member 80 for another component feeding tray 57 (not shown) that is placed adjacently to the component feeding tray 57 in the plate discharge direction C is concurrently possessed. Moreover, instead of the case where the slide portions 80a are individually slidably provided for the slide-side holding member 80, it may be a case where a slide portion 80b that has two contact portions is provided integrated as shown in FIG. 17. Moreover, it may be a case where a locking mechanism that can lock the slide operation of the slide portions 80a provided for the slide-side holding member 80 is provided.

Moreover, it is sometimes the case where a component feeding tray 57 on which very small components 2 are arranged is placed on the tray feeding plate 6t. Particularly, it can be considered the case where such very small components 2 disadvantageously jumps out of the component feeding tray 57 even when only minute vibrations are applied to the component feeding tray 57, and attention must be paid to the placing work of the component feeding tray 57 on the tray feeding plate 6t.

Figure 16:
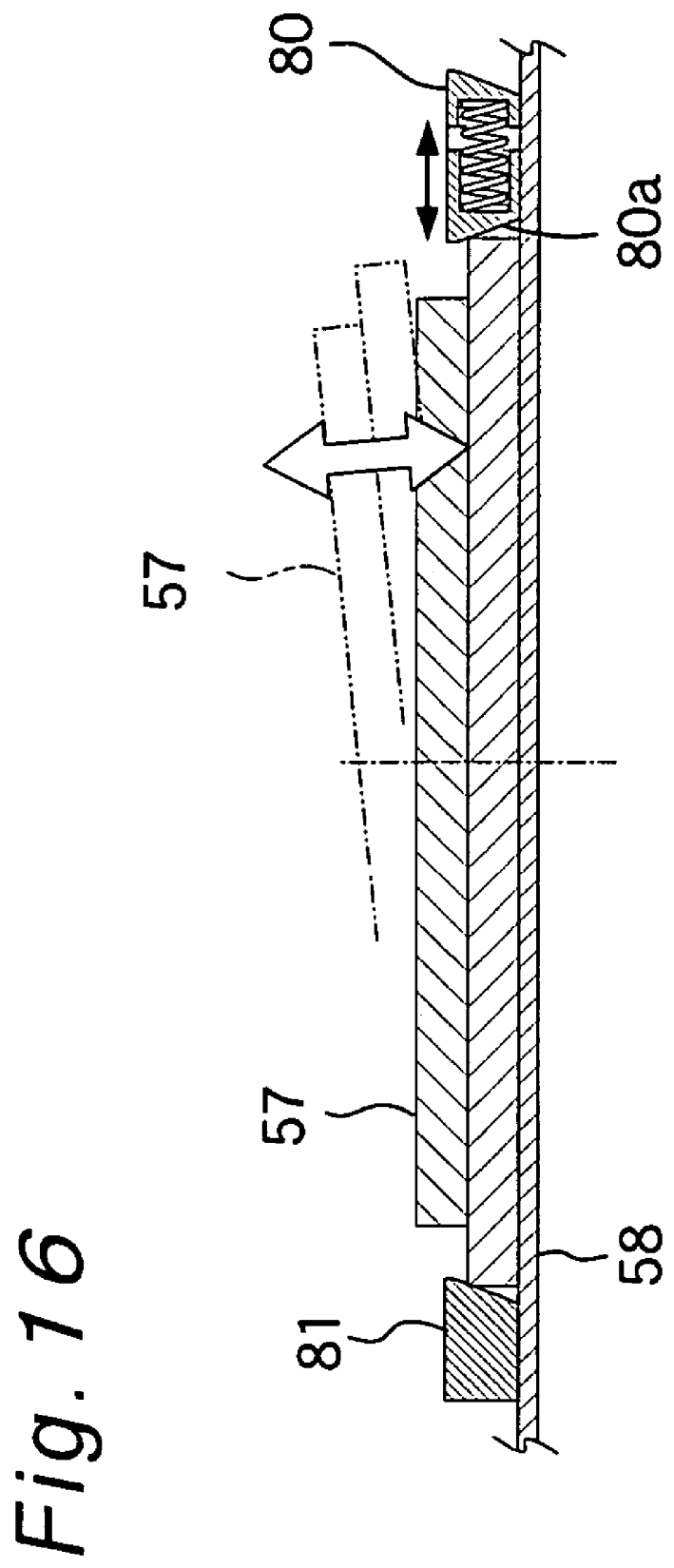
FIG. 16 is a schematic sectional view of the tray feeding plate.
Figure 17:
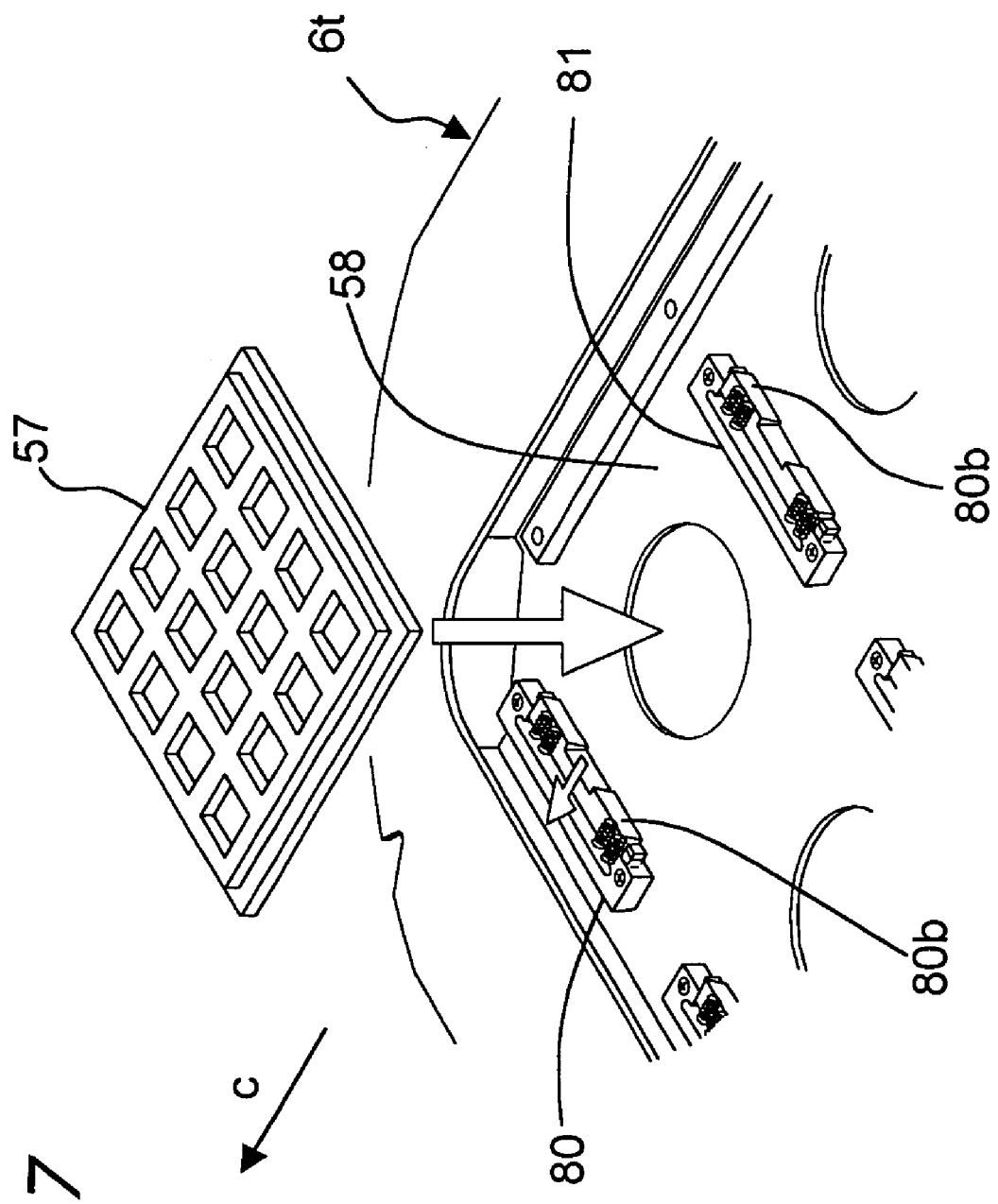
FIG. 17 is a partially enlarged perspective view of the tray feeding plate.

Particularly, according to the placing method of the component feeding tray 57 as shown in FIG. 16, a work using both hands by an operator who slides the slide side holding member 80 by one hand while holding the component feeding tray 57 by the other hand is necessary, and the working state becomes unstable, possibly disadvantageously giving vibrations to the component feeding tray 57.

Figure 57:
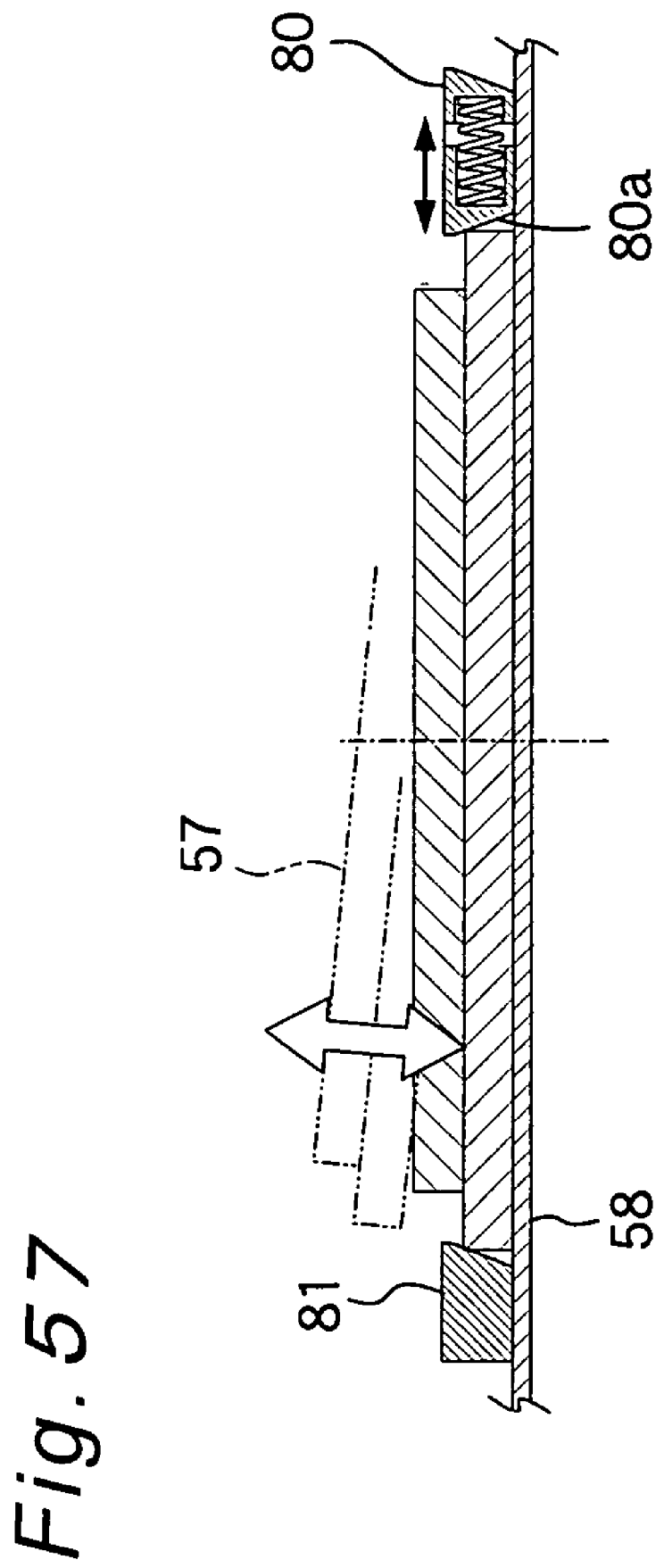
FIG. 57 shows a modification example of the work of attaching the component feeding tray to the tray feeding plate of FIG. 16.

Therefore, the placing work can be performed in a further stabilized state when the operator places the component feeding tray 57 by sliding the slide-side holding member 80 by the end portion of the component feeding tray 57 while holding the component feeding tray 57 by one hand or both hands as shown in FIG. 57.

Figure 39:
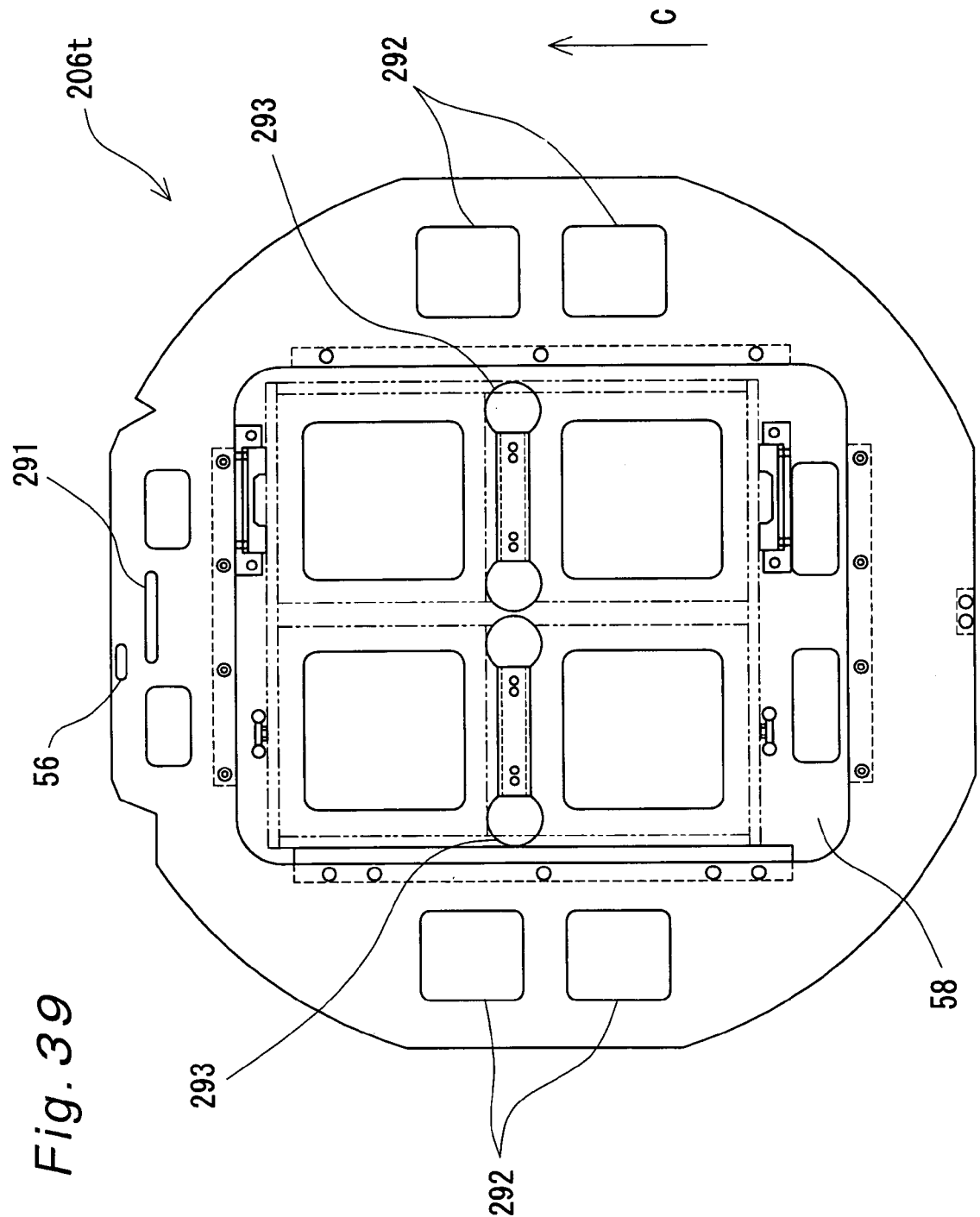
FIG. 39 is a plan view of a tray feeding plate provided with an elongated hole portion.

It is possible to consider a case where the operator is required to hold the tray feeding plate 6t by the other hand. Therefore, it is possible to form a plurality of holding holes 293 into which the fingers of the operator can comfortably enter in the vicinity of the center portion like a tray feeding plate 206t as shown in FIG. 39. In the above case, more secure holding can be achieved, and the very small components can reliably be prevented from jumping out.

(Concerning Operation of Component Feeder)

Operation from discharging of each plate 6 from the magazine cassette 50 in the component feeder 4 that has the above construction to placing of the plate 6 on the plate placing device 12 while allowing the electronic components 2 to be taken out is described next.

First of all, in FIG. 2, the magazine cassette 50 is moved up or down by the cassette elevating unit 51 of the lifter unit 10, and the plate 6 to be discharged from the magazine cassette 50 is located in the height position of the chuck part 41 of the plate moving device 40. Together with the operation, the plate pressurizing members 61 are moved up and stopped to the upper limit positions of the elevation by the pressurizing member elevating unit 62 in the plate placing device 12. At this time, the switch portion 70a of the mechanical lock valve 70 is pressurized by the contact bar 78 to turn on the switch portion 70a, and the retention compressed air is supplied to the cylinder portions 71 of the pressurizing member elevating units 62 to retain the elevation positions of the plate pressurizing members 61 in the upper limit position of elevation.

Next, the arm mechanism 42 is moved leftward in the illustrated Y-axis direction of FIG. 2 by the moving unit 44 of the plate moving device 40, and the chuck part 41 is moved into the magazine cassette 50. Subsequently, when the neighborhood of the outer peripheral edge portion of the plate 6 to be discharged from the magazine cassette 50 is detected by the plate existence discrimination detection sensor 41a provided adjacent to the chuck part 41, the neighborhood of the outer peripheral portion is held by the chuck part 41. Together with the operation, it is discriminated whether the held plate 6 is the wafer feeding plate 6w or the tray feeding plate 6t by the plate identifying sensor 41b provided adjacent to the chuck part 41. Subsequently, the rightward movement of the arm mechanism 42 in the illustrated Y-axis direction by the moving unit 44 is started, and the held plate 6 is moved and discharged along the groove portions 50b of the magazine cassette 50.

Subsequently, the plate 6 held by the chuck part 41 is moved so as to pass through a space between the plate pressurizing members 61 and the plate support portions 60 of the plate placing device 12 and be positioned in a position where the plate 6 can be held by the plate support portions 60, and thereafter stopped. Subsequently, the plate pressurizing members 61 are lowered by the pressurizing member elevating unit 62 to depress the upper surface of the outer peripheral portion of the plate 6 and bring the lower surface of the outer peripheral portion in contact with the upper ends of the plate support portions 60, so that the plate 6 is held between the plate pressurizing members 61 and the plate support portions 60. Together with the operation, the holding of the plate by the chuck part 41 is released, and the arm mechanism 42 is moved rightward in the illustrated Y-axis direction of FIG. 2 by the moving unit 44 and stopped in a position where the interference in the planar positions between the chuck part 41 and the plate 6 is removed.

On the other hand, upon receiving the identification result of the type of the plate 6 by the plate identifying sensor 41b, the movement positions of the intermediate stoppers 69a are determined by the intermediate stopper driving unit 69. First, when the plate 6 is the wafer feeding plate 6w, the intermediate stoppers 69a are moved to the retreat positions, avoiding the contact between the regulation pins 61a and the intermediate stoppers 69a. Subsequently, the plate pressurizing members 61 are further lowered to depress the plate support portions 60, and the wafer sheet 8 is expanded with the end portion 63a of the expanding member 63 used as a fulcrum to perform the expanding. It is noted that the plate pressurizing members 61, which are descending, are brought in contact with the expansion lower limit stoppers 68 to regulate the lower limit position during the descent, and the descent of the plate pressurizing members 61 is stopped in the above state. In the above state, the wafer feed components 2w can be taken out of and fed from the wafer feeding plate 6w. By pushing up each wafer feed component 2w from below the wafer sheet 8 and holding and taking out the raised wafer feed component 2w by means of the inverting head unit 14, each wafer feed component 2w is taken out.

On the other hand, when the plate 6 is the tray feeding plate 6t, the intermediate stoppers 69a are moved to the contact positions, allowing the regulation pins 61a and the intermediate stoppers 69a to be brought in contact with each other. Subsequently, the plate pressurizing members 61 are further lowered to depress the plate support portions 60, while the regulation pins 61 and the intermediate stoppers 69a are brought in contact with each other, regulating the descent position of the plate pressurizing members 61. In this state, as shown in FIG. 9, a state in which a gap for preventing mutual contact is secured between the lower surface of the tray ring 59 and the end portion 63a of the expanding member 63. Moreover, in the above state, the descent of the plate pressurizing members 61 is stopped, allowing each tray feed component 2t to be taken out of the tray feeding plate 6t. In the above state, each tray feed component 2t is held and taken out of the component feeding tray 57 placed in the tray placing part 58 by the inverting head unit 14.

As described above, after the electronic components 2 are taken out of the wafer feeding plate 6w or the tray feeding plate 6t, the plate 6 is moved to and received in the magazine cassette 50 by the plate moving device 40 according to a procedure reverse to the aforementioned procedure.

A construction for assuring satisfactory maintenanceability of the component feeder 4 is described next.

First, the jump preventing plate of each plate 6, which is received in the magazine cassette 50 of the lifter unit 10, from the magazine cassette 50 is described. The electronic component mounting apparatus 101 shown in FIG. 1 is in a state in which the jump preventing plate of the conventional construction is attached to the lifter unit 10.

Figure 18:
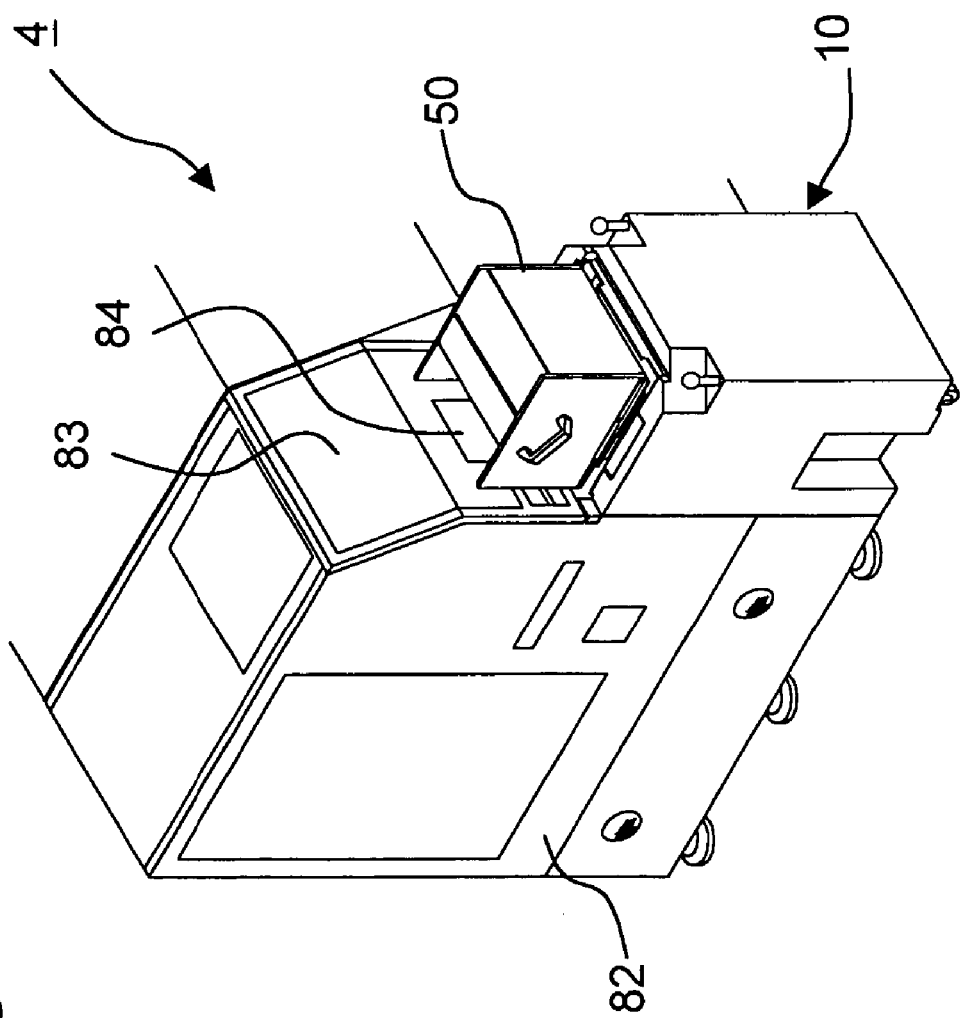
FIG. 18 is a perspective view of the component feeder.
Figure 19:
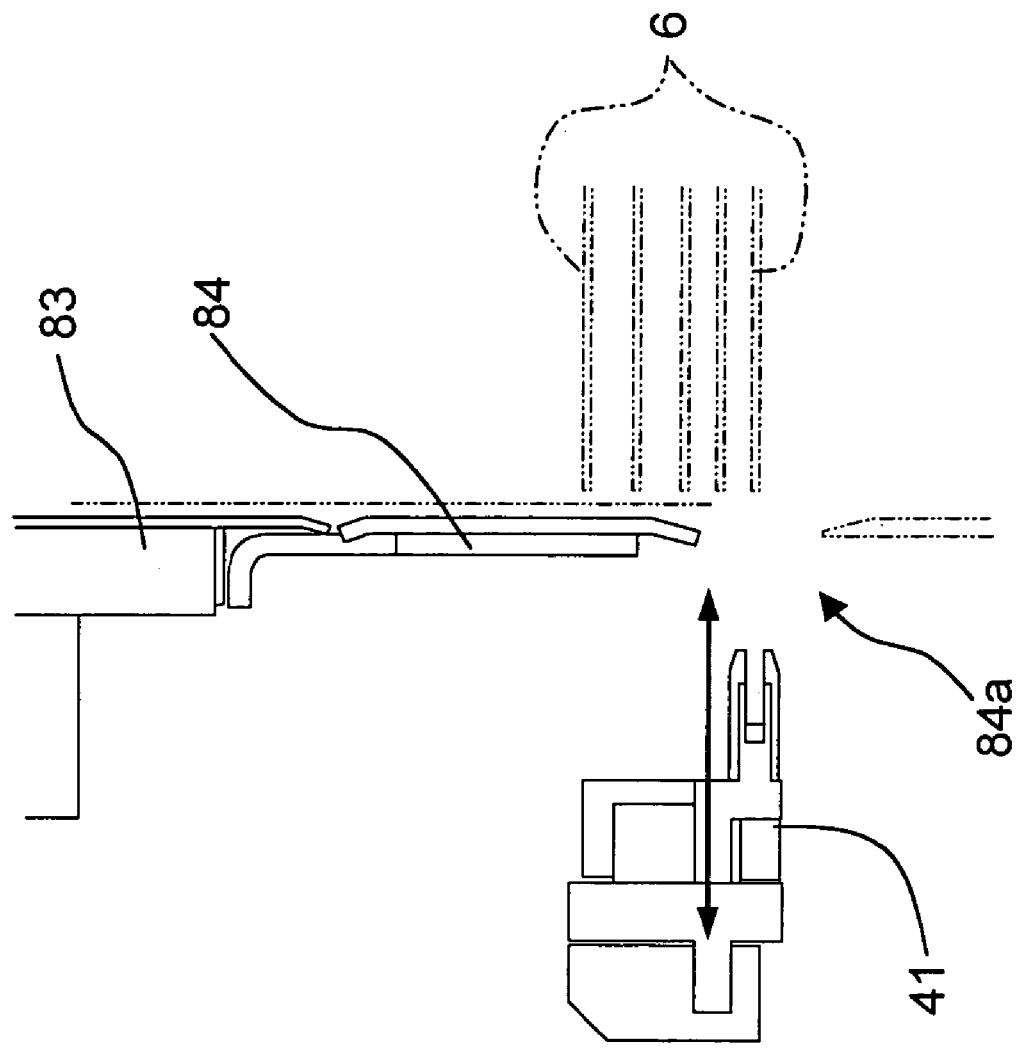
FIG. 19 is a side view of a jump preventing plate of the component feeding part.

As shown in FIG. 18, the component feeder 4 is divided roughly into the movable lifter unit 10 and other parts, and the other parts are covered with the casing 82. Moreover, a cover 83, which can be opened and closed in a flip-up style, is provided on the lifter unit-10-side of the casing 82. A jump preventing plate 84 (also one example of the plate regulation part) is attached to a lower portion of the cover 83. FIG. 19 shows an explanatory view of the schematic cross section of the neighborhood of the cover 83. As shown in FIG. 19, the jump preventing plate 84 is provided on the front surface located on the left-hand side in the figure of the magazine cassette 50 so that the plates 6 except for one plate 6 that is to be received and discharged in the magazine cassette 50 do not jump out with the cover 83 closed. Moreover, a plate outlet portion 84a is provided below the jump preventing plate 84, and the one plate 6 to be discharged is passed through the plate outlet portion 84a and allowed to be placed on the plate placing device 12.

Figure 20:
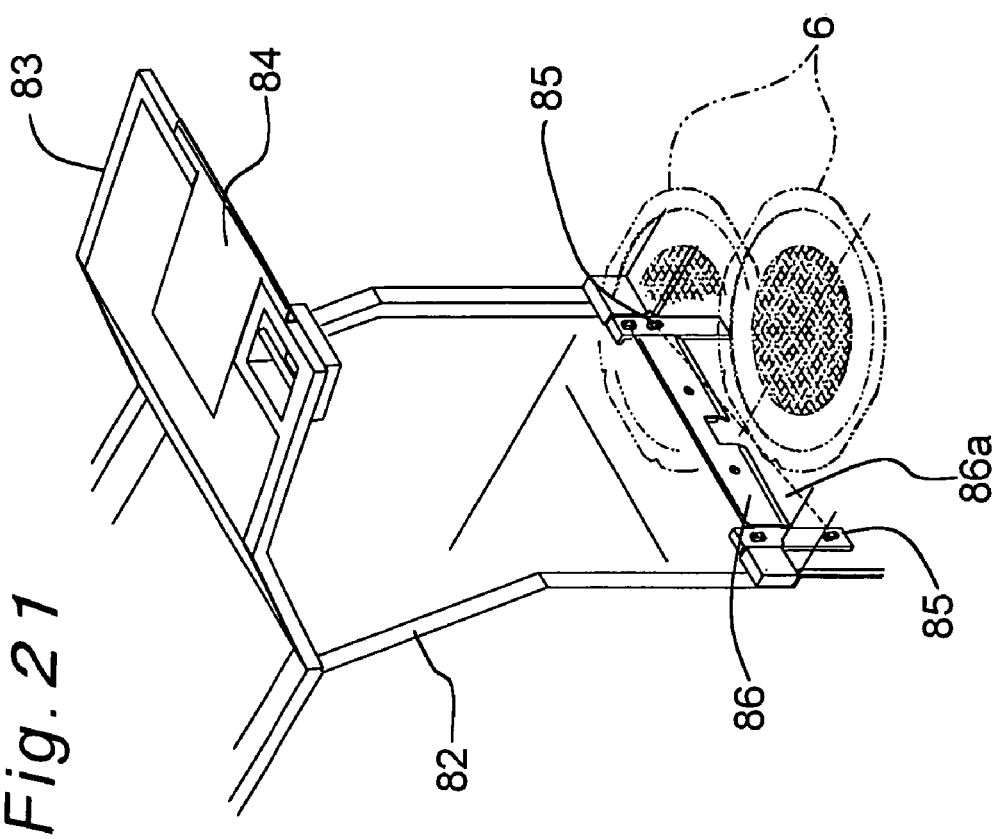
FIG. 20 is a perspective view of the component feeder in a state in which a cover provided with the jump preventing plate is closed.
Figure 21:
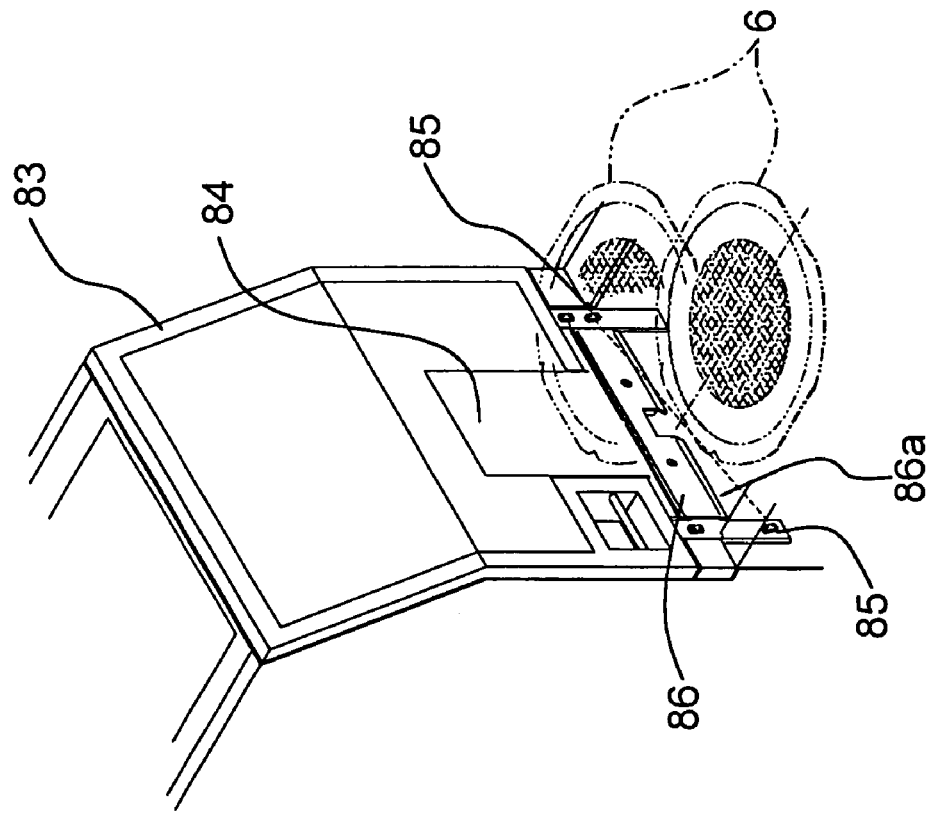
FIG. 21 is a perspective view of the component feeder in a state in which the cover provided with the jump preventing plate is open.

Moreover, as shown in FIGS. 20 and 21, it may be a case where another jump preventing plate 86 is further provided below the cover 83. In the above case, a plate outlet portion 86a is to be provided below another jump preventing plate 86. Further, a jump detecting unit 85 capable of detecting the plate 6 that is passing through the plate outlet portion 86a can be provided at both end portions of the plate outlet portion 86a. As described above, when the jump detecting unit 85 is provided, the plate 6, which has jumped out of the magazine cassette 50, can be detected at the time of maintenance or the like even when the cover 83 is opened and the jump preventing plate 84 cannot produce its function as shown in FIG. 21.

A construction in which the loading (equipping) and the unloading of the component feeder 4 to and from the lifter unit 10 are performed is described next.

Figure 22:
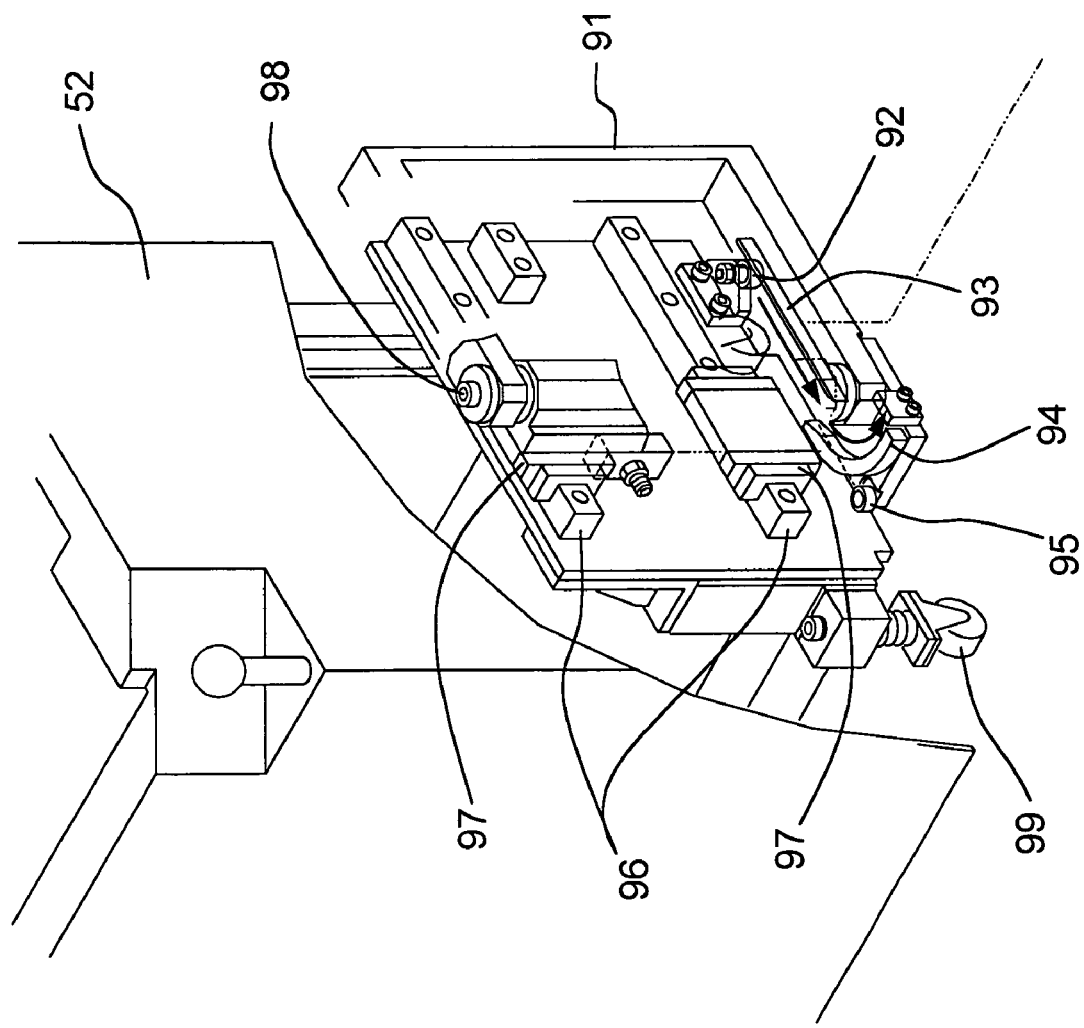
FIG. 22 is a perspective view showing the relation between a base and a base support frame in the lifter unit.

As shown in FIG. 22, the lifter unit 10 is provided with a base 52 for supporting the cassette elevating unit 51 with the magazine cassette 50, and a base retention frame 91 of one example of the base retention part capable of retaining the arrangement position of the base 52 when the base 52 is loaded into the component feeder 4 and performing unloading by releasing the retention. It is noted that the base retention frame 91 can retain the base 52 so that the frame 91 is brought in contact with the base 52 in three directions except for the front surface portion at the lower portion. Moreover, as shown in FIG. 22, the base retention frame 91 has a mechanism for guiding the linear motion or the movement in a straight line of the base 52 and the pivot or the movement with rotation of the base 52 by being engaged with a lower side surface located on the right-hand side in the illustrated X-axis direction of the base 52. The mechanism is described below.

As shown in FIG. 22, the base retention frame 91 is provided with a linear motion guide rail 93 that is one example of the linear motion guide portion capable of guiding the linear motion of the base 52 and extends in the Y-axis direction in the neighborhood of its lower portion, and a pivot guide rail 94 of one example of the pivot guide portion capable of guiding the pivot of the base 52 placed adjacent to the end portion located on the left-hand side in the illustrated Y-axis direction of the linear motion guide rail 93, when performing the unloading of the base 52, i.e., when moving the base 52 from the component feeder 4, as the aforementioned mechanism. Moreover, a first guide roller 92 of one example of the engagement portion of which the linear motion is guided while being brought in contact with the linear motion guide rail 93 and of which the pivot is guided while being engaged with the pivot guide rail 94, is attached to a lower portion of the side surface on the side where it is brought in contact with the mechanism of the base 52. Further, two LM rails 96 extending along the illustrated Y-axis direction are fixed to the side surface of the base 52. Moreover, LM blocks 97 are engaged with the two LM rails 96 and made movable along the respective LM rails 96. The LM blocks 97 are fixed to a pivot shaft 98 attached to the base support frame 91 and made pivotable around the axis of the pivot shaft 98 served as the center of rotation. Moreover, four caster rollers 99 are provided on the bottom surface of the base 52, and the base 52 is movably supported by the caster rollers 99. Further, a second guide roller 95, which can be brought in contact with the lower portion of the side surface of the base 52, for guiding the linear motion of the base 52, is placed outside the pivot guide rail 94.

Figure 23:
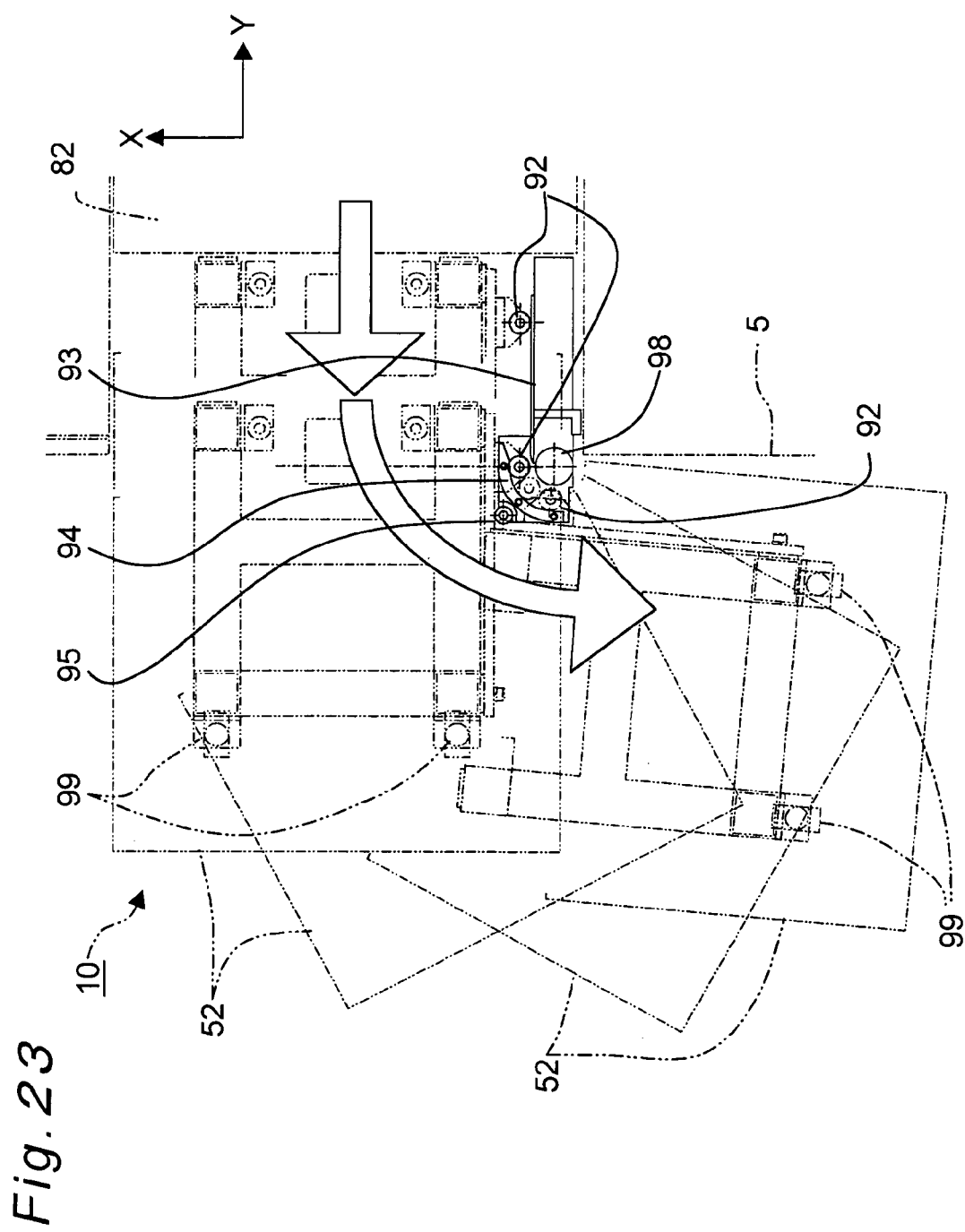
FIG. 23 is a schematic plan view showing the tracks of base draw-out operation.

Operation to draw out the base 52 retained by the base retention frame 91 from the component feeder 4 by releasing the retention in the above construction is described. FIG. 23 shows the state of such a series of operation overlapped in plan.

As shown in FIGS. 22 and 23, in a state in which the base 52 is retained by the base retention frame 91, the first guide roller 92 is brought in contact with the neighborhood of the end portion on the rear side of the linear motion guide rail 93, while the LM blocks 97 are located in the neighborhood of the end portion on the front side of the respective LM rails 96. In the above state, the retention position of the retention frame 91 is fixed on the side surface located on the rear side of the base 52 by a retention mechanism (not shown) provided for the base retention frame 91.

In order to start the movement of the base 52, the retention by the retention mechanism is first released. Subsequently, the base 52, of which the retention is released, is started to move so as to be drawn out leftward in the Y-axis direction of FIG. 22. By this operation, the first guide roller 92 is guided so as to rotationally run while being brought in contact with the linear motion guide rail 94, and the linear motion of the base 52 is guided. Moreover, the second guide roller 95 is also made to rotationally run while being brought in contact with the side surface of the base 52, guiding the linear motion of the base 52. Moreover, the LM rails 96 are made to run while being guided by the respective LM blocks 97. At this time, the pivoting of the base 52 is regulated by the first guide rail 92 and the linear motion guide rail 93, and therefore, the pivot shaft 98 cannot pivot.

Subsequently, when the first guide roller 92 passes over the end portion on the front side of the linear motion guide rail 93 and the contact with the linear motion guide rail 93 is released, the first guide roller 92 is engaged with the pivot guide rail 94 in accordance with it. By this operation, the pivoting that has been regulated can be performed, and the pivoting of the base 52 is performed while the first guide roller 92 is guided by the pivot guide rail 94. At this time, the LM blocks 97, which are fixed to the pivot shaft 98, are therefore pivoted around the center of rotation. The pivoting of the base 52 is thus performed, and the base 52 can be drawn out of the component feeder 4 while being pivoted in plan by an angle of approximately 90 degrees as shown in FIG. 23.

Effects of Embodiment

According to the embodiment, the following various effects can be obtained.

First, the position where the plate pressurizing members 61 are lowered in the plate placing device 12 of the component feeder 4 can be selectively regulated by the intermediate stopper driving unit 69. Therefore, by regulating the lowered position according to the type of the plate 6 placed on the plate placing device 12, the tray feeding plate 6t can reliably be held. By releasing the regulation of the lowered position, the wafer sheet 8 is expanded to perform expanding while securely holding the wafer feeding plate 6w. Therefore, appropriate holding and expanding operation can be performed selectively and automatically according to the type of the plate 6 to be placed and fed, making it possible to efficiently perform the component feeding.

Moreover, the type of the plate 6 can be identified by the plate identifying sensor 41b provided adjacent to the chuck part 41 for holding the end portion of the plate 6 when each of the plates 6 received in mixture in the magazine cassette 50 is discharged by the plate moving device 40. In concrete, by providing the identification hole(s) 56 only in the case of the tray feeding plate 6t at the end portion of the plate 6 and discriminating the presence or absence of the identification hole(s) 56 by the plate identifying sensor 41b, the type of the plate 6 can be identified. Moreover, by determining the movement positions of the intermediate stoppers 69a by the intermediate stopper driving unit 69 on the basis of the identification result, the lowered positions of the plate pressurizing members 61 can be selectively regulated.

Moreover, the lowered positions of the plate pressurizing members 61 are regulated so that the end portion 63a of the expanding member 63 that performs expanding by contact with the wafer sheet 8 of the wafer feeding plate 6w does not come in contact with the lower surface of the tray feeding plate 6t, and therefore, the end portion of the expanding member 63 can be prevented from being damaged.

Moreover, the plate placing device 12 is provided with the plurality of plate support portions 60 of which the support height positions are variable. With this arrangement, each plate 6 can be supported in the vicinity of the outer peripheral portion of the plate 6, and its support height position can be freely varied while performing the support in accordance with the elevating operation of the plate pressurizing members 61, allowing the aforementioned effects to be achieved.

Moreover, by virtue of the provision of the taper support portion 65 that has the slant end portion 65a at its end, the support position in the direction along the surface of the plate 6 can be retained by the angular resistance by bringing the end portion of the plate 6 in contact with the end portion 65a, allowing reliable and accurate retention to be achieved.

Moreover, the slide-side holding member 80 and the fixed-side holding member 81 are provided in the direction perpendicular to the plate discharge direction C at the tray placing part 58 of the tray feeding plate 6t. With this arrangement, the component feeding tray 57 can be placed in the placement position roughly from above the placement position, and the component feeding tray 57 can be held so as to be interposed between the slide-side holding member 80 and the fixed-side holding member 81. Therefore, a space necessary for the placement of the component feeding tray 57 can be reduced. Therefore, a total of four component feeding trays 57 can be placed in two rows on the tray placing part 58 of the tray feeding plate 6t, and the accommodation ratio per area of the component feeding trays 57 in the tray feeding plate 6t can be improved.

Moreover, the conventional component feeder has had the issue of difficulties in performing maintenance of plate arrangement and so on due to the interference of the jump preventing plate during the maintenance since the jump preventing plate, which has prevented each plate from jumping out of the magazine cassette, has been provided for the lifter unit. However, in the present embodiment, by virtue of the jump preventing plate 84 provided for the cover 83, the jump preventing plate 84 can be moved by opening and closing the cover 83, and the maintenanceability can be improved. Further, the jump detecting unit 85 capable of detecting the plate 6 passing through the plate outlet portion 86a is provided at both end portions of the plate outlet portion 86a. With this arrangement, even when the cover 83 is opened and the jump preventing plate 84 cannot produce its function during maintenance, the plate 6 that has jumped out of the magazine cassette 50 can be detected, and the maintenanceability can be improved with improved safety.

Moreover, by virtue of the mechanism capable of performing the loading and the unloading of the lifter unit 10 to and from the component feeder 4 by combining the linear motion with the pivoting, it becomes possible to reliably receive and load the lifter unit 10 in a narrower space or draw out the lifter unit 10 more easily and smoothly from the space. Therefore, even when the component feeder 4 is placed in a compacter space, the lifter unit 10 can be smoothly loaded and unloaded, and the maintenanceability can be improved.

Second Embodiment

The present invention is not limited to the above embodiment but allowed to be put into practice in various modes. For example, a component feeder according to the second embodiment of the present invention is described below. The component feeder of the present second embodiment has a basic construction common to that of the component feeder 4 of the first embodiment although the construction is partially varied. Therefore, in order to make the following description easy to understand, the same constituents as those of the component feeder 4 of the first embodiment are denoted by same reference numerals.

Figure 24:
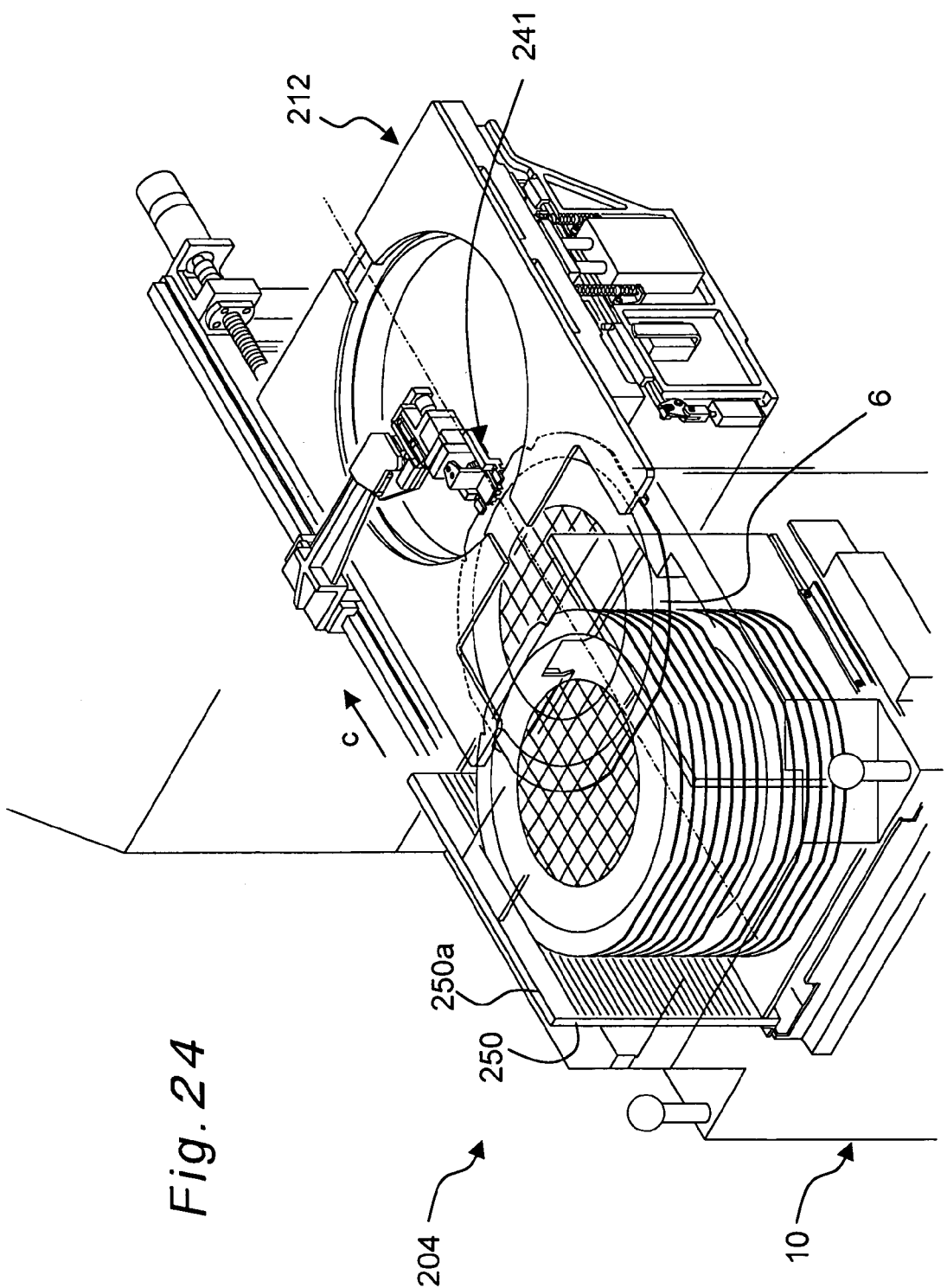
FIG. 24 is an enlarged half-transparent perspective view of a component feeder according to a second embodiment of the present invention.

In the component feeder 204 shown in FIG. 24, the lifter unit 10 is provided with a magazine cassette 250, for receiving in mixture a plurality of wafer feeding plates and a plurality of tray feeding plates. The magazine cassette 250 has sidewall portions 250a that are opposed to each other in a direction perpendicular to the plate discharge direction C as in the first embodiment, and a plurality of groove portions 250b are formed along the plate discharge direction C on the mutually opposed side surfaces. Moreover, each plate is held by and received in the magazine cassette 250 by being supported at the mutually opposed both end portions engaged with a set of groove portions 250b arranged mutually opposed on the sidewall portions 250a, and these groove portions 250b serve as one example of the support guide portion. It is noted that the groove portions 250b are formed at a constant interval pitch on the sidewall portions 250a, and each plate has its surface put in a roughly horizontal state while being held engaged with the groove portions 250b. Further, each plate is put in a state in which it can move forward and backward (i.e., sliding motion) in the plate discharge direction C while being guided along a direction in which the mutually opposed groove portions 250b are formed.

Figure 25:
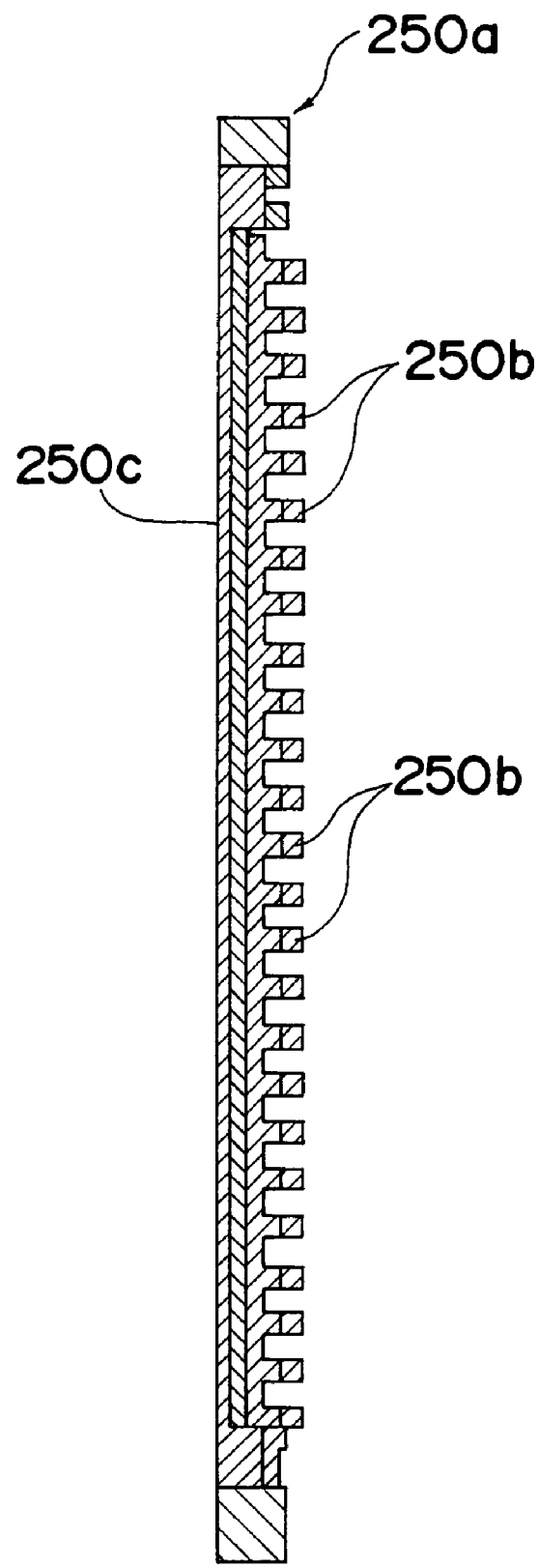
FIG. 25 is a sectional view of a sidewall portion of the magazine cassette provided for the component feeder of FIG. 1.

FIG. 25 shows a partial sectional view of the sidewall portion 250a of the magazine cassette 250. As shown in FIG. 25, the sidewall portion 250a has a structure in which the groove portions 250b formed integrated by using a thermoplastic resin of DURACON (registered trademark: DURACON, POM: Polyoxymethylene) are fixed on a plate 250c made of a metal material of aluminum. The DURACON is a softer material, of which the surface hardness is lower than that of the stainless steel material (e.g., JIS Standard: SUS304) of the formation material of the tray ring 59 and the wafer ring 9. Therefore, even when the groove portions 250b and the plate 6 are brought in contact with each other by the contact surfaces, the amount of generation of cuttings and so on due to the contact wear can be reduced. Moreover, by virtue of the thermoplastic resin material used, the groove portions 250b of the structure in which a plurality of undulated portions continue, can easily be formed. It is noted that the combination of the formation materials of the groove portions 250b and the tray ring 59 or the like is not limited to the above combination. The hardness of the formation material of the groove portions 250b are required to be lower than that of the formation material of the tray ring 59, and various other combinations can be adopted under the above condition.

Figure 26:
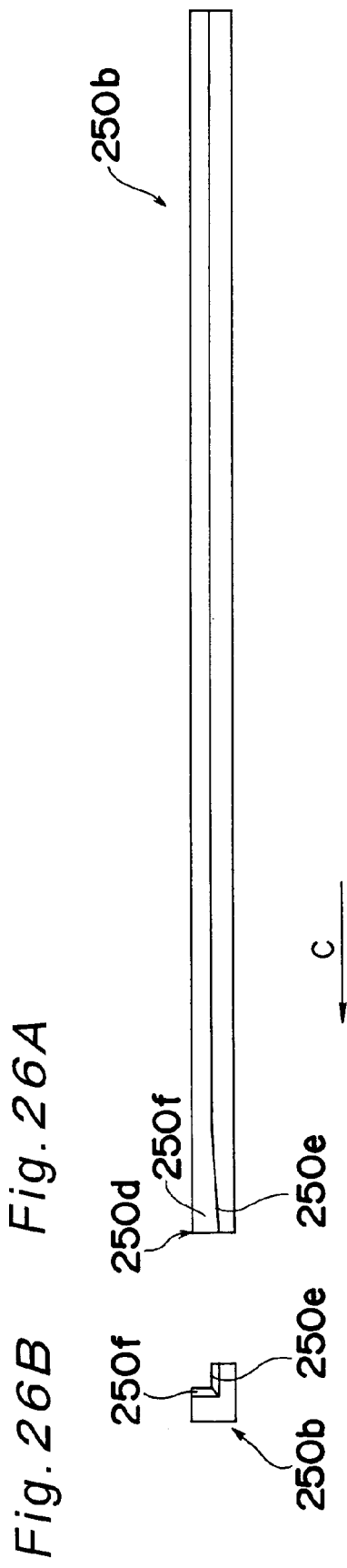
FIGS. 26A and 26B show a groove portion of the magazine cassette, where

FIG. 26A shows a side view of one groove portion 250b showing a more detailed structure of the groove portion 250b, and FIG. 26B shows its front view. Although the groove portions 250b are formed integrated, FIGS. 26A and 26B are views that show one groove portion 250b cut out of the groove portions 250b in order to make the explanation of the structure of the groove portions 250b easy to understand.

As shown in FIG. 26A, a slant surface (one example of the smooth surface portion), which is a slightly inclined surface with respect to the plate discharge direction C, is formed at the end portion on the plate discharge direction-C-side of the groove portion 250b, i.e., the insertion end portion 250d of each plate 6. Moreover, as shown in FIG. 26B, the slant surface is constructed of a lower slant surface 250e that is inclined downward in the figure in a direction roughly perpendicular to the surface of the plate 6 with respect to the plate discharge direction C, and a side slant surface 250f that is inclined leftward in the figure in a direction extending roughly along the surface of the plate 6.

As described above, by virtue of the formation of the lower slant surface 250e and the side slant surface 250f at the insertion end portion 250d of each groove portion 250b, friction due to contact between the end portion of the plate 6 and the insertion end portion 250d of each groove portion 250b that supports and guides the plate 6 can be reduced even when the plate 6 is inserted reversely to the illustrated plate discharge direction C, and smooth insertion of the plate 6 can be achieved. Moreover, even when a positional deviation is occurring between the support position of the plate 6 by each groove portion 250b and the insertion position of the plate 6 into each groove portion 250b in the direction perpendicular to the plate discharge direction C during the insertion of this plate 6, there is also an effect that the positional deviation can be corrected by inserting the plate 6 while guiding the plate 6 by the lower slant surface 250e and the side slant surface 250f.

Figure 27:
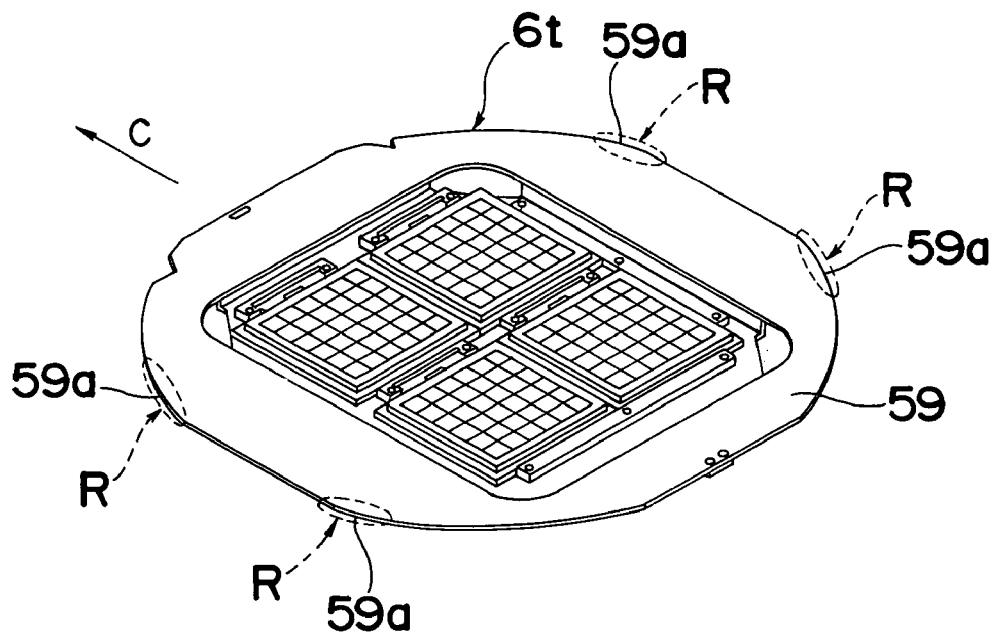
FIG. 27 is a perspective view of the external appearance of the tray feeding plate.
Figure 28:
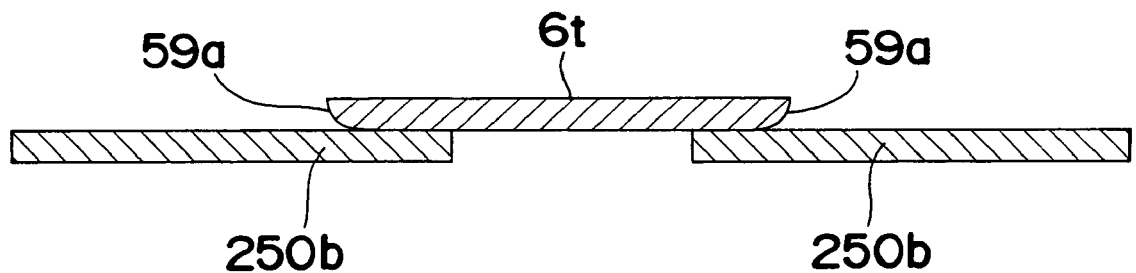
FIG. 28 is a schematic sectional view showing a state in which the tray feeding plate of FIG. 27 is supported by the groove portion.

Next, FIG. 27 shows a perspective view of the external appearance of the tray feeding plate 6t. Connection portions (R) in four portions of the mutually opposed end portions (linearly formed end portions) along the plate discharge direction C and the partially arc-shaped end portions of the tray ring 59 of the tray feeding plate 6t shown in FIG. 27 are formed into smooth surface portions 59a constituted of smooth curves obtained by scraping off the corner portions of the lower surface end portions. The connection portions R are the portions to be brought in contact with the groove portions 250b of each set of the magazine cassette 250. Therefore, the frictional force between the smooth surface portions 59a and the groove portions 250b can be reduced even when the plate 6t is moved forward and backward along the plate discharge direction C while being supported by the groove portions 250b as shown in FIG. 28. Therefore, the amount of generation of cuttings and so on due to the contact wear of the tray feeding plate 6t with the groove portions 250b can be reduced in inserting or discharging the tray feeding plate 6t into or from the magazine cassette 250. The formation of the smooth surface portions 59a at the tray feeding plate 6t is effective when applied to the tray feeding plate 6t that has the feature that its weight is heavier than that of the wafer feeding plate 6w. However, it may be a case where the smooth surface portions are formed on the wafer feeding plate 6w to further reduce the amount of generation of cuttings.

Figure 29:
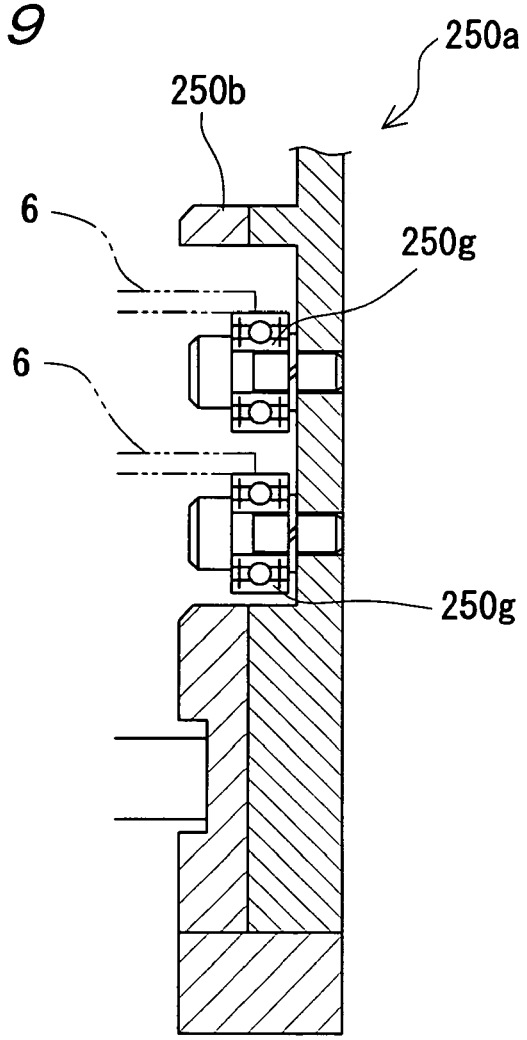
FIG. 29 is a partial sectional view showing the form of the groove portion according to a modification example of the second embodiment, illustrating the form of the groove portion provided with a roller portion.
Figure 30:
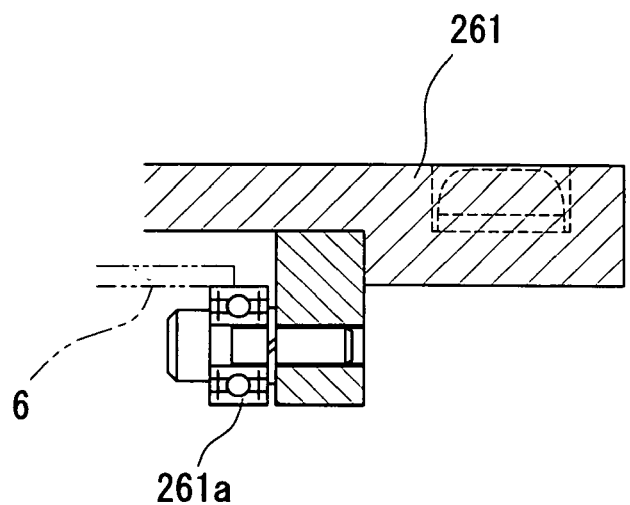
FIG. 30 is a partial sectional view of a state in which the plate pressurizing member is provided with the roller portion.

Moreover, it may be a case where a plurality of roller portions 250g of one example of the rotating member for supporting each plate 6 and guiding the movement along the plate discharge direction C are provided at each groove portion 250b of the magazine cassette 250 as shown in FIG. 29. By virtue of the provision of the roller portions 250g, the frictional force due to the contact between each plate 6 and the groove portions 250b can be remarkably reduced, and the generation of cuttings and so on due to the contact can be suppressed. As shown in FIG. 30, each roller portion 261a may be provided so as to support each plate 6 on the lower surface of the plate pressurizing member 261 of the plate placing device 212 in which the plate 6 is inserted and placed. In the above case, it is possible to reduce the amount of generation of cuttings and so on due to the contact wear of each plate 6 not only in the magazine cassette 250 but also in the plate placing device 212.

Instead of the case where the groove portions 250b are formed of the thermoplastic resin of DURACON on a plate 250c made of aluminum on the sidewall portions 250a of the magazine cassette 250 and the tray ring 59 and the wafer ring 9 are formed of the stainless material, a case where the above members are formed of other materials is described here.

As described above, the amount of generation of cuttings and so on due to the contact with each plate 6 can be reduced by forming the groove portions 250b of a resin. However, in the scene of component mounting, there are many demands for making the magazine cassette 250 have standard specifications as far as possible in consideration of the versatility of the magazine cassette 250. In the above case, conversely, by selecting the formation materials so that the surface hardness of the formation material of each plate 6 is made lower than that of the formation material of the groove portions 250b of the magazine cassette 250, effects similar to the aforementioned effects can be obtained.

Figure 42:
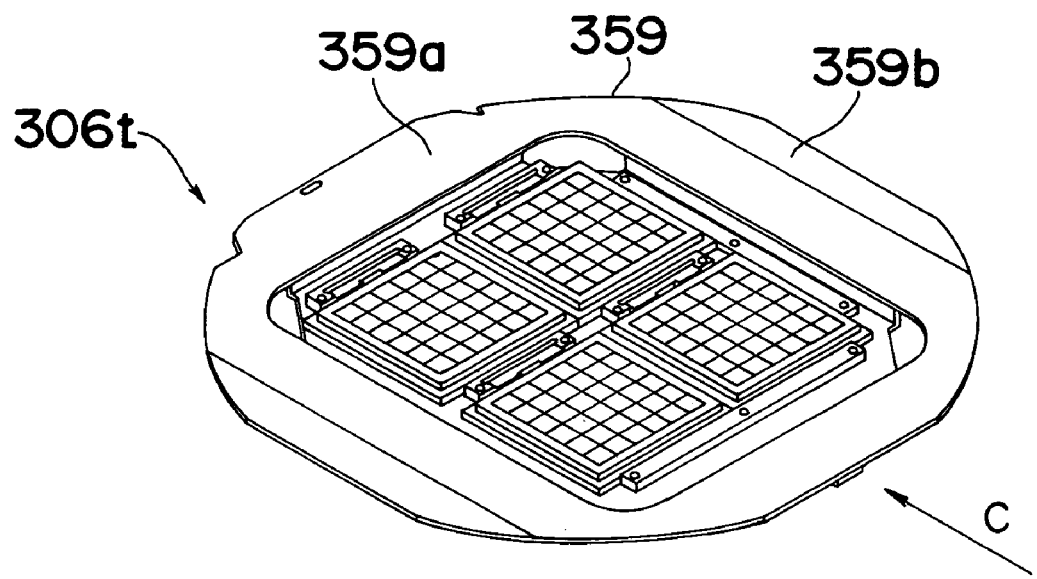
FIG. 42 is a perspective view of a tray feeding plate according to a modification example of the second embodiment.
Figure 43:
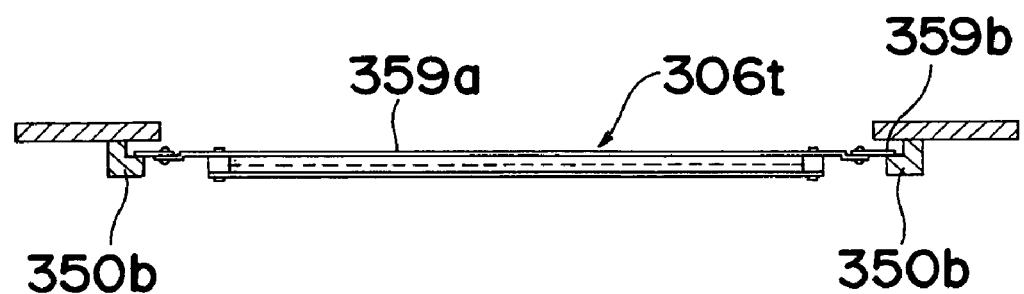
FIG. 43 is a side view of the tray feeding plate of FIG. 42.

In concrete, as shown in the perspective view of the external appearance of the plate of FIG. 42 or, for example, a tray feeding plate 306t, mutually opposed end portions 359b along the plate discharge direction C of a tray ring 359 are formed of a resin of, for example, PEEK resin. Moreover, as shown in the side view (partially including cross section) of the tray feeding plate 306t supported by groove portions 350b of the magazine cassette viewed from the plate discharge direction C in FIG. 42, the groove portions 350b are formed of aluminum. Moreover, as shown in FIG. 43, the main body 359a of the tray ring 359 is formed of, for example, an aluminum plate. Stepped portions 359c are formed by bending of the main body at both ends, and the end portions 359b are formed by attaching a plate formed of the PEEK resin to the stepped portions 359c with, for example, screws.

As described above, by constituting the end portions 359b of the tray ring 359 and the groove portions 350b of the magazine cassette, the amount of generation of cuttings and so on due to the contact wear of them can be reduced without making the magazine cassette, for which versatility is required, have special specifications. It may also be a case where the surfaces of the end portions 359b of the tray ring 359 or the surfaces of the groove portions 350b of the magazine cassette are subjected to simple surface treatment.

A construction for achieving the jump preventing measures of the tray feed component 2t from the tray feeding plate 6t in the component feeder 204 of the second embodiment is described next.

Figure 31:
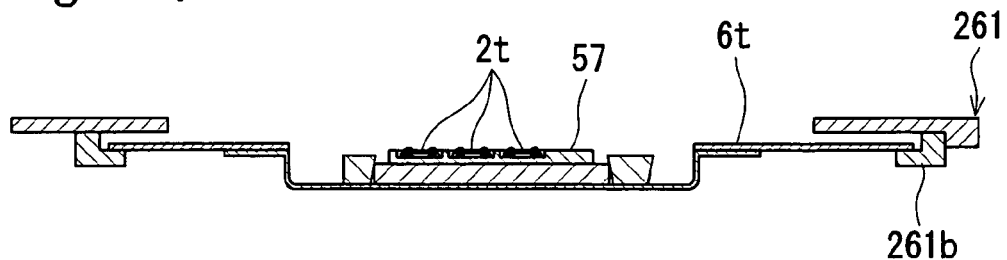
FIG. 31 is a schematic sectional view of a state in which the tray feeding plate is supported by the support portions of the plate pressurizing member.

Although not described in detail in the first embodiment, support portions 261b of one example of the support member for supporting the plate 6 fed to the plate placing device 212 at the mutually opposed end portions are provided on the lower surface of the plate pressurizing members 261 of the plate placing device 212 as shown in the schematic view of FIG. 31. Moreover, the support portions 261b constitute recess portions of which the mutually opposed surfaces are opened with the lower surface of the plate pressurizing member 261, and the end portions of the plate 6 can be inserted and supported in the recess portions. Moreover, as shown in FIG. 31, the recess portions are formed to have a sufficient margin with respect to the thickness of the plate 6 so that the plate 6 with the end portion thereof inserted and supported in the recess portions can easily be moved in a sliding manner.

Operation and issues in the case where the plate placing device 212 of the above construction does not have the construction of the present second embodiment described later are described with reference to FIGS. 31 through 34.

Figure 32:
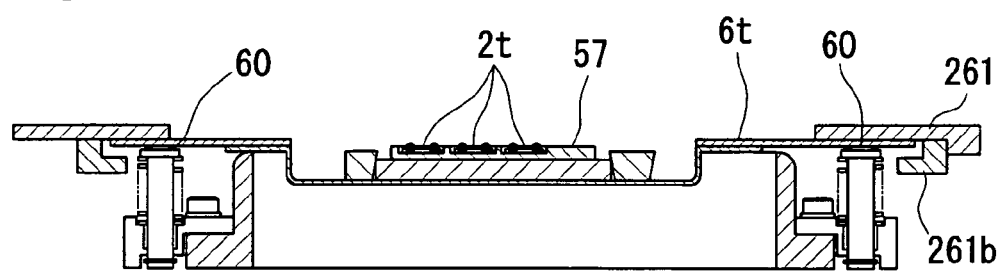
FIG. 32 is a schematic sectional view of a state in which the tray feeding plate is supported by plate support portions.
Figure 33:
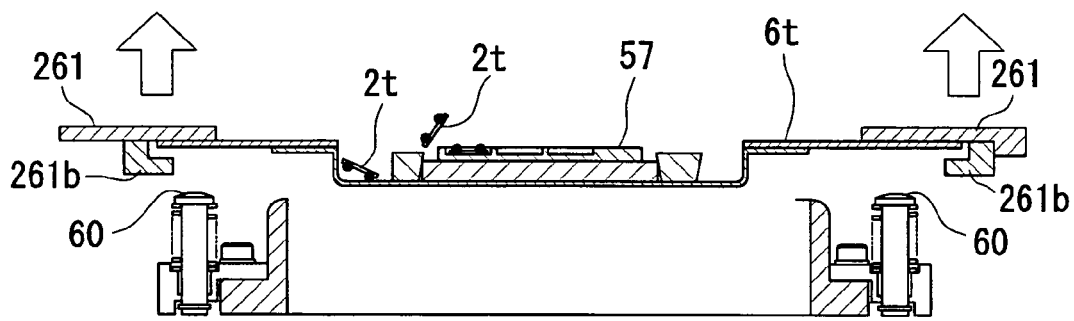
FIG. 33 is a schematic sectional view of a state in which the support of the tray feeding plate by the plate support portions is released and component jumping-out is occurring.
Figure 34:
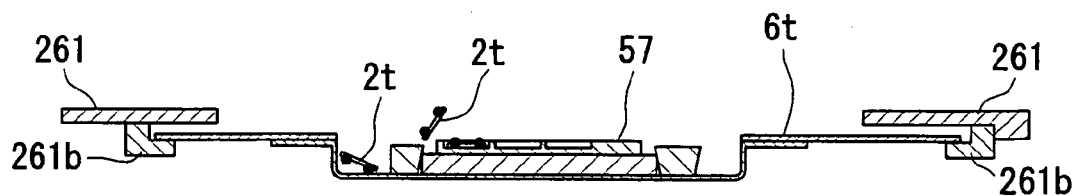
FIG. 34 is a schematic sectional view of a state in which the support of the tray feeding plate by the plate support portion is released and component jumping-out is occurring.

First of all, the tray feeding plate 6t fed to the plate placing device 212 is supported by the support portions 261b of the plate pressurizing members 261. In the state, a gap is secured without mutual contact between the upper surface of the end portion of the tray feeding plate 6t and the lower surfaces of the plate pressurizing members 261. Subsequently, when the plate pressurizing members 261 are lowered by the pressurizing member elevating units 62, the lower surface at the end portion of the tray feeding plate 6t is brought in contact with the plate support portions 60. By being further lowered, the end portion of the tray feeding plate 6t is to be supported held between the lower surfaces of the plate pressurizing members 261 and the plate support portions 60 as shown in FIG. 32. In the above state, the end portion of the tray feeding plate 6t is lifted from the support portions 261b. Conversely, when the plate pressurizing members 261 are moved up from the state, the lower surface of the tray feeding plate 6t is lifted from the plate support portions 60 as shown in FIG. 33. In the above case, the tray feeding plate 6t vibrates in the vertical direction inside the recess portions. In the above case, the issue that the tray feed components 2t disadvantageously jump out of the component feeding tray 57 by the vibration as shown in FIGS. 33 and 34 might occur. In the above case, smooth component feeding is hindered.

The construction of the present second embodiment, which achieves the above jump prevention measures of the tray feed components 2t is described below.

Figure 35:
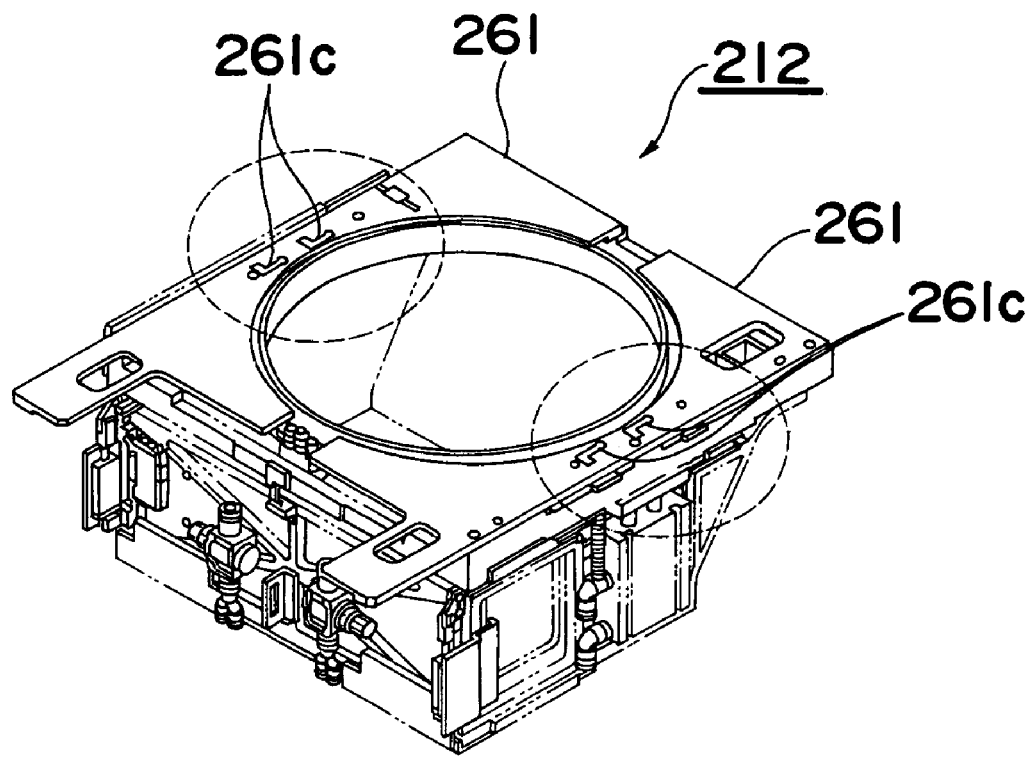
FIG. 35 is a perspective view of the external appearance of the plate placing device.

As shown in FIG. 35, each plate pressurizing members 261 of the plate placing device 212 is provided with urging portions 261c of one example of the urging member for urging the tray feeding plate 6t supported by the support portions 261b or the plate support portions 60 against the support portions 261b or the plate support portions 60 by pressurizing the plate 6t consistently downward from its upper surface. Two urging portions 261c are provided for each of the plate pressurizing members 261.

Figure 36:
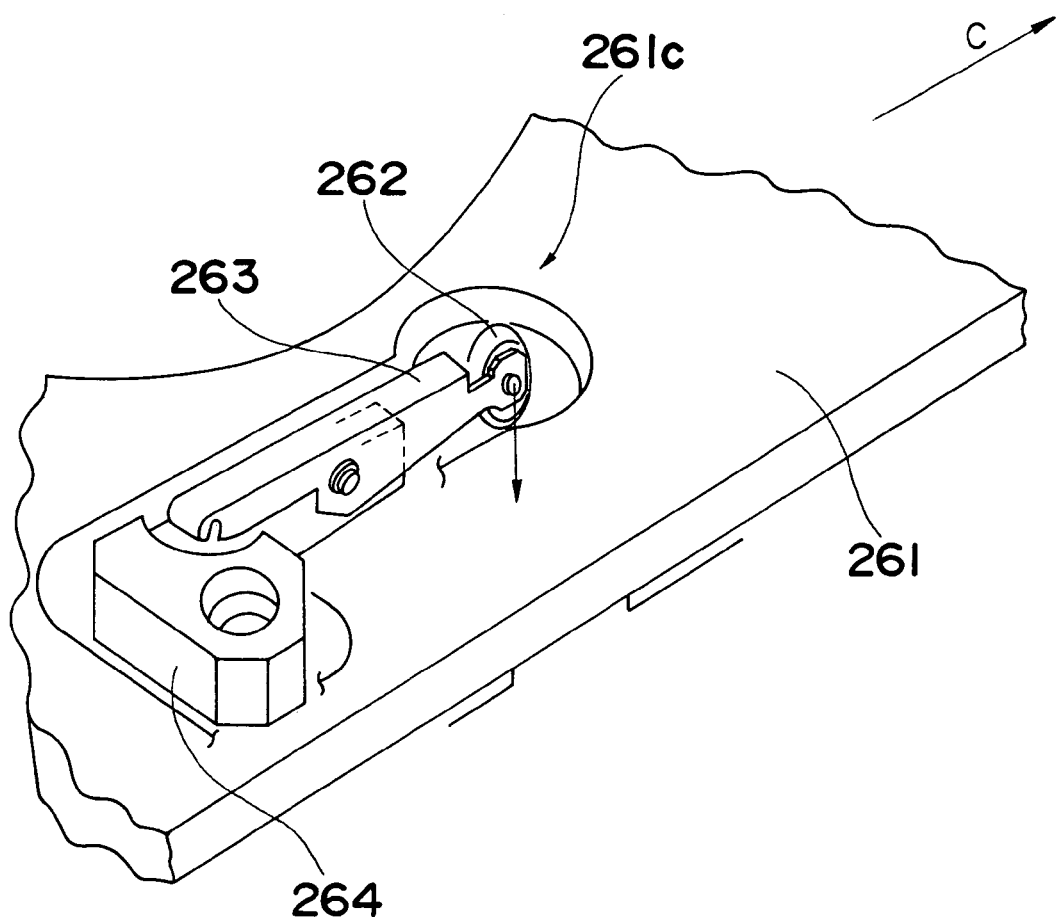
FIG. 36 is a perspective view of the external appearance of an urging portion provided for the plate pressurizing member.

FIG. 36 shows an enlarged view of the external appearance of the urging portion 261c. As shown in FIG. 36, the urging portion 261c is provided with an urging roller portion 262 that is brought in contact with the upper surface of the tray feeding plate 6t and is rotatable along the plate discharge direction C, a pivot member 263 that is a rod-shaped member provided with the urging roller portion 262 rotatable at its one end and is rotatably supported in a plane roughly perpendicular to the plate 6 with its intermediate position served as a fulcrum, and a fixation member 264 for fixing the pivot member 263 to the plate pressurizing member 261 and pivotally urging the pivot member 263 so that the urging roller portion 262 is consistently urged downward with its intermediate position served as a fulcrum.

Figure 37:
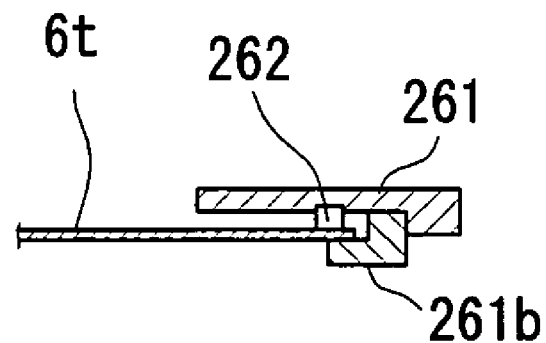
FIG. 37 is a schematic sectional view showing a state in which the tray feeding plate equipped with the urging portion of FIG. 36 is supported, illustrating a state in which the tray feeding plate is supported by the support portions.
Figure 38:
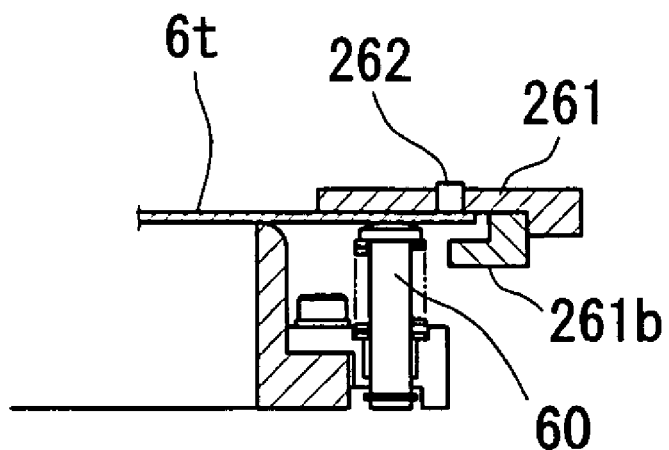
FIG. 38 is a schematic sectional view showing a state in which the tray feeding plate equipped with the urging portion of FIG. 36 is supported, illustrating a state in which the tray feeding plate is supported by the plate support portions.

As shown in FIGS. 37 and 38, by virtue of the provision of the urging portions 261c, the end portion lower surface of the tray feeding plate 6t can be consistently urged with a pressure so as to contact the support portions 261b or the plate support portions 60 regardless of the elevation positions of the plate pressurizing members 261. Therefore, the vertical movement due to vibration in the recess portion or the like can reliably be prevented. Therefore, the vertical movement of the tray feeding plate 6t accompanying the elevation of the plate pressurizing members 261 can reliably be prevented, and the tray feed components 2t can reliably be prevented from jumping out of the component feeding tray 57. Moreover, the urging roller portion 262 is made rotatable along the surface of the tray feeding plate 6t in a state in which the upper surface of the tray feeding plate 6t is urged with a downward pressure via the urging roller portion 262, and the direction of rotation is along the plate discharge direction C. With this arrangement, during the operation of feeding and placing the tray feeding plate 6t to the plate placing device 212 or the operation of discharging the tray feeding plate 6t from the plate placing device 212, the urging roller portion 262 do not obstruct the above operations. Although the tray feeding plate 6t having the feature that its weight is comparatively heavy out of the plates 6 has been described above, the description can also be similarly applied to the wafer feeding plate 6w. It is noted that the number of the urging portions 261c to be provided is not limited to the above case of four and is preferably not smaller than three in order to stably support the surface. However, in the case where the urging portion shape of the urging portion has a comparatively large area of, for example, a rod-like shape or a U-figured shape, only one or two urging portions may be provided.

A construction in which the tray feeding plate 206t having the feature that its weight is comparatively heavier than that of the wafer feeding plate 6w can reliably be drawn out of the magazine cassette 250 is described next.

Figure 40:
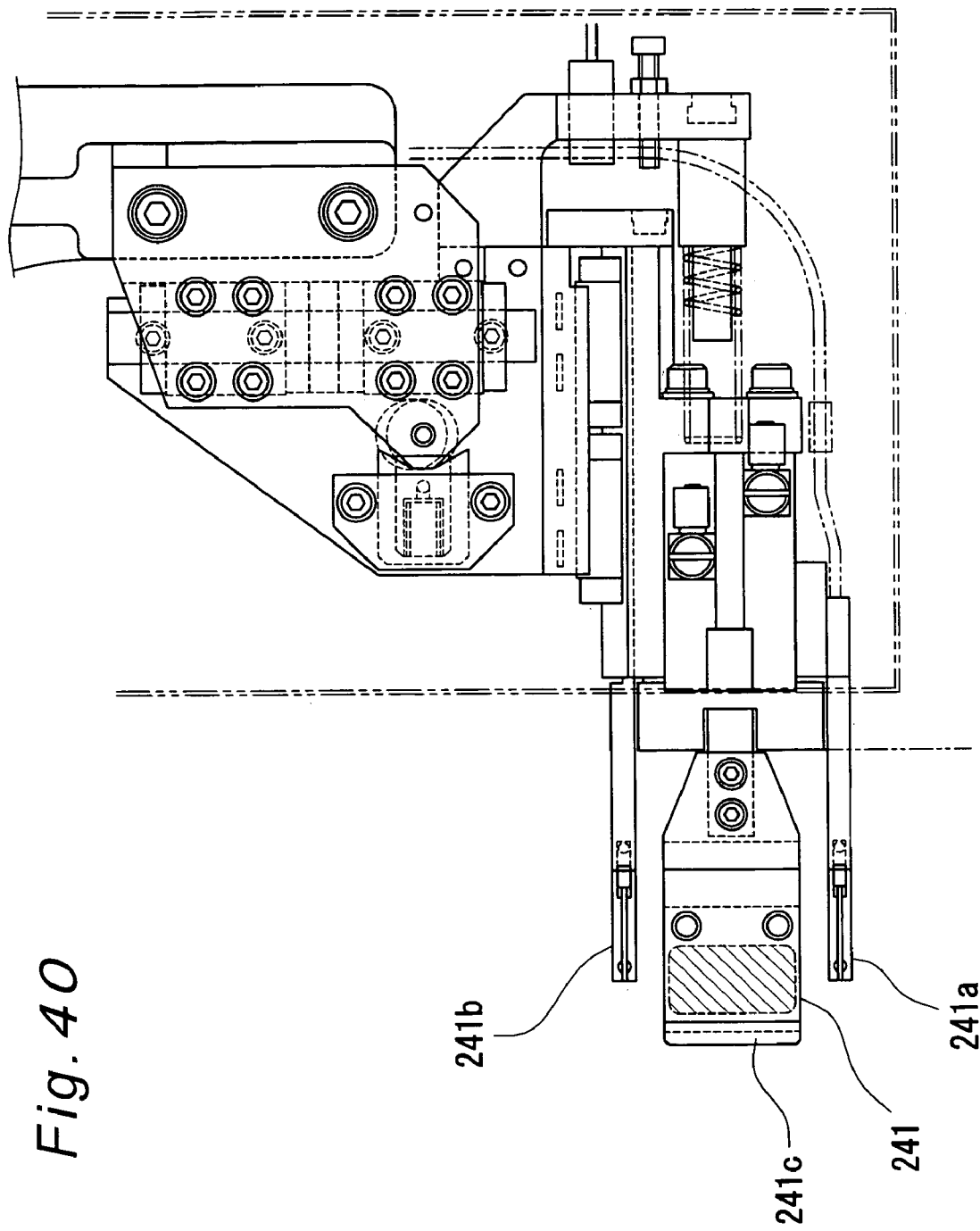
FIG. 40 is a plan view of a chuck part provided with a projecting portion.
Figure 41:
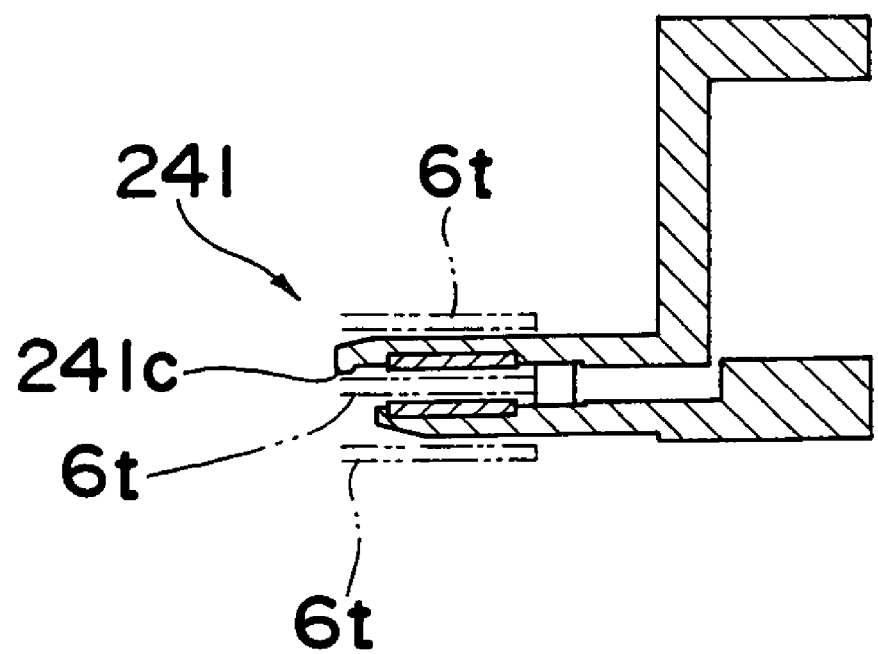
FIG. 41 is a sectional view of the fore end of the chuck part of FIG. 40.

First, FIG. 39 shows a plan view of the tray feeding plate 206t. FIG. 40 shows a plan view of a chuck part 241 for releasably holding the tray feeding plate 206t. FIG. 41 shows a sectional view of the end portion of the chuck part 241 shown in FIG. 40. As shown in FIG. 39, an elongated hole portion 291 (one example of the engagement portion) unlike the tray feeding plate 6t of the first embodiment is further formed at an end portion on the upper side in the figure of the tray ring 259 of the tray feeding plate 206t. Moreover, as shown in FIGS. 40 and 41, a projecting portion 241c, which can be engaged with the elongated hole portion 291, is formed at the end portion of the chuck part 241. A plate existence detection sensor 241a and a plate identifying sensor 241b are provided on both sides of the chuck part 241 as in the first embodiment.

As described above, the elongated hole portion 291 is formed in the holding position of the chuck part 241 of the tray feeding plate 206t, and the elongated hole portion 291 is allowed to hold the tray feeding plate 206t by the chuck part 241 while being engaged with the projecting portion 241c formed at the end of the chuck part 241. With this arrangement, the tray feeding plate 206t having the feature that its weight is comparatively heavy can reliably be held.

Moreover, by forming an elongated hole portion 291 also at the wafer feeding plate 6w in accordance with the projecting portion 241c of the chuck part 241, the wafer feeding plate 6w can also be reliably held. Moreover, since the projecting portion of the chuck part 241 is formed only on the side brought in contact with the upper surface of the wafer feeding plate 6w, the wafer sheet 7 is not damaged during the engagement.

As shown in FIG. 39, by forming a plurality of holes 292 at the tray feeding plate 206t, the tray feeding plate 206t can be reduced in weight.

According to the second embodiment, when the tray feeding plate 6t having the feature that its weight is heavier than that of the wafer feeding plate 6w is inserted and received in the magazine cassette 250 or discharged from the magazine cassette 250, and even when the groove portions 250b and the plate 6 are moved in contact with each other, the amount of generation of cuttings due to the frictional force can remarkably be reduced.

Moreover, the tray feeding plate 6t, which has a construction capable of receiving in mixture numbers of types of components on one tray feeding plate 6t unlike the wafer feeding plate 6w, therefore has a feature that the frequency of inserting and discharging the plate into and from the magazine cassette 250 is great as in a manner that the tray feeding plate 6t is received in the magazine cassette 250 every time the take-out of components of a certain type is completed and thereafter the plate is again discharged from the magazine cassette 250 when different components are taken out of the received tray feeding plate 6t. As described above, even when the frequency of inserting and discharging the plate is great, the generation of driving trouble due to the generation of cuttings, a reduction in the maintenanceability, and so on can be prevented because the measures against the generation of cuttings is adopted. In the component feeder in which the wafer feeding plates 6w and the tray feeding plates 6t are received in mixture, maintenanceability can be improved, and efficient component feeding can be achieved.

Moreover, by providing each of the plate pressurizing members 261 with the urging portions 261c, vibration generated in the tray feeding plate 6t in accordance with the elevating operation of each of the plate pressurizing members 261 can reliably be prevented. The tray feed component 2t can reliably be prevented from jumping out of the component feeding tray 57, and an evil influence of feeding the wafer feeding plate and the tray feeding plate in mixture can be prevented, allowing efficient component feeding to be achieved.

Moreover, by forming the elongated hole portion 291 that can be engaged with the projecting portion 241c of the chuck part 241, it is possible to hold the tray feeding plate 206t by means of the chuck part 241 while engaging both the portions with each other and to reliably stably hold the tray feeding plate 206t having the feature that its weight is comparatively heavy.

Third Embodiment

Next, a component feeder according to the third embodiment of the present invention is described below. The component feeder of the present third embodiment has a construction common to that of the component feeder 4 of the first embodiment although the construction is partially varied as follows. Therefore, in order to make the following description easy to understand, the same constituents as those of the component feeder 4 of the first embodiment are denoted by the same reference numerals.

Before describing the component feeder of the present third embodiment, several issues that possibly occur in making random access to each of the plates 6 in the component feeder 4 of the first embodiment are described.

Figure 44:
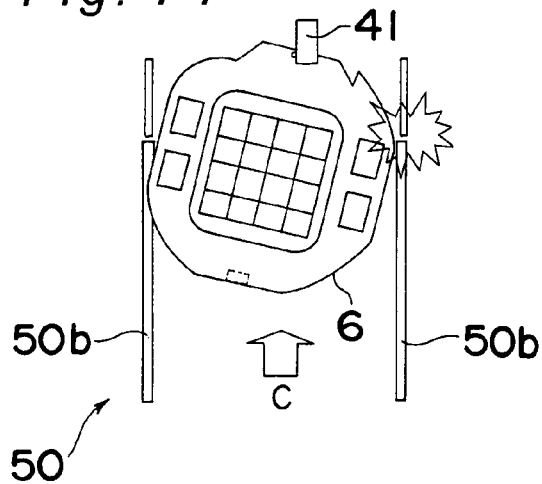
FIG. 44 is a schematic explanatory view for explaining an issue that might occur when discharge (taking-out) of the plate is performed by random access, illustrating a state in which the plate is discharged while being inclined in the horizontal direction with respect to the plate discharge direction.

First, as shown in the perspective view of the component feeder 4 of FIG. 2, when each plate 6 received in the magazine cassette 50 is discharged and moved while being held by the plate moving device 40 and placed on the plate placing device 12, it is sometimes the case where the plate 6 is received in a posture horizontally inclined to the plate discharge direction C in the magazine cassette 50 as shown in the schematic view of FIG. 44 due to the fact that the plate 6 has a roughly disk-like shape. In the above case, contact (or collision) between the peripheral portion of the plate 6 and the groove portions of the magazine cassette 50 sometimes occurs, possibly causing the wobble of the plate 6. Particularly, when the plate 6 is the tray feeding plate 6t on the upper surface of which a plurality of tray feed components 2t are placed, the placed tray feed components 2t might scatter from the tray feeding plate 6t due to the occurrence of wobble.

Figure 45:
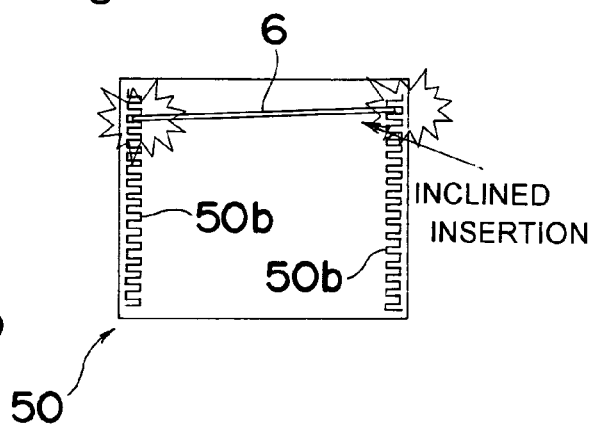
FIG. 45 is a schematic explanatory view showing a state in which the plate is received in an inclined posture in the magazine cassette.

Moreover, in order to make the random access to the plurality of plates 6 received in the magazine cassette 50 more effective for component mounting, the interval pitch of the groove portions 50b is narrowed and the amount of the groove portions 50b to be formed is increased to allow a greater number of plates 6 to be received in the magazine cassette 50. However, the narrowing of the interval pitch of the groove portions 50b makes it difficult to support and receive each of the plates 6 in the mutually opposed groove portions 50b as shown in the schematic explanatory view of FIG. 45 when the operator puts each of the plates 6 into the magazine cassette 50, and it is sometimes difficult to receive each of the plates 6 in the horizontal support posture in the magazine cassette 50 (i.e., causing inclined insertion). In the above case, troubles may occur in the work of discharging each of the plates 6 from the magazine cassette 50.

Accordingly, in the present third embodiment, a device for solving the various issues attributed to the posture of each of the plates 6 received in the magazine cassette 50, enabling the smooth discharge of each of the plates 6 from the magazine cassette 50, and making the random access to be more effective is described.

Figure 46:
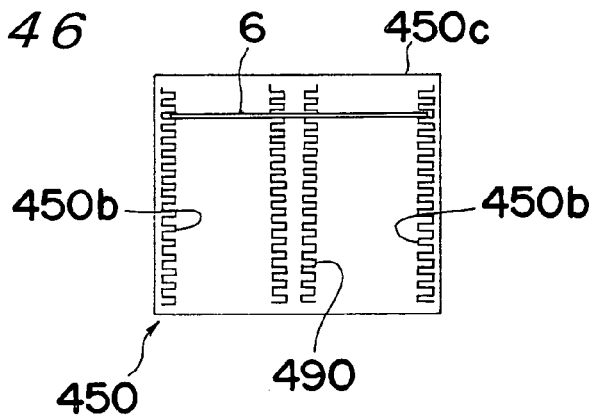
FIG. 46 is a schematic side view of a magazine cassette according to a third embodiment of the present invention.

When the plate discharge direction-C-side of the magazine cassette 450 provided for the component feeder according to the present third embodiment is served as the front side, FIG. 46 shows a schematic explanatory view of a magazine cassette 450 viewed from the front side.

As shown in FIG. 46, a number of groove portions 450b arranged mutually opposed are formed on inner surfaces of sidewall portions 450a of the magazine cassette 450, and the plate 6 can be received while keeping the roughly horizontal posture by supporting the end portion of the plate 6 by the mutually opposed groove portions 450b. A rear-side wall portion 450c is further provided on the rear side in the figure of the magazine cassette 450, and the rear-side wall portions 450c is provided with posture guide portions 490 that can keep the horizontal posture of the plate 6 and the posture in the horizontal direction with respect to the plate discharge direction C in the normal postures by being engaged with the end portion of the plate 6.

More in concrete, although not described in detail in the first embodiment, a posture guide block 59a, which can be engaged with the posture guide portion 490, is formed on the lower surface of the end portion (i.e., end portion of the tray ring 59) of the tray feeding plate 6t oppositely from the plate discharge direction C as shown in FIG. 5.

Figure 47:
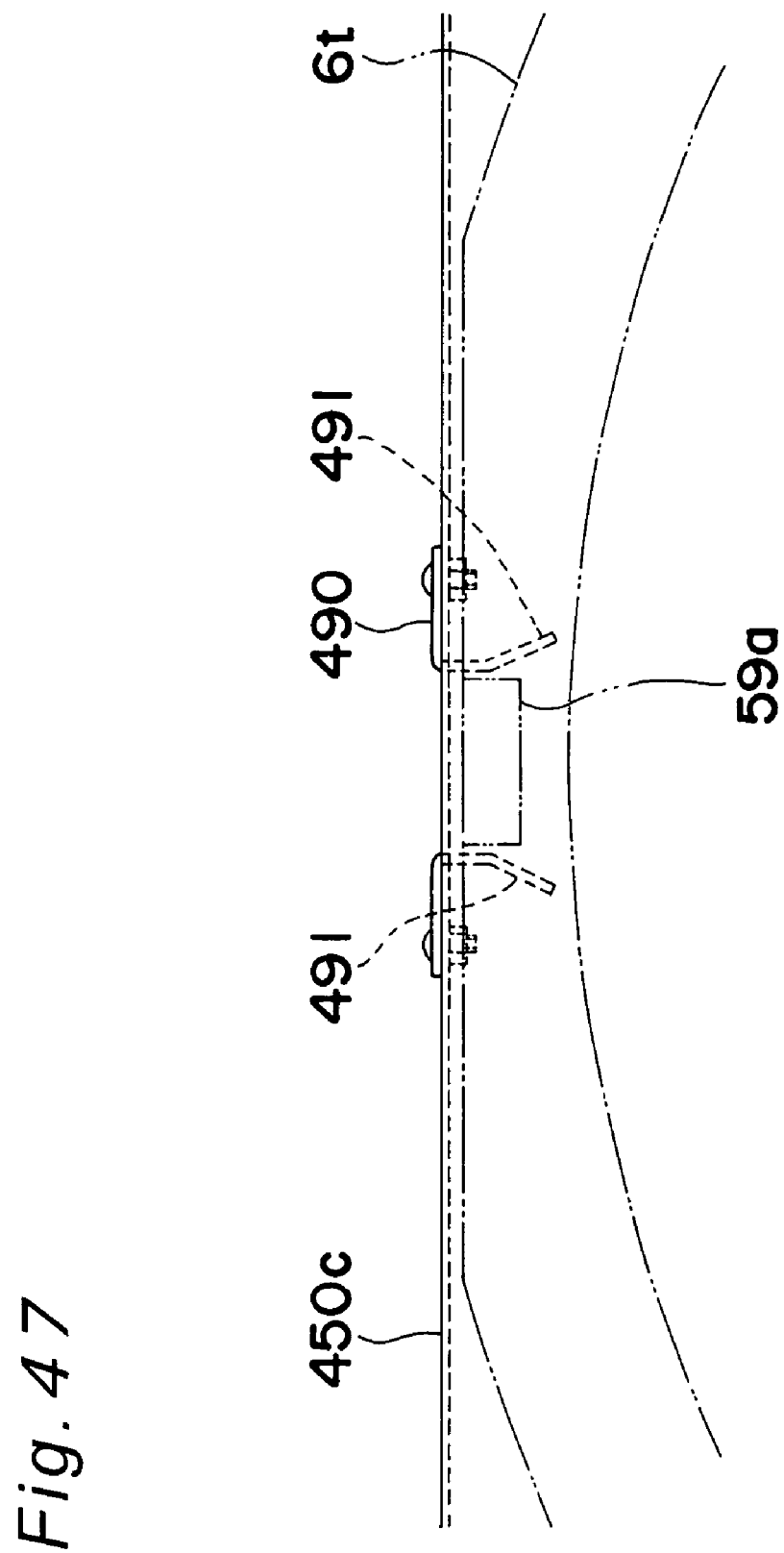
FIG. 47 is an enlarged plan view of a posture guide portion provided for the magazine cassette of FIG. 46.
Figure 48:
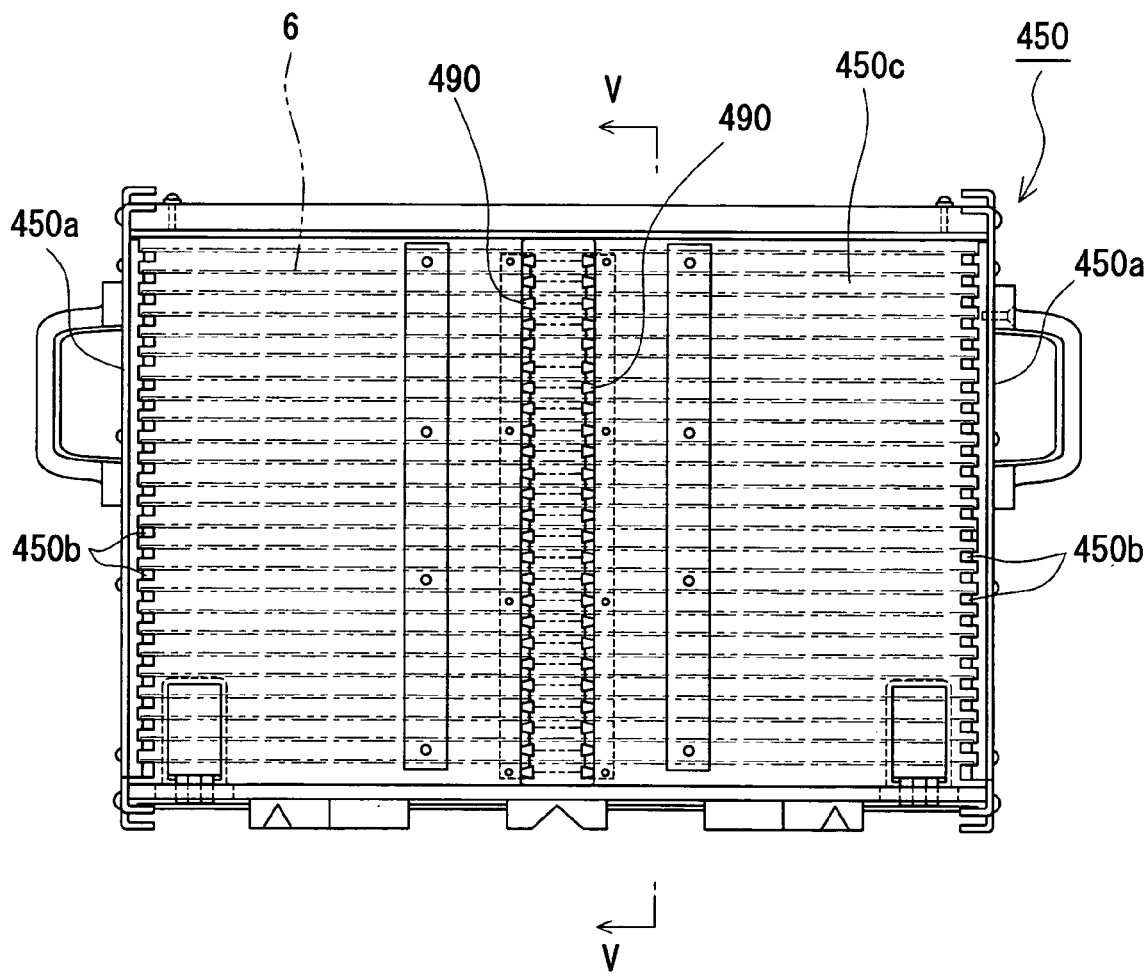
FIG. 48 is a side view viewed from the plate discharge direction of the magazine cassette of FIG. 46.
Figure 49:
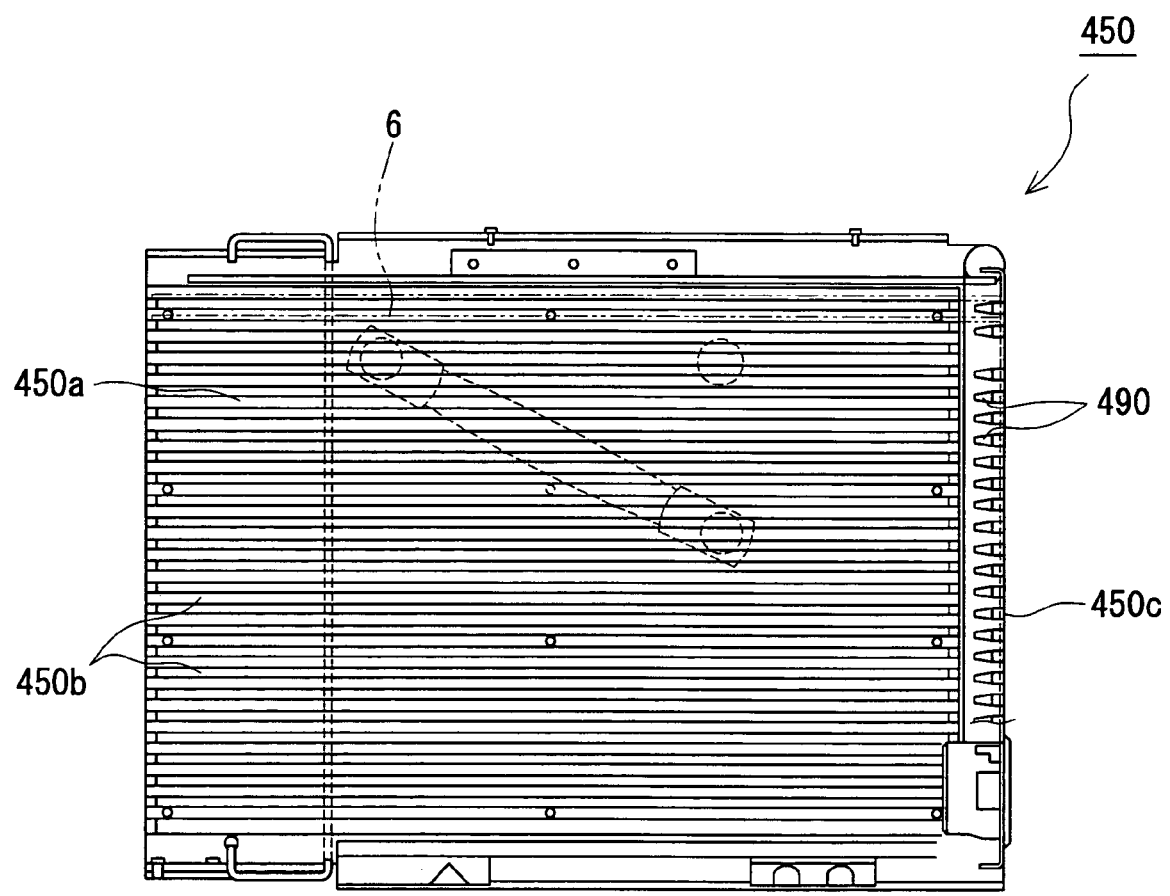
FIG. 49 is a sectional view taken along the line V-V of the magazine cassette of FIG. 48.

FIG. 47 shows an enlarged plan view of the state of engagement between the posture guide block 59a provided for the tray feeding plate 6t and the posture guide portion 490 provided on the rear-side wall portion 450c of the magazine cassette 450. FIG. 48 shows a detailed front view directed in the same direction as that of FIG. 46 of the magazine cassette 450. FIG. 49 shows a sectional view taken along the line V-V of the magazine cassette 450 of FIG. 48.

As shown in FIGS. 48 and 49, a plurality of posture guide portions 490 are provided arranged in a line in the vertical direction at the same interval pitch as the formation interval pitch of the groove portions 450b roughly in the vicinity of the central portion of the rear-side wall surface 450c of the magazine cassette 450. Moreover, as shown in FIG. 47, the posture guide portions 490 are formed by attaching two bent pin-shaped members 491 by, for example, screwing or the like to the rear-side wall surface 450c so that the pin-shaped members 491 are mutually opposed with a prescribed interval kept. Moreover, the prescribed interval of the pin-shaped members 491 has roughly the same dimension as the formation width of the posture guide block 59a of the tray feeding plate 6t in the neighborhood of the rear-side wall portion 450c, and is formed so that the interval is widened as the plate is located apart from the rear-side wall portion 450c.

By virtue of the posture guide portions 490 provided for the magazine cassette 450 and the posture guide block 59a provided for each tray feeding plate 6t, the tray feeding plate 6t, of which the mutually opposed end portions are supported by the mutually opposed groove portions 450b of the magazine cassette 450, can be retained in the normal posture with respect to the plate discharge direction C by further engaging the posture guide block 59a with the posture guide portion 490 as shown in FIG. 47, and the support posture by the groove portions 450b can be retained in a horizontal posture. Particularly, since the interval between the pin-shaped members 491 of the posture guide portion 490 is tapered as shown in FIG. 47, the engagement between the posture guide block 59a and the posture guide portion 490 can be made easy, and the engagement can be achieved by correcting the posture of the tray feeding plate 6t horizontally inclined to the plate discharge direction C in the course of the engagement process.

Figure 50:
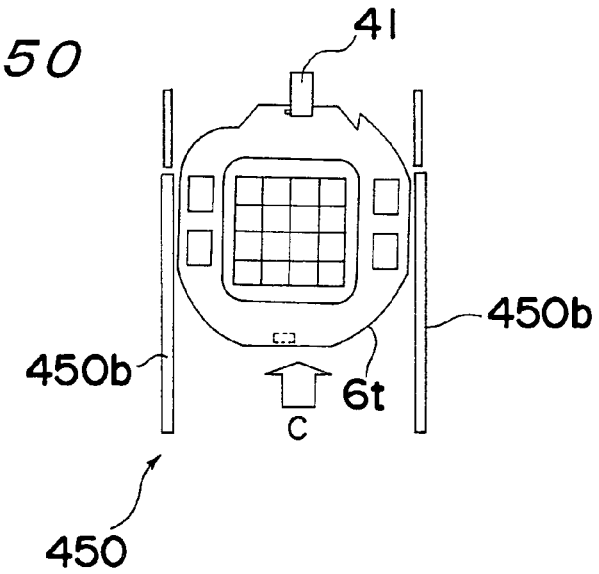
FIG. 50 is a schematic explanatory view showing a state in which the plate received in the magazine cassette of FIG. 46 is discharged.

By virtue of maintaining the support posture of each plate 6 received in the magazine cassette 450 in the normal state, each of the plates 6 can be smoothly discharged from the magazine cassette 450 as shown in the schematic view of FIG. 50, and the components 2 can also be prevented from jumping out of the tray feeding plate 6t. Therefore, the random access to each of the plates 6 received in the magazine cassette 450 can efficiently be performed, and efficient component feeding can be achieved.

Although the case where the plate 6 is the tray feeding plate 6t has been described above as a representative, a similar construction can be adopted for the wafer feeding plate 6w.

Figure 56:
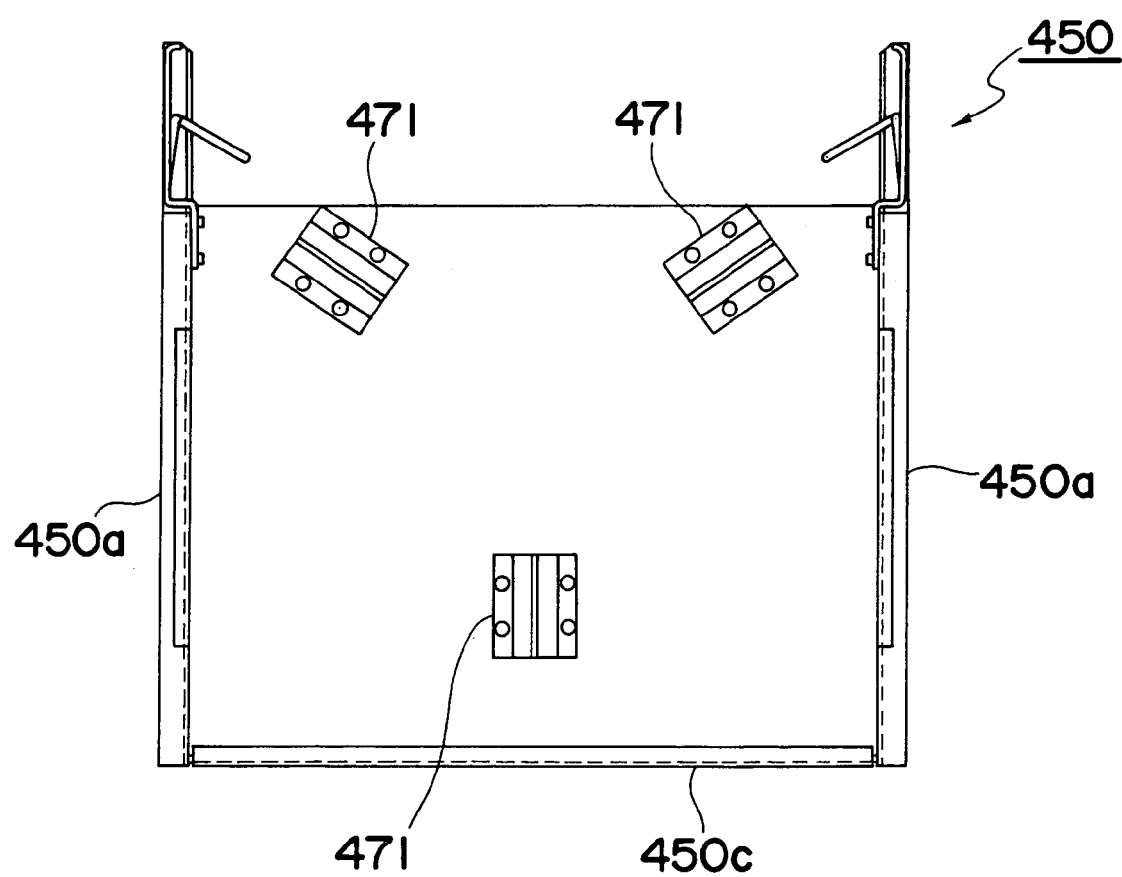
FIG. 56 is a view showing a bottom portion of the magazine cassette.

Moreover, there is a concern about the influence on the components 2 due to electric charge of the magazine cassette 450 in the magazine cassette 450 in which the wafer feeding plates 6w and the tray feeding plates 6t are received. For example, the amount of charge usually becomes about 400 V to 600 V. Moreover, as shown in FIG. 56, for example, three connection blocks 471 (one example of the fixing part) for connecting (fixing) the magazine cassette 450 to the base 52 are provided in the bottom portion of the magazine cassette 450. In order to prevent the influence on the components due to the charge, by forming at least one of the three connection blocks 471 of a conductive material, the magazine cassette 450 can be grounded with the connection block having a function of a ground terminal, and the amount of charge can be reduced to about several volts of, for example, about 2 V.

Although the case where the posture guide portions 490 are formed on the rear-side wall portion 450c of the magazine cassette 450 has been described above, the present third embodiment is not limited only to the case. A magazine cassette that can further improve the workability while obtaining the effect of the provision of the posture guide portions 490 is described below as a modification example of the fourth embodiment instead of the above case.

In the component feeder and the component mounting apparatus that employ the magazine cassettes for receiving the many plates 6, it is necessary to perform the work of replacement, replenishment, and so on of the plates 6 received in the magazine cassette. Therefore, it is required to assure satisfactory workability of replacing the plates 6 in the magazine cassette for efficient component mounting and component feeding.

Figure 51:
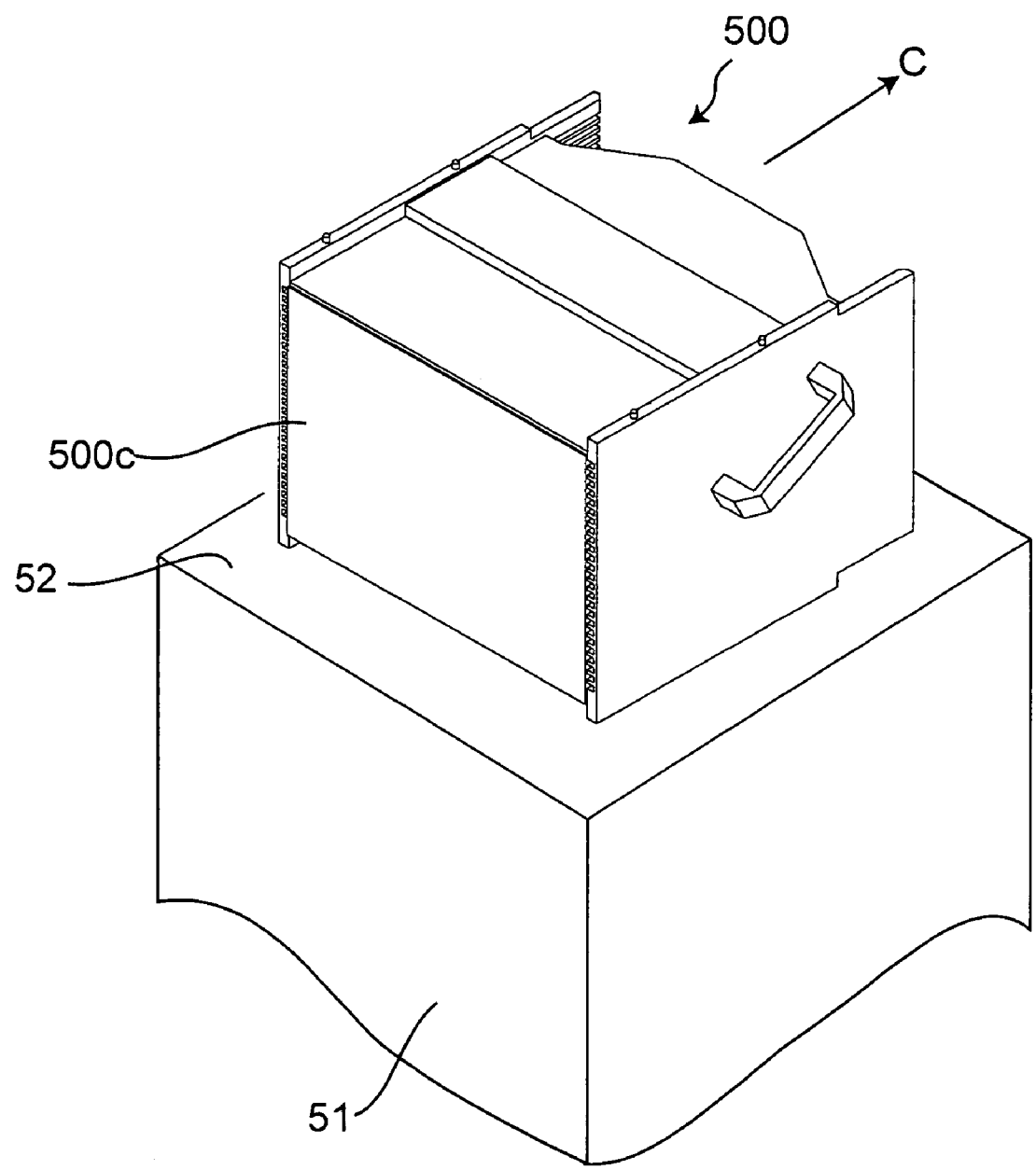
FIG. 51 is a schematic perspective view of a comparative magazine cassette for explaining the construction of a magazine cassette according to a modification example of the third embodiment.

However, in a magazine cassette 500 as shown in the schematic view of FIG. 51, a rear-side wall surface 500c is fixed to the main body of the magazine cassette 500 when viewed in the plate discharge direction C of the magazine cassette 500. For the replacement and so on of the each of plates 6, it is necessary to perform the replacement work and so on of each of the plates 6 from the opening on the plate discharge direction-C-side of the magazine cassette 500 by positioning the magazine cassette 500 in a prescribed position by the cassette elevating unit 51 and removing the magazine cassette 500 from the base 52. Moreover, since the magazine cassette generally has a heavy weight of, for example, about 20 to 30 kg, the work of attaching and detaching the magazine cassette 500 by the operator becomes a factor to hinder an improvement in the working efficiency. Moreover, detaching the magazine cassette 500 is also to stop the operation of the component feeder, and an improvement in the working efficiency is demanded also from the above point of view. The present modification example has an object to further improve the working efficiency by solving the various issues of the random access.

Figure 52:
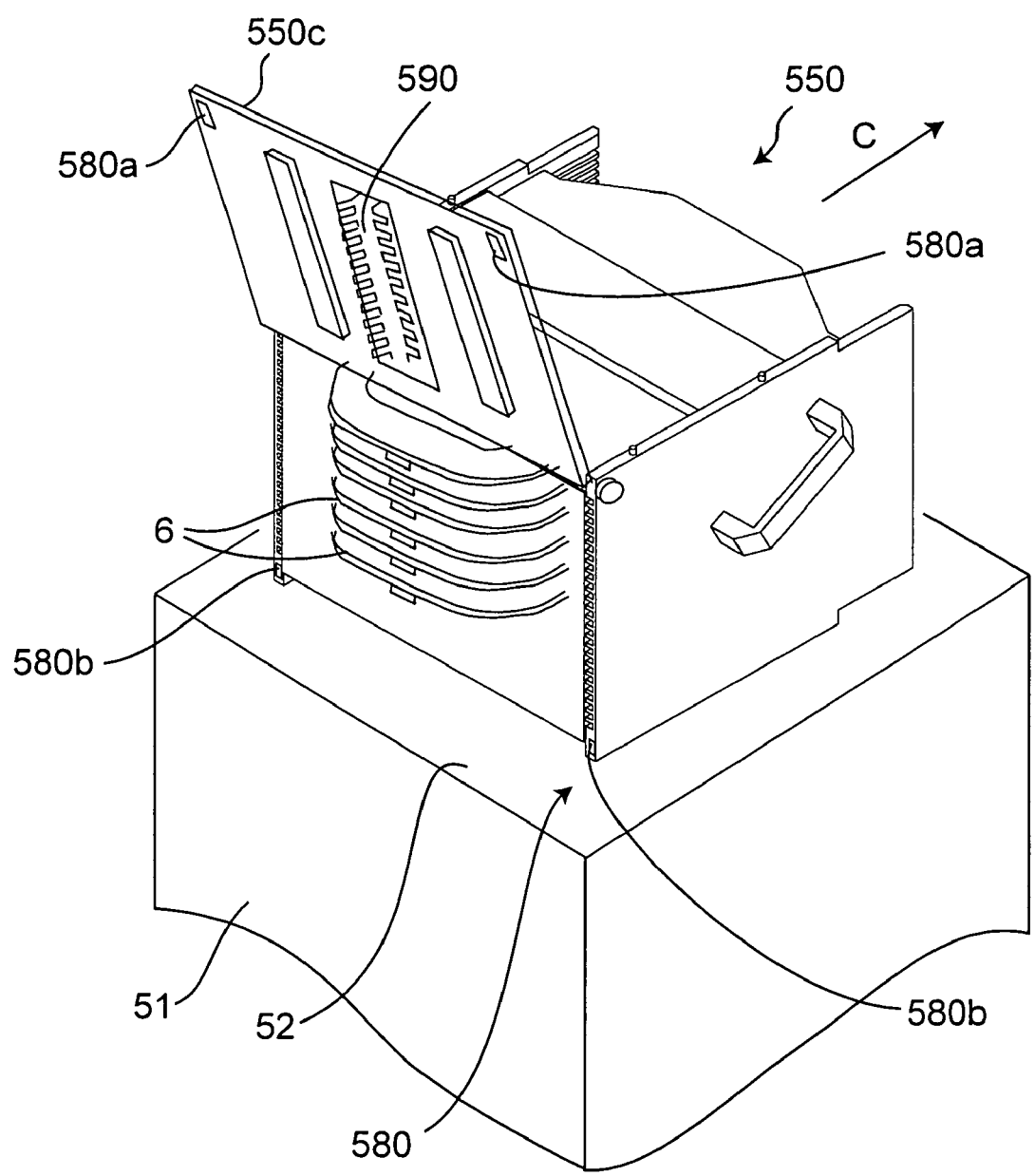
FIG. 52 is a schematic perspective view of the magazine cassette according to a modification example of the third embodiment.
Figure 53:
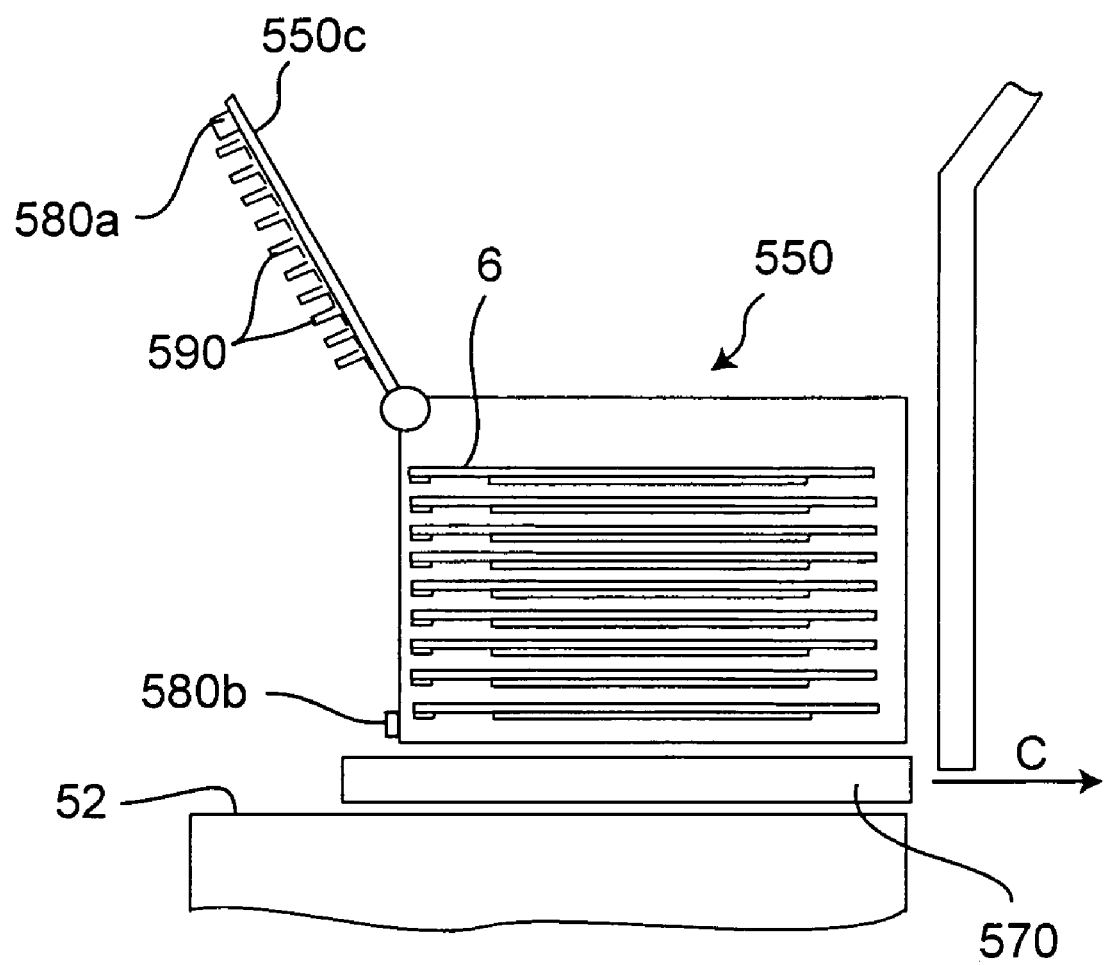
FIG. 53 is a sectional schematic view showing the construction of the magazine cassette of FIG. 52.

First, FIG. 52 shows a schematic perspective view of a magazine cassette 550 according to the present modification example, and FIG. 53 shows a sectional schematic explanatory view of the magazine cassette 550.

As shown in FIGS. 52 and 53, the construction of the magazine cassette 550 differs from that of the magazine cassette 450 of the third embodiment in that the rear-side wall surface serves an open/close cover part 550c of one example of the cover that can be opened and closed with respect to the plate discharge direction C. Moreover, posture guide portions 590 for retaining the support postures of the respective plates 6 in the normal postures are provided inside the open/close cover part 550c like the rear-side wall surface 450c of the magazine cassette 450.

As described above, by virtue of the provision of the open/close cover part 550c, the work of replacing each of the plates 6 can be performed by opening the open/close cover part 550c without detaching the magazine cassette 550 from the base 52. Therefore, the workability in the replacing work can be remarkably improved. Moreover, by virtue of the posture guide portions 590 provided for the open/close cover part 550c, the posture guide block of each of the plates 6 and the posture guide portion 590 of the open/close cover part 550c can be engaged with each other by closing the open/close cover part 550c after receiving each of the plates 6 in the magazine cassette 550, and the posture of each of the plates 6 can be kept normal by the engagement.

Moreover, when the plate 6 is received in the magazine cassette 550 not in the horizontal state but in an inclined posture, the posture guide block and the posture guide portion 590 cannot be engaged with each other, and the open/close cover part 550c cannot completely be closed. Taking advantage of the above feature, it is possible to determine whether or not each of the plates 6 has been received in the normal posture by confirming whether or not the open/close cover part 550c is completely closed when the operator closes the open/close cover part 550c after ending the replacing work of each of the plates 6 in the magazine cassette 550.

It may be a case where the open/close cover part 550c is provided with an open/close detection sensor 580 capable of detecting the open/close state of the open/close cover part 550c instead of the case where the operator visually confirms the open/close state of the open/close cover part 550c. For example, as shown in FIGS. 52 and 53, it is possible to provide the open/close cover part 550c with a portion 580a to be detected of the open/close detection sensor 580 and provide the main body of the magazine cassette 550 with a detecting part 580b for making the to-be-detected portion 580a detectable when the open/close cover part 550c is closed.

It is acceptable to provide an interlock circuit, which can prevent the visual check failure or the like of the operator and perform reliable detection by thus detecting the opening or closing in a controlling manner and does not operate the component feeder until, for example, the closing of the open/close cover part 550c is detected by the open/close detection sensor 580.

Moreover, as shown in FIG. 53, a plate receiving part 570 that allows the plate 6 to be inserted and discharged to and from the magazine cassettes 550 by the plate moving device 40 is provided under the magazine cassette 550 when positioned in a position in which each of the plates 6 received in the magazine cassette 550 can be replaced by the cassette elevating unit 51, or for example, in the origin position. The plate receiving part 570 can receive, for example, only one plate 6, so that the plate 6 received in the plate receiving part 570 is allowed to be discharged by the plate moving device 40 to feed the components 2 and the plate 6 from which the components 2 have been fed is allowed to be received in the plate receiving part 570 even during the replacing work of each of the plates 6 with respect to the magazine cassette 550 positioned in the origin position.

By virtue of the plate receiving part 570 provided for the magazine cassette 550, component feeding can be continuously performed by using the plates 6 received in the plate receiving part 570 even during the replacing work of each of the plates 6 received in the magazine cassette 550, and efficient component feeding can be performed.

Figure 54A:
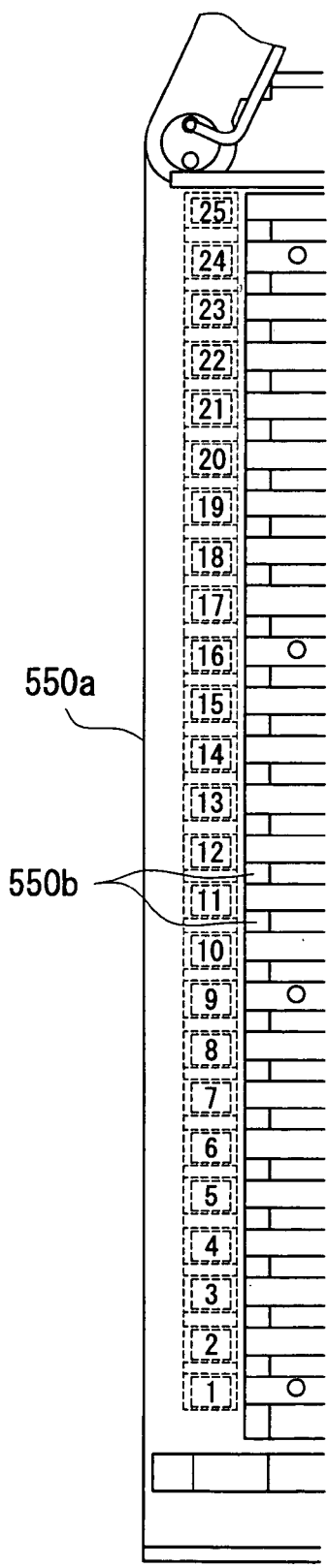
FIGS. 54A and 54B are views showing open end portions of an open/close cover part of the main body of the magazine cassette, where
Figure 54B:
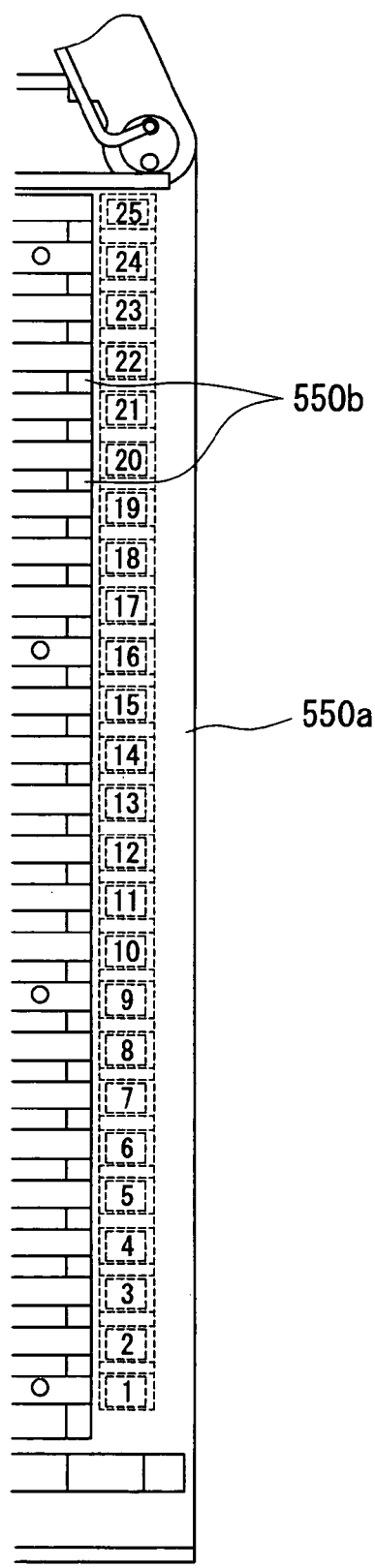

FIGS. 54A and 54B are partially enlarged views (left-hand side and right-hand side) of the side wall portions 550a at the open end portions of the open/close cover part 550c of the main body of the magazine cassette 550. As shown in these figures, it is also possible to display, for example, the step number for each pair of mutually opposed steps of the groove portions 550b provided inside the magazine cassette 550. In the above case, the step numbers on the right-hand and left-hand sides of the groove portions 550b can be prevented from being mistaken when the operator inserts each of the plates 6 into the magazine cassette 550.

Figure 55:
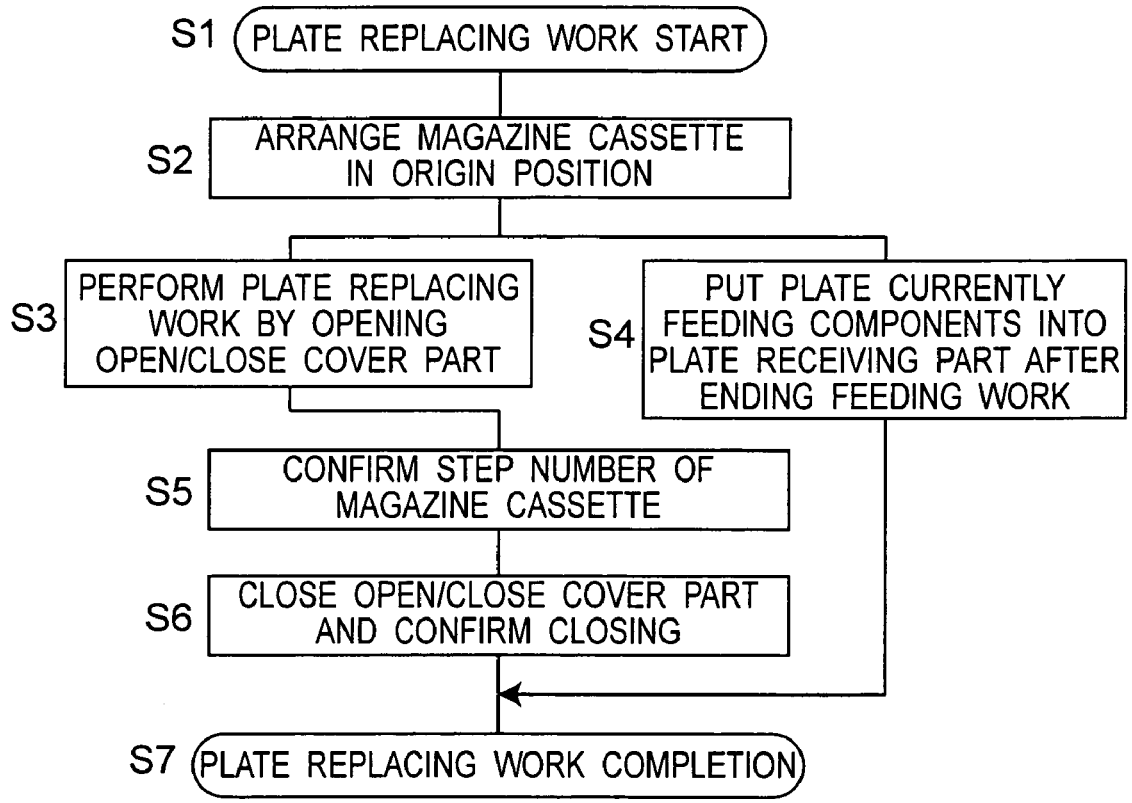
FIG. 55 is a flow chart showing a plate replacing process procedure.

FIG. 55 shows a flow chart of the procedure of the replacing work of each of the plates 6 received in the magazine cassette 550 utilizing the aforementioned constructions as plate replacing processes (or component feeding processes).

As shown in FIG. 55, the plate replacing work is started in step S1. The work can be started as, for example, a replacing work mode by operating a control unit or the like provided for the component mounting apparatus. Next, the magazine cassette 550 is moved up and down by the cassette elevating unit 51 and positioned in the origin position in step S2.

Subsequently, in step S3, the open/close cover part 550c of the magazine cassette 550 is opened to perform the replacing work of each of the plates 6. At this time, when a plate 6 that is undergoing the component feeding exists in the plate placing device 12 and then the component feeding is completed, the plate 6 can be received in the plate receiving part 570 by the plate moving device 40 (step S4).

When the replacing work of each of the plates 6 is completed, the step number of the step in which each plate 6 is received is confirmed to confirm that the plate is received not in the inclined posture in step S5. Subsequently, the open/close cover part 550c is closed, and it can be confirmed that the plate 6 has been received in the normal posture by confirming the closing. It is noted that the closing can also be confirmed by the open/close detection sensor 580 as described above. By this operation, the plate replacing work is completed (step S7).

By performing the plate replacing work according to the above procedure, the plate can be replaced smoothly and efficiently without interrupting the component feeding work of the component feeder, and more efficient component feeding can be performed.

By properly combining the arbitrary embodiments of the aforementioned various embodiments, the effects possessed by the embodiments can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A component feeder system comprising:
 a wafer feeding plate for feeding wafer feed components to be mounted on a board;
 a tray feeding plate for feeding tray feed components to be mounted on the board, the tray feeding plate configured to have a component feeding tray having a plurality of the tray feed components placed thereon and the wafer feeding plate configured to have a wafer having a plurality of the wafer feed components placed thereon, while allowing the wafer feed components and tray feed components to be mounted; and
 a plate placing device configured to selectively place and hold the wafer feeding plate and the tray feeding plate and allowing a wafer feed component and a tray feed component to be fed from the wafer feeding tray and the component feeding tray, respectively, the wafer feed component and the tray feed component being fed during different modes,
 the plate placing device for placing and holding either the wafer feeding plate or the tray feeding plate so that a feeding height of the wafer feed component on the wafer feeding plate and a feeding height of the tray feed component on the tray feeding plate are approximately equal to each other.

2. The component feeder as defined in claim 1, wherein the plate placing device comprises:
 an elastic support member, which is able to support the placed wafer feeding plate or placed tray feeding plate from a lower surface side in a vicinity of an outer peripheral portion of the placed wafer feeding plate or the placed tray feeding plate, said elastic support member having a variable support height position;
 a plate pressurizing member for holding the wafer feeding plate or the tray feeding plate by pressurizing the wafer feeding plate or the tray feeding plate supported by the elastic support member from an upper surface side of the wafer feeding plate or the tray feeding plate in the vicinity of the outer peripheral portion so that the wafer feeding plate or the tray feeding plate is held between the plate pressurizing member and the elastic support member; and
 a pressurizing member elevating unit for moving up and down the plate pressurizing member
 to vary the support height position of the elastic support member so that the feeding height of the wafer feed component on the wafer feeding plate and the feeding height of the tray feed component on the tray feeding plate being supported by the elastic support member are approximately equal to each other.

3. The component feeder as defined in claim 2, wherein the plate placing device further comprises a regulation part for selectively regulating a position in which the plate pressurizing member is lowered by the pressurizing member elevating unit, and
 the position in which the plate pressurizing member is lowered is regulated by the regulation part so that the feeding height of the tray feed component becomes approximately equal to the feeding height of the wafer feed component when the tray feeding plate is placed on the plate placing device.

4. A component feeder system comprising:
 a wafer feeding plate for feeding wafer feed components to be mounted on a board;
 a tray feeding plate for feeding tray feed components to be mounted on the board, the tray feeding plate configured to have a component feeding tray having a plurality of the tray feed components arranged thereon and the wafer feeding plate configured to have a wafer having a plurality of the wafer feed components arranged thereon, while allowing the wafer feed components and tray feed components to be mounted;
 a plate receiving part for receiving a plurality of wafer feeding plates and a plurality of tray feeding plates while allowing the wafer feeding plates or the tray feeding plates to be discharged;
 a plate placing device configured to selectively place and hold a selected plate of the wafer feeding plates and the tray feeding plates and allowing the wafer feed component and the tray feed component to be fed from the wafer feeding tray and the component feeding tray, respectively, the wafer feed component and the tray feed component are fed during different modes; and
 a plate moving device for releasably holding the selected plate, discharging the selected plate from the plate receiving part, and moving the selected plate while allowing the selected plate to be held by the plate placing device, and the plate placing device comprising:

a plurality of elastic support members, which are able to support the selected plate from a lower surface side in a vicinity of an outer peripheral portion of the selected plate and of which support height positions are variable;

a plate pressurizing member for holding the selected plate by pressurizing the selected plate supported by the elastic support members from an upper surface side in the vicinity of the outer peripheral portion so that the selected plate is held between the plate pressurizing member and the elastic support members; and a pressurizing member elevating unit for moving up and down the plate pressurizing member; and a regulation part for selectively regulating a position in which the plate pressurizing member is lowered by the pressurizing member elevating unit, wherein the support height of the tray feeding plate by the elastic support members can be held by regulating the position where the plate pressurizing member is lowered by the regulation part when the tray feeding plate is placed on the plate placing device, and when the wafer feeding plate is placed on the plate placing device, the wafer placed on the wafer feeding plate can be expanded by releasing regulation of the lowered position by the regulation part and lowering the plate pressurizing member by the pressurizing member elevating unit while supporting the wafer feeding plate by the elastic support members.

5. The component feeder as defined in claim 4, wherein the wafer feeding plate comprises:

a wafer sheet to which a wafer that has undergone dicing adheres; and a wafer ring, which is an annular plate and holds the wafer sheet so that the wafer that has undergone dicing is positioned inside thereof, the plate placing device further comprises an expanding member that has an annular contact portion capable of coming in contact with a lower surface of the wafer sheet between an outer periphery of the wafer that has undergone dicing and an inner periphery of the wafer ring at the wafer feeding plate in a state in which the wafer ring is supported by the elastic support members, and the wafer that has undergone dicing can be expanded by radially expanding the wafer sheet by lowering the plate pressurizing member by the pressurizing member elevating unit using the annular contact portion of the expanding member as a fulcrum and thus depressing the wafer ring.

6. The component feeder as defined in claim 4, wherein the plate moving device comprises:

a holding part for releasably holding the selected plate;

a holding part moving unit for moving the holding part so as to move the selected plate held by the holding part from the plate receiving part to the plate placing device; and a plate identifying part for identifying whether the held selected plate is the wafer feeding plate or the tray feeding plate based on a configuration of the holding part of the held selected plate, and the regulation part of the plate placing device regulates the position where the plate pressurizing member is lowered based on an identification result of the plate identifying part.

7. The component feeder as defined in claim 5, wherein the tray feeding plate comprises:

a tray placing part, on which a plurality of the component feeding trays are detachably placed; and a tray ring, which is an annular plate formed at a periphery of the tray placing part, and the plate placing device is able to support the tray ring by the elastic support members and hold the tray feeding plate by holding and pressurizing the tray ring between the plate pressurizing member and the elastic support members, and the regulation part regulates the position where the plate pressurizing member is lowered by the pressurizing member elevating unit so that a lower surface of the tray feeding plate does not come in contact with the expanding member.

8. The component feeder as defined in claim 7, wherein the tray placing part comprises:

a fixed side holding member, which is able to come in contact with one end portion of a roughly quadrangle configuration of the component feeding tray that has the roughly quadrangle shape in plan; and movable side holding members, which are able to come in contact with an end portion opposite to the one end portion of the component feeding tray in a state in which the one end portion is brought in contact with the fixed side holding member and allows the opposite end portion to be movably urged toward the fixed side holding member, and a placement position of the component feeding tray in the tray placing part is held so as to hold the component feeding tray by the fixed side holding member and the movable side holding members.

9. The component feeder as defined in claim 4, wherein at least one elastic support member of the plurality of elastic support members has a slant end portion, which has its end portion come in contact with the end portion of the supported plate, thereby regulating a support position in a direction along a surface of the selected plate.

10. The component feeder as defined in claim 4, wherein the regulation part comprises:

a contact portion, which is able to come in contact with a lower portion of the plate pressurizing member and regulate the position where the plate pressurizing member is lowered by the contact; and a contact portion moving mechanism for moving the contact portion between a contact position where the contact portion is come in contact with the plate pressurizing member and a retreat position where the contact portion is retreated.

11. The component feeder as defined in claim 4, wherein the pressurizing member elevating unit of the plate placing device comprises:

a cylinder portion for moving up or down the plate pressurizing member by supplying or discharging compressed air;

an elevation compressed air supplying part, which is able to supply elevation compressed air for performing the upward or downward movement as the compressed air to the cylinder portion;

a retention compressed air supplying part, which has a pressure lower than that of the elevation compressed air and is able to supply retention compressed air for retaining a stop position of the plate pressurizing member when the plate pressurizing member stops moving up or down as the compressed air to the cylinder portion; and a compressed air selection valve for selectively supplying the elevation compressed air or the retention compressed air to the cylinder portion.

12. The component feeder as defined in claim 11, wherein the compressed air selection valve is a mechanical lock valve, which is able to detect an upper end position of elevation of the plate pressurizing member by mechanically coming in contact with the plate pressurizing member, for selectively supplying the retention compressed air to the cylinder portion in place of the elevation compressed air when the upper end position is detected.

13. The component feeder as defined in claim 6, wherein the plate receiving part comprises:
a receiver for receiving the wafer feeding plates or the tray feeding plates in a stack; and
a receiver elevating unit for positioning one plate of the wafer feeding plates or the tray feeding plates received in the receiver into an elevation height position in which the one plate can be held by the holding portion of the plate moving device by moving up and down the receiver, and
an openable jump preventing plate, which has a plate outlet portion that allows the one held plate together with the holding part to pass therethrough, and a plate regulation part, which is formed at a periphery of the outlet portion and is able to prevent plates that are other than the one plate and are received in the receiver of the plate receiving part from jumping out of the receiver.

14. The component feeder as defined in claim 13, wherein the plate placing device further comprises a jump detecting unit, which is able to detect the plate located in the outlet portion of the jump preventing plate.

15. The component feeder as defined in claim 13, wherein the plate receiving part comprises:
a base for supporting the receiver and the receiver elevating unit; and
a base retention part, which has a linear motion guide portion that can retain a position where the base is placed, for guiding a linear motion of the base by releasing the retention, and a pivot guide portion for guiding a rotational motion of the base, and
the base comprises an engagement portion, which can be selectively engaged with the linear motion guide portion and the pivot guide portion,
the base can be linearly moved by engaging the engagement portion with the linear motion guide portion, and
the base can be moved while rotating by releasing the engagement between the engagement portion and the linear motion guide portion and engaging the engagement portion with the pivot guide portion.

16. The component feeder as defined in claim 13,
the receiver of the plate receiving part comprises a plurality of sets of support guide portions for individually supporting mutually opposed each end portions of each of the wafer feeding plates or the tray feeding plates, which are arranged mutually opposed to guide a movement in a direction along a surface of the plate in discharging each of the wafer feeding plates or the tray feeding plates, and
wherein a contact portion to each support guide portion of each of the wafer feeding plates or the tray feeding plates has a smooth surface portion.

17. The component feeder as defined in claim 16, wherein a slant portion with respect to a movement direction is formed at an insertion end portion of the support guide portions of the each set while enabling correction of positional deviation between an insertion position of each of the plates to the support guide portions of the each set in a direction roughly perpendicular to the movement direction of each of the wafer feeding plates or the tray feeding plates and a support position of the support guide portions of the each set.

18. The component feeder as defined in claim 16, wherein contact surfaces between each of the wafer feeding plates or the tray feeding plates and the support guide portions are formed so that a hardness of the contact surface of the support guide portion is smaller than that of the selected plate.

19. The component feeder as defined in claim 16, wherein contact surfaces between each of the wafer feeding plates or the tray feeding plates and the support guide portions are formed so that a hardness of the contact surface of the selected plate is smaller than that of the support guide portion.

20. The component feeder as defined in claim 16, wherein the support guide portions comprise roller portions rotatable along a surface of the end portion while supporting the end portion of each of the wafer feeding plates or the tray feeding plates.

21. The component feeder as defined in claim 4, wherein the plate pressurizing member has a lower surface further comprising:
a plurality of support members for supporting the plate fed to the plate placing device while allowing the plate to be discharged; and
a plurality of urging members for consistently urging the selected plate against the support members or the elastic support members regardless of the position where the plate pressurizing member is lowered by the pressurizing member elevating unit.

22. The component feeder as defined in claim 21, wherein each of the urging members comprise an urging roller portion rotatable along a surface of the selected plate while urging the selected plate supported by the support members to allow the selected plate to be moved by the plate moving device.

23. The component feeder as defined in claim 6, wherein each of the wafer feeding plates or the tray feeding plates has an engagement portion capable of being engaged with the holding part in a holding position on the upper surface side of the selected plate by the holding part.

24. The component feeder as defined in claim 16, wherein the receiver further comprises a plurality of posture guide portions for guiding a support posture in a horizontal direction of each of the plates by being arranged between the sets of the support guide portions and being engaged with each of the wafer feeding plates or the tray feeding plates.

25. The component feeder as defined in claim 24, wherein the receiver has an openable and closable cover portion for replacing each of the wafer feeding plates or the tray feeding plates, and the posture guide portions are provided inside the cover portion.

26. The component feeder as defined in claim 25, wherein the receiver comprises an open/close detection sensor for detecting opening or closing of the cover portion.

27. The component feeder as defined in claim 15, wherein the receiver comprises a plurality of fixing parts for fixing the support to a support surface of the base, and at least one of the fixing parts is formed of a conductive material having a function as a ground terminal portion.

* * * * *